(12) United States Patent
Finn et al.

(10) Patent No.: US 10,824,931 B2
(45) Date of Patent: Nov. 3, 2020

(54) CONTACTLESS SMARTCARDS WITH MULTIPLE COUPLING FRAMES

(71) Applicants: David Finn, Tourmakeady (IE); Mustafa Lotya, Celbridge (IE); Darren Molloy, Galway (IE)

(72) Inventors: David Finn, Tourmakeady (IE); Mustafa Lotya, Celbridge (IE); Darren Molloy, Galway (IE)

(73) Assignee: Féinics AmaTech Teoranta, Lower Churchfield Tourmakeady (IE)

( * ) Notice: Subject to any disclaimer, the term of this patent is extended or adjusted under 35 U.S.C. 154(b) by 85 days.

(21) Appl. No.: 16/246,495

(22) Filed: Jan. 13, 2019

(65) Prior Publication Data

US 2019/0197386 A1    Jun. 27, 2019

Related U.S. Application Data

(63) Continuation-in-part of application No. 15/969,816, filed on May 3, 2018, now Pat. No. 10,518,518, and
(Continued)

(51) Int. Cl.
G06K 19/06         (2006.01)
G06K 19/077        (2006.01)
(Continued)

(52) U.S. Cl.
CPC . G06K 19/07794 (2013.01); G06K 19/07769 (2013.01); G06K 19/07783 (2013.01);
(Continued)

(58) Field of Classification Search
CPC ....... G06K 19/07794; G06K 19/07769; G06K 19/07783; H01Q 1/2216; H01Q 1/2225;
(Continued)

(56) References Cited

U.S. PATENT DOCUMENTS 5,084,699 A    1/1992  DeMichele
D341,092 S     11/1993 Wild
(Continued)

FOREIGN PATENT DOCUMENTS

DE    19632115    12/1997
EP    0782214     7/1997
(Continued)

OTHER PUBLICATIONS

Use of Slits of Defined Width in Metal Layers Within ID-1 Cards, as Reactive Couplers for Nearfield Passive RFID at 13.56 MHz; Ackland, Lotya, Finn, and Stamenov; 2016 IEEE International Conference on RFID (RFID); 978-1-4673-8807-8/16/$31.00 © 2016 IEEE; 4 pages.

(Continued)

Primary Examiner — Karl D Frech
(74) Attorney, Agent, or Firm — Gerald E Linden

(57) ABSTRACT

A smartcard (SC) having at least a contactless interface, such as having a dual interface transponder chip module (TCM) with a chip (IC), a module antenna (MA) for the contactless interface, and contact pads (CP) for a contact interface. Metal layers (ML) may have openings (MO) for receiving the module, and slits (S) or nonconductive stripes (NCS) extending to the openings, thereby forming coupling frames (CF). A card body (CB) for the smartcard may comprise two such metal layers (front and rear coupling frames) separated by a layer of non-conductive (dielectric) material. A front face card layer and a rear face card layer may complete a multiple coupling frame stack-up for a smartcard.

16 Claims, 21 Drawing Sheets

Related U.S. Application Data a continuation-in-part of application No. 15/939,282, filed on Mar. 29, 2018, now Pat. No. 10,552,722, said application No. 15/969,816 is a continuation-in-part of application No. 15/939,281, filed on Mar. 29, 2018, said application No. 15/939,282 is a continuation-in-part of application No. 15/358,138, filed on Nov. 22, 2016, now Pat. No. 9,960,476, said application No. 15/939,281 is a continuation-in-part of application No. 15/358,138, which is a continuation-in-part of application No. 15/197,795, filed on Jun. 30, 2016, now Pat. No. 9,812,782, and a continuation-in-part of application No. 15/072,356, filed on Mar. 17, 2016, now Pat. No. 9,836,684, said application No. 15/197,795 is a continuation-in-part of application No. 14/551,376, filed on Nov. 24, 2014, now Pat. No. 9,390,364, said application No. 15/072,356 is a continuation-in-part of application No. 14/492,113, filed on Sep. 22, 2014, now Pat. No. 9,798,968, and a continuation-in-part of application No. 14/465,815, filed on Aug. 21, 2014, now Pat. No. 9,475,086, said application No. 14/492,113 is a continuation-in-part of application No. 14/465,815, which is a continuation-in-part of application No. 14/173,815, filed on Feb. 6, 2014, now Pat. No. 9,195,932, which is a continuation of application No. 14/020,884, filed on Sep. 8, 2013, now Pat. No. 9,033,250, said application No. 14/492,113 is a continuation-in-part of application No. 13/744,686, filed on Jan. 18, 2013, now abandoned, said application No. 14/465,815 is a continuation-in-part of application No. 13/744,686, filed on Jan. 18, 2013, now abandoned, said application No. 14/020,884 is a continuation-in-part of application No. 13/600,140, filed on Aug. 30, 2012, now Pat. No. 8,991,712.

(60) Provisional application No. 62/035,430, filed on Aug. 10, 2014.

(51) Int. Cl.

| | | |
|---|---|---|
| *H01Q 1/22* | (2006.01) | |
| *H01Q 21/29* | (2006.01) | |
| *H01Q 7/00* | (2006.01) | |
| *H05K 1/16* | (2006.01) | |
| *H04B 5/00* | (2006.01) | |
| *H05K 3/10* | (2006.01) | |
| *H01F 38/14* | (2006.01) | |

(52) U.S. Cl.
CPC ......... *H01Q 1/2216* (2013.01); *H01Q 1/2225* (2013.01); *H01Q 1/2283* (2013.01); *H01Q 7/00* (2013.01); *H01Q 21/29* (2013.01); *H04B 5/00* (2013.01); *H05K 1/165* (2013.01); *H01F 38/14* (2013.01); *H05K 3/103* (2013.01); *H05K 2201/10098* (2013.01); *Y10T 29/49018* (2015.01); *Y10T 29/49162* (2015.01)

(58) Field of Classification Search
CPC ........ H01Q 1/2283; H01Q 7/00; H01Q 21/29; H04B 5/00; H05K 1/165
USPC ................................. 235/492, 487
See application file for complete search history.

(56) References Cited

U.S. PATENT DOCUMENTS

| | | |
|---|---|---|
| 5,281,855 A | 1/1994 | Hadden et al. |
| 5,483,263 A * | 1/1996 | Bird .................. G02F 1/13338 345/207 |
| 5,581,065 A | 12/1996 | Nishikawa et al. |
| D378,064 S | 2/1997 | Wild |
| D404,319 S | 1/1999 | Deleskiewicz |
| 5,955,723 A | 9/1999 | Reiner |
| 5,982,624 A | 11/1999 | Onada et al. |
| 6,018,299 A | 1/2000 | Eberhardt |
| D423,374 S | 4/2000 | Deleskiewicz |
| 6,107,920 A | 8/2000 | Eberhardt et al. |
| 6,147,605 A | 11/2000 | Vega et al. |
| 6,233,818 B1 | 5/2001 | Finn et al. |
| 6,265,977 B1 | 7/2001 | Vega et al. |
| 6,378,774 B1 | 4/2002 | Emori |
| 6,452,563 B1 | 9/2002 | Porte |
| 6,581,839 B1 | 6/2003 | Lasch et al. |
| 6,593,224 B1 * | 7/2003 | Lin .................. H05K 3/205 438/618 |
| 6,611,199 B1 | 8/2003 | Geiszler et al. |
| 6,634,564 B2 | 10/2003 | Kuramochi |
| 6,698,089 B2 | 3/2004 | Finn et al. |
| 6,749,123 B2 | 6/2004 | Lasch et al. |
| 6,764,014 B2 | 7/2004 | Lasch et al. |
| 6,986,465 B2 | 1/2006 | Kiekhaefer |
| 7,183,987 B2 | 2/2007 | Akiho et al. |
| 7,306,158 B2 | 12/2007 | Berardi et al. |
| 7,377,443 B2 | 5/2008 | Lasch et al. |
| 7,440,771 B2 | 10/2008 | Purk |
| 7,494,057 B2 | 2/2009 | Lasch et al. |
| 7,530,491 B2 | 5/2009 | Lasch et al. |
| 7,544,266 B2 | 6/2009 | Herring et al. |
| 7,588,184 B2 | 9/2009 | Gandel et al. |
| 7,607,583 B2 | 10/2009 | Berardi et al. |
| 7,701,350 B2 | 4/2010 | Sakama et al. |
| 7,721,956 B2 | 5/2010 | Williams et al. |
| 7,757,957 B2 | 7/2010 | Cranston et al. |
| 7,819,310 B2 | 10/2010 | Lasch et al. |
| 7,823,777 B2 | 11/2010 | Varga et al. |
| 7,837,116 B2 | 11/2010 | Morril Webb et al. |
| 7,934,646 B2 | 5/2011 | Yang |
| 8,033,457 B2 | 10/2011 | Varga et al. |
| 8,066,190 B2 | 11/2011 | Faenza, Jr. |
| 8,079,514 B2 | 12/2011 | Lasch et al. |
| 8,100,337 B2 | 1/2012 | Artigue et al. |
| 8,130,166 B2 | 3/2012 | Ayala et al. |
| 8,141,787 B2 | 3/2012 | Savry |
| 8,186,582 B2 | 5/2012 | Varga et al. |
| 8,186,598 B2 | 5/2012 | Faenza, Jr. |
| 8,191,788 B2 | 6/2012 | Morrill-Webb et al. |
| 8,261,997 B2 | 9/2012 | Gebhart |
| 8,360,312 B2 | 1/2013 | Varga et al. |
| 8,366,009 B2 | 2/2013 | Finn et al. |
| 8,378,911 B2 | 2/2013 | Eray et al. |
| 8,393,547 B2 | 3/2013 | Keikhafer et al. |
| 8,474,726 B2 | 7/2013 | Finn |
| 8,523,062 B2 | 9/2013 | Varga et al. |
| D693,264 S | 11/2013 | Rabassa |
| 8,608,080 B2 | 12/2013 | Finn |
| 8,608,082 B2 | 12/2013 | Le Garrec et al. |
| 8,672,232 B2 | 3/2014 | Herslow |
| 8,789,762 B2 | 7/2014 | Finn et al. |
| 8,891,712 B2 | 11/2014 | Sugiyama et al. |
| 8,991,712 B2 | 3/2015 | Finn et al. |
| D729,074 S | 5/2015 | Boulangeot |
| 8,976,075 B2 | 5/2015 | Kato et al. |
| 9,033,250 B2 | 5/2015 | Finn et al. |
| 9,112,272 B2 | 8/2015 | Finn et al. |
| 9,165,240 B2 | 10/2015 | Finn et al. |
| 9,195,932 B2 | 11/2015 | Finn et al. |
| 9,203,157 B2 | 12/2015 | Kato et al. |
| 9,272,370 B2 | 3/2016 | Finn et al. |
| 9,390,364 B2 | 7/2016 | Finn et al. |
| 9,449,269 B2 | 9/2016 | Finn et al. |
| 9,475,086 B2 | 10/2016 | Finn et al. |
| 9,489,613 B2 | 11/2016 | Finn et al. |
| 9,564,678 B2 | 2/2017 | Kato et al. |
| 9,633,304 B2 | 4/2017 | Finn et al. |
| 9,697,459 B2 | 7/2017 | Finn et al. |
| 9,721,200 B2 | 8/2017 | Herslow et al. |
| 9,798,968 B2 | 10/2017 | Finn et al. |
| 9,812,782 B2 | 11/2017 | Finn et al. |

(56) References Cited

U.S. PATENT DOCUMENTS

| | | |
|---|---|---|
| 9,836,684 B2 | 12/2017 | Finn et al. |
| 9,960,476 B2 | 5/2018 | Finn et al. |
| 2002/0079826 A1* | 6/2002 | Park .................... H01J 9/02 313/483 |
| 2003/0057288 A1 | 3/2003 | Salzgeber |
| 2006/0192674 A1 | 8/2006 | Roberta |
| 2006/0243811 A1 | 11/2006 | Koyama et al. |
| 2007/0164414 A1 | 7/2007 | Dokai et al. |
| 2009/0152362 A1 | 6/2009 | Ayala et al. |
| 2009/0159657 A1 | 6/2009 | Chen et al. |
| 2009/0169776 A1 | 7/2009 | Herslow |
| 2009/0315320 A1 | 12/2009 | Finn |
| 2010/0078329 A1 | 4/2010 | Mirsky et al. |
| 2011/0023289 A1 | 2/2011 | Finn |
| 2011/0090058 A1 | 4/2011 | Ikemoto |
| 2011/0163167 A1 | 7/2011 | Artigue et al. |
| 2011/0181486 A1 | 7/2011 | Kato |
| 2011/0186641 A1 | 8/2011 | Kato et al. |
| 2011/0189620 A1 | 8/2011 | Herslow |
| 2012/0018522 A1 | 1/2012 | Le Garrec et al. |
| 2013/0126622 A1 | 5/2013 | Finn |
| 2013/0146670 A1 | 6/2013 | Grieshofer et al. |
| 2013/0146671 A1 | 6/2013 | Grieshofer et al. |
| 2013/0168454 A1 | 7/2013 | Oh et al. |
| 2013/0248024 A1* | 9/2013 | Dunn .................... G01L 9/0072 137/551 |
| 2013/0271265 A1 | 10/2013 | Finn |
| 2013/0320095 A1 | 12/2013 | Blum |
| 2013/0332353 A1 | 12/2013 | Aidasani et al. |
| 2014/0014732 A1 | 1/2014 | Finn et al. |
| 2014/0021261 A1 | 1/2014 | Mosteller |
| 2014/0070009 A1 | 3/2014 | Zambrano L. |
| 2014/0091149 A1 | 4/2014 | Finn et al. |
| 2014/0102136 A1 | 4/2014 | Warren |
| 2014/0104133 A1 | 4/2014 | Finn et al. |
| 2014/0138443 A1 | 5/2014 | Blum |
| 2014/0144993 A1 | 5/2014 | Seo et al. |
| 2014/0152511 A1 | 6/2014 | Merlin et al. |
| 2014/0166762 A1 | 6/2014 | Herslow |
| 2014/0260424 A1 | 9/2014 | Warren |
| 2014/0263655 A1 | 9/2014 | Forster |
| 2014/0284386 A1 | 9/2014 | Finn et al. |
| 2014/0292477 A1 | 10/2014 | Ahmadloo |
| 2014/0361086 A1 | 12/2014 | Finn et al. |
| 2015/0021402 A1 | 1/2015 | Finn et al. |
| 2015/0021403 A1 | 1/2015 | Finn et al. |
| 2015/0129665 A1 | 5/2015 | Finn et al. |
| 2015/0136858 A1 | 5/2015 | Finn et al. |
| 2015/0235122 A1 | 8/2015 | Finn et al. |
| 2015/0269474 A1 | 9/2015 | Finn et al. |
| 2018/0123221 A1 | 5/2018 | Finn et al. |
| 2018/0339503 A1 | 11/2018 | Finn et al. |
| 2018/0341846 A1 | 11/2018 | Finn et al. |
| 2018/0341847 A1 | 11/2018 | Finn et al. |

FOREIGN PATENT DOCUMENTS

| | | |
|---|---|---|
| EP | 1031939 | 8/2000 |
| EP | 1158601 | 11/2001 |
| EP | 02063489 | 5/2009 |
| EP | 2063489 | 5/2009 |
| EP | 1854222 | 6/2012 |
| EP | 2525304 | 11/2012 |
| EP | 2541471 | 2/2013 |
| EP | 2372840 | 9/2013 |
| JP | 11025244 | 1/1999 |
| JP | 11238103 | 8/1999 |
| JP | 2002344225 | 11/2002 |
| JP | 2005204038 | 7/2005 |
| WO | WO 2008081224 | 7/2008 |
| WO | WO 2013034426 | 3/2013 |
| WO | WO 2013/110625 | 8/2013 |
| WO | WO 2013110625 | 8/2013 |
| WO | WO 2014/016332 | 1/2014 |
| WO | WO 2014016332 | 1/2014 |
| WO | WO 2017198842 | 11/2017 |

OTHER PUBLICATIONS

PCT Search Report and Written Opinion, dated Dec. 4, 2014, in related PCT/EP2014/070096.

* cited by examiner

Dual Interface (DI) Smart Card, and Readers

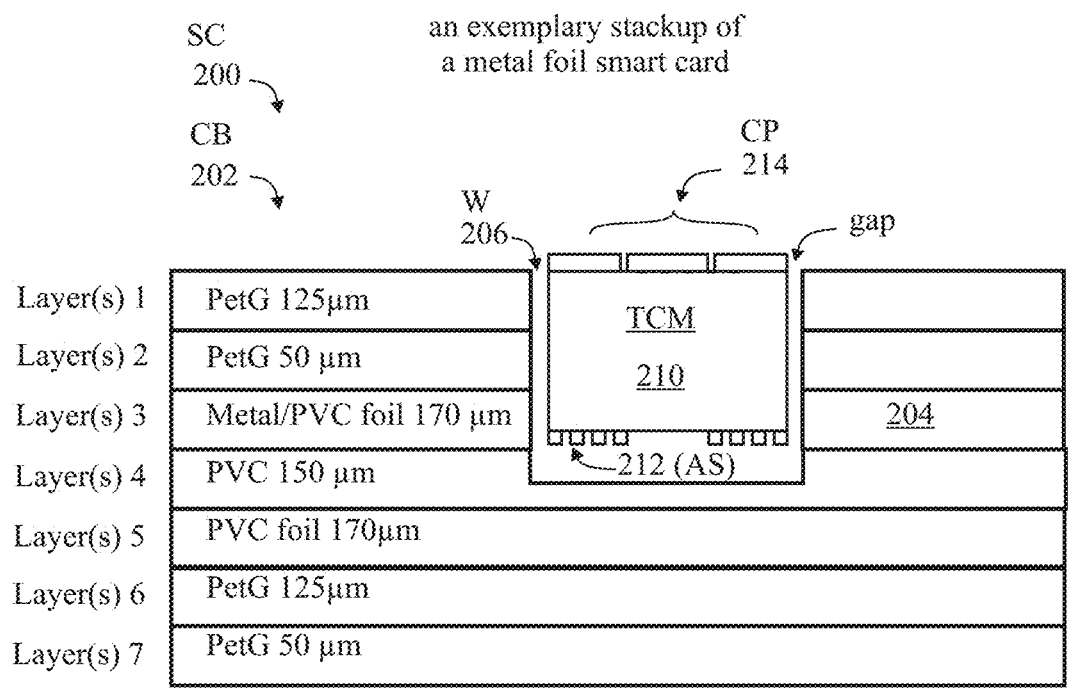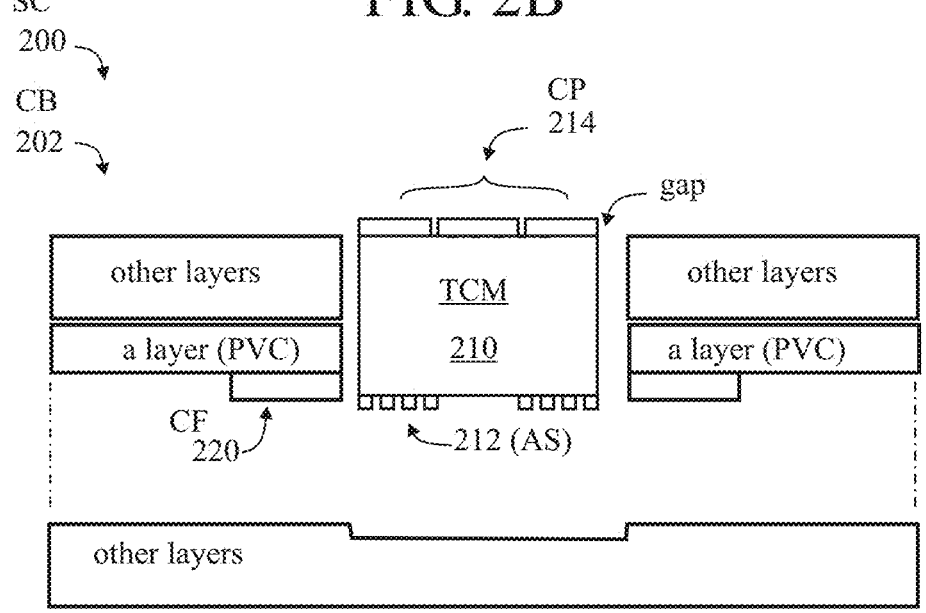

Metal Card Body (MCB) slotted to act as a coupling frame (CF)

TCM with secondary coupling frame (SCF)
and laser-etched antenna structure (LES)

capacitive coupling enhanced (CCE) transponder chip module (TCM) having a coupling frame (CF) formed on the module tape )MT, CCT)

ously, with laser etching, the spacing between tracks can be made smaller (such as 25 μm) than with chemical etching (such as 100 μm).
CONTACTLESS SMARTCARDS WITH MULTIPLE COUPLING FRAMES

CROSS-REFERENCE(S) TO RELATED APPLICATIONS

This application claims filing date benefit (priority), as a nonprovisional or continuation-in-part from the following US provisional and nonprovisional patent applications, all of which are incorporated by reference herein:

This is a continuation-in-part of Ser. No. 15/969,816 filed 3 May 2018
  Ser. No. 15/969,816 is a continuation-in-part of Ser. No. 15/939,281 filed 29 Mar. 2018
  Ser. No. 15/939,281 is continuation-in-part of Ser. No. 15/358,138 filed 22 Nov. 2016
  Ser. No. 15/358,138 is a continuation-in-part of Ser. No. 15/072,356 filed 17 Mar. 2016
    Ser. No. 15/072,356 is a continuation-in-part of Ser. No. 14/492,113 filed 22 Sep. 2014
      Ser. No. 14/492,113 is a continuation-in-part of Ser. No. 14/465,815 filed 21 Aug. 2014
      Ser. No. 14/492,113 is a continuation-in-part of Ser. No. 13/744,686 filed 18 Jan. 2013
    Ser. No. 15/072,356 is a continuation-in-part of Ser. No. 14/465,815 filed 21 Aug. 2014
      Ser. No. 14/465,815 is a nonprovisional of 62/035,430 filed 10 Aug. 2014
      Ser. No. 14/465,815 is a continuation-in-part of Ser. No. 14/173,815 filed 6 Feb. 2014
        Ser. No. 14/173,815 a continuation of Ser. No. 14/020,884 filed 8 Sep. 2013
          Ser. No. 14/020,884 is a continuation-in-part of Ser. No. 13/600,140 filed 30 Aug. 2012
      Ser. No. 14/465,815 is a continuation-in-part of Ser. No. 13/744,686 filed 18 Jan. 2013
This is a continuation-in-part of Ser. No. 15/939,282 filed 29 Mar. 2018
  Ser. No. 15/939,282 is a continuation-in-part of Ser. No. 15/358,138 filed 22 Nov. 2016
    Ser. No. 15/358,138 is a continuation-in part of Ser. No. 15/197,795 filed 30 Jun. 2016
      Ser. No. 15/197,795 is a continuation-in part of Ser. No. 14/551,376 filed 24 Nov. 2014

The specification of this application may be similar to one or more of the aforementioned:
  Ser. No. 14/492,113 filed 22 Sep. 2014 (U.S. Pat. No. 9,798,968, 24 Oct. 2017)
  Ser. No. 14/465,815 filed 21 Aug. 2014 (U.S. Pat. No. 9,475,086, 25 Oct. 2016)

TECHNICAL FIELD

This disclosure relates to smartcards (or payment cards, secure documents, access control cards, electronic tickets, small form factor tags, data carriers, mobile payment devices and the like), operating at least in a contactless mode (ISO 14443 and NFC/ISO 15693). The smartcard (or smart card) may comprise a card body (CB) made of plastic or metal or a combination thereof, and a transponder chip module (TCM) comprising a dual interface RFID chip and an antenna.

BACKGROUND

A dual interface (DI or DIF) smartcard (or smart card; SC) may generally comprise:
  an antenna module (AM), or transponder chip module (TCM), or RFID module,
  a card body (CB) having layers of plastic or metal, or combinations thereof, and
  a booster antenna (BA).

The antenna module "AM" may generally comprise a "DI" RFID chip (bare, unpackaged silicon die) or chip module (a die with leadframe, interposer, carrier or the like)—either of which may be referred to as "CM"—mounted to a module tape "MT". The RFID chip (CM) may be mounted on a module tape (MT), typically having 6 or 8 contact pads (CP) for interfacing with a contact reader in a contact mode (ISO 7816).

A module antenna "MA" may be disposed on the module tape MT for implementing a contactless interface, such as ISO 14443 and NFC/ISO 15693. Contact pads "CP" may be disposed on the module tape MT for implementing a contact interface, such as ISO 7816. The contact pads (CP) may or may not be perforated. The module tape MT may comprise a pattern of interconnects (conductive traces and pads) to which the RFID chip CM and contact pads CP may be connected.

The module antenna MA may be connected, indirectly, via some of the interconnects to the chip CM, or may be directly connected to bond pads BP on the RFID chip CM. The module antenna MA may comprise several turns of wire, such as 112 micron diameter insulated wire. Reference may be made to U.S. Pat. No. 6,378,774 (2002, Toppan), for example FIGS. 12A, B thereof. Alternatively, the module antenna (MA) may comprise a chemically-etched, planar module antenna MA with planar tracks surrounding the chip (CM). Reference may be made to U.S. Pat. No. 8,100,337 (2012, SPS), for example FIG. 3 thereof.

The antenna module "AM" may comprise a module antenna (MA) which has been formed from a wire wound coil which is arranged on or mounted to the module tape (MT), or may comprise a planar antenna structure (AS) which is etched (chemically etched or laser etched, from a foil on the module tape MT) to have a number of tracks separated by spaces. Generally, with laser etching, the spacing between tracks can be made smaller (such as 25 μm) than with chemical etching (such as 100 μm).

A module antenna (MA) connected to an RFID chip (CM) may be referred to as a "transponder". Generally, such a transponder is a "passive" transponder which does not have its own power source (e.g., battery), but rather which harvests power from an external reader (interrogator).

The activation distance of an antenna module (AM) having a chemically-etched module antenna (MA), without a booster antenna (BA) in the card body (CB), may be only a few millimeters. The activation distance of an antenna module (AM) having a laser-etched antenna structure (LES), without a booster antenna (BA) in the card body (CB) may be 15-20 mm. The activation distance of antenna module (AM) with a booster antenna (BA) in the card body (CB) is typically four centimeters to meet ISO and EMV standards.

Activation and read/write distances of at least a few centimeters (cm) are desirable. However, conventional antenna modules (AM) may require a booster antenna (BA) in a card body (CB) to achieve these distances. As disclosed herein, antenna modules (AM) incorporating a laser-etched antenna structure (LES) may be able to operate without a booster antenna (BA) in the card body (CB), and may be referred to as transponder chip modules (TCM). The transponder chip module (TCM) may be referred to as a transponder IC module.

The antenna module AM (or transponder chip module TCM) may be generally rectangular, having four sides, and measuring approximately 8 mm×11 mm for a 6 contact module and 11 mm×13 mm for an 8 contact module. Alternatively, the transponder chip module (TCM) may be round, elliptical, or other non-rectangular shape. When operating in a contactless mode, the transponder chip module (TCM) may be powered by RF from an external RFID reader, and may also communicate by RF with the external RFID reader. An "activation distance" may refer to a distance at which the transponder chip module TCM may harvest sufficient energy from the RFID reader to commence operation. Similarly, a "read/write distance" may refer to a distance at which the transponder chip module TCM may communicate reliably with the external RFID reader.

The card body CB—which may be referred to as a substrate, or an inlay substrate—may generally comprise one or more layers of material such as Polyvinyl Chloride (PVC), Polycarbonate (PC), PET-G (Polyethylene Terephtalate Glycol-modified), Copolyester (Tritan), Teslin™, synthetic paper, paper and the like.

The card body CB may be generally rectangular, measuring approximately 54 mm×86 mm (refer to ISO/IEC 7810), having a thickness of approximately 300 µm thick when referred to as an inlay substrate or 760 µm when referred to as a smartcard. The card body CB is typically significantly (such as 30 times) larger than the antenna module AM.

The booster antenna BA may generally comprise a relatively large winding which may be referred to as a card antenna CA component (or portion) having a number of turns disposed in a peripheral area of the card body CB, and a relatively small coupler coil (or coupler antenna) CC component (or portion) having a number of turns disposed at a coupling area of the card body CB corresponding to the location of the antenna module AM.

The card antenna CA and coupler coil CC may comprise wire mounted to (embedded in) the card body CB using an ultrasonic tool comprising a sonotrode and a capillary. See, for example U.S. Pat. Nos. 6,698,089 and 6,233,818. The wire may be non-insulated, insulated, or self-bonding wire, having an exemplary diameter in the range of approximately 50-112 µm.

Some examples of smartcards (SC) with booster antennas (BA) may be found in . . .
 U.S. Pat. No. 8,474,726 issued 2 Jul. 2013
 U.S. Pat. No. 8,366,009 issued 5 Feb. 2013
 U.S. Ser. No. 14/020,884 filed 8 Sep. 2013 (now US 20140091149 3 Apr. 2014)

Metallized smartcards may have a faceplate or layer of metal extending over nearly the entire area of the card (except for an opening for the antenna module (AM)), and some smartcards may be made largely of metal. The presence of such a metal layer or mass in the smartcard may tend to attenuate contactless communication (e.g., ISO 14443, ISO 15693) between the smartcard and an external reader. The contact pads themselves may also tend to attenuate contactless communication. Hence, metallized smartcards may often function in a contact mode (e.g., ISO 7816) only.

Foil composite cards and metal cards may be disclosed in . . .
 US 20090169776 (2009 Jul. 2; Herslow)
 US 20110189620 (2011 Aug. 4; Herslow)
 Shielding layers and the like may be disclosed in . . .
 U.S. Pat. No. 8,261,997 (2012 Sep. 11; Gebhart/NXP)
 EP1854222 (NXP)
 EP 02063489 (Tyco)
 U.S. Ser. No. 13/744,686 filed 18 Jan. 2013 (now US 20130126622, 23 May 2013) discloses offsetting shielding and enhancing coupling in metallized smart cards. As disclosed therein (FIG. 4A), a conductive "compensation loop" CL may be disposed behind the booster antenna BA, extending around the periphery of the card body CB. The compensation loop CL may be an open loop having two free ends, and a gap ("gap") therebetween. The compensation loop CL may be made of copper cladding.

Some other patents of interest may include . . .
 U.S. Pat. No. 8,393,547 issued 2013 Mar. 12 (Kiekhaefer et al.; Perfect Plastic)
 US 20140166762 published 2014 Jun. 19 (Herslow)
 Some terms used herein may include:
 "skin depth" relates to the "skin effect" which is the tendency of an alternating electric current (AC) to become distributed within a conductor such that the current density is largest near the surface of the conductor. A "skin depth", or minimum thickness for conducting current may be defined, for a given material at a given frequency. For example, at 13.56 MHz, the skin depth for copper may be approximately 18 µm (17.7047 µm).
 "transparency" refers to the ability of electromagnetic radiation to pass through a material. A threshold for non-transparency (or the ability to interact with RF) may be a fraction of the skin depth for the metal layer in question at a given frequency of interest. For example, the non-transparency threshold for copper at 13.56 MHz, may be one-tenth of the skin depth, or approximately 1.7 µm.

Some Patents/Publications of Interest

Some of the following US patents and published patent applications may be related to some of the embodiments of the invention(s) disclosed herein.

| U.S. Patents and Publications | | |
|---|---|---|
| 7,494,057 | 2009 Feb. 24 | Lasch et al. (AMEX) |
| 7,530,491 | 2009 May 12 | Lasch et al. (AMEX) |
| 7,588,184 | 2009 Sep. 15 | Gandel et al. (AMEX) |
| 7,819,310 | 2010 Oct. 26 | Lasch et al. (AMEX) |
| 7,823,777 | 2010 Nov. 2 | Varga et al. (AMEX) |
| 8,033,457 | 2011 Oct. 11 | Varga et al. (AMEX) |
| 8,079,514 | 2011 Dec. 20 | Lasch et al. (AMEX) |
| 8,523,062 | 2013 Sep. 3 | Varga et al. (AMEX) |
| 8,186,582 | 2012 May 29 | Varga et al. (AMEX) |
| 7,757,957 | 2010 Jul. 20 | Cranston et al. (AMEX) |
| 8,360,312 | 2013 Jan. 29 | Varga et al. (AMEX) |
| 7,721,956 | 2010 May 25 | Williams et al. (AMEX) |
| 7,440,771 | 2008 Oct. 21 | Purk (AMEX) |
| 6,764,014 | 2004 Jul. 20 | Lasch et al. (AMEX) |
| 7,377,443 | 2008 May 27 | Lasch et al. (AMEX) |
| 7,607,583 | 2009 Oct. 27 | Berardi et al. (AMEX) |
| 7,837,116 | 2010 Nov. 23 | Morril Webb et al. (AMEX) |
| 8,066,190 | 2011 Nov. 29 | Faenza, Jr. (AMEX) |
| 8,186,598 | 2012 May 29 | Faenza, Jr. (AMEX) |
| 8,191,788 | 2012 Jun. 5 | Morrill-Webb et al. (AMEX) |
| 6,581,839 | 2003 Jun. 24 | Lasch et al. (AMEX) |
| 6,749,123 | 2004 Jun. 15 | Lasch et al. (AMEX) |
| 6,986,465 | 2006 Jan. 17 | Kiekhaefer (AMEX) |
| 7,306,158 | 2007 Dec. 11 | Berardi et al. (AMEX) |
| 20140144993 | 2014 May 29 | Seo et al (Biosmart) |
| 20130320095 | 2013 Dec. 5 | Blum (Black Card) |
| 20140138443 | 2014 May 22 | Blum (Black Card) |
| 20130320095 | 2013 Dec. 5 | Blum (Black Card) |
| 8,672,232 | 2014 Mar. 18 | Herslow (Composecure) |
| 20140021261 | 2014 Jan. 23 | Mosteller (CPI) |
| 20130168454 | 2013 Jul. 4 | Oh et al. (Hyundai) |

-continued

| U.S. Patents and Publications | | |
|---|---|---|
| 8,393,547 | 2013 Mar. 12 | Keikhaefer et al. (Perfect ..) |
| 20140070009 | 2014 Mar. 13 | Zambrano L. (Card Limited) |
| 20100078329 | 2010 Apr. 1 | Mirsky et al. |

Additionally, some of the following US and foreign patents and published patent applications may be related to some of the embodiments of the invention(s) disclosed herein.

| | | |
|---|---|---|
| U.S. Pat. No. 9,564,678 | 2017 Feb. 7 | Kato et al. (Murata) |
| U.S. Pat. No. 6,452,563 | 2002 Sep. 17 | Porte (Gemplus) |
| U.S. Pat. No. 8,608,082 | 2013 Dec. 17 | La Garrec et al. (Oberthur) |
| EP 2372840 | 2013 Sep. 25 | Hashimoto (Panasonic) |

SUMMARY

It is a general object of the invention to provide improved techniques for improving coupling of smartcards (as an example of secure documents, and the like) with a contactless reader. This may be of particular interest in the milieu of metallized (or metal) smartcards.

Some other objects may include relaxing performance constraints on the booster antenna (BA) of the smart card (SC), including the possibility of eliminating the booster antenna (BA) altogether.

As disclosed in U.S. Pat. Nos. 9,798,968 and 9,475,086, a "coupling frame" may comprise a metal layer in a card body for a smartcard, or a metal card body for a smartcard, the metal layer (or metal card body) having an opening for receiving a transponder chip module, and a slit extending from an outer edge of the metal layer (or metal card body) to the opening. The coupling frame, particularly the slit thereof, may overlap at least a portion of a module antenna in the transponder chip module.

According to the invention, generally, a card body for a smartcard, particularly a smartcard having contactless capability, may comprise two metal layers separated by an insulting (or dielectric) layer. Each metal layer may be formed as a coupling frame—namely, having a slit and an opening. The slits may be arranged in different directions than one another, so that the slit of one coupling frame may be supported by an area without a slit of the other coupling frame.

A stackup of plastic and metal layers for laminating together to form a smartcard body may comprise, in the following order, a front plastic face card layer, a first metal coupling frame (CF-1) layer, an internal card dielectric layer (which may be adhesive), a metal second coupling frame (CF-2) layer, and a rear plastic face card layer. The coupling frame layers (CF-1, CF-2) and dielectric layer may first be laminated together as a "core" (or inlay), then subsequently the front and rear face card layers may be laminated to the core.

According to some embodiments (examples) of the invention, generally a conductive coupling frame (CF) having two ends, forming an open loop or discontinuous metal layer, disposed surrounding and closely adjacent a transponder chip module (TCM), and substantially coplanar with an antenna structure (AS, CES, LES) in the transponder chip module (TCM). A metal card body (MCB) or a transaction card with a discontinuous metal layer having a slit (S) extending from a module opening (MO) to a periphery of the card body to function as a coupling frame (CF). The coupling frame (CF) may be thick enough to be non-transparent to RF at frequencies of interest. A switch may be provided to connect ends of the coupling frame (CF) across the slit (S). A reinforcing structure may be provided to stabilize a card body. The transponder chip module (TCM) may comprise a laser-etched antenna structure (LES), a chemical-etched antenna structure (CES) and a non-perforated contact pad (CP) arrangement. A coupling frame (CF) may be incorporated onto the module tape (MT) for a transponder chip module (TCM).

According to some embodiments (examples) of the invention, generally, a smartcard (SC) may comprise an electrically-conductive layer, referred to herein as a "coupling frame" (CF) disposed in the card body (CB) around at least two sides (or 180°) of a transponder chip module (TCM) so as to be in close proximity with the module antenna (MA) in the transponder chip module (TCM). The coupling frame (CF) may at least partially surround the transponder chip module (TCM), such as surrounding two sides (or 180°) or three sides (or 270°) of the transponder chip module (TCM), particularly the antenna structure (AS) of the transponder chip module (TCM). This includes "at least" two sides and "at least" three sides. The coupling frame (CF) may nearly completely surround the transponder chip module (TCM), such as all four sides (or 360°) thereof, minus a slit (S). The slit (S) may be very small, such as 50 μm. (Such a small (50 μm) slit (S) may correspond to a fraction of a percent of the perimeter of the transponder chip module (TCM) or module opening (MO), or less than 1°.)

The module antenna (MA) may comprise an antenna structure (AS) which has been etched from a conductive layer or foil to have a conductor having two ends and arranged in a spiral pattern which has a number (such as 10-12) of turns (which may be referred to as "tracks"), separated by spaces. An end portion of an antenna structure (AS) may also comprise of a quarter, half or three quarter turn (fractions of turns).

A coupling frame (CF) surrounding all four sides (nearly 360°) of the transponder chip module (TCM) may be provided with a module opening (MO) for accommodating the transponder chip module (TCM), and may be provided with a slit (or slot, or cut-out, or gap) extending from the module opening (MO) to the perimeter of the coupling frame (CF). The slit ensures that the coupling frame (CF) is an "open loop" having two ends. A switch (SW) may be incorporated into the card body to connect the ends of the coupling frame (CF) together, so that it is not an open loop.

Generally, the coupling frame (CF) may comprise a conductive layer, a metallized layer, a metal layer or overlapping metal layers, each layer at least partially surrounding the transponder chip module (TCM) and (in aggregate, in the case of two or more conductive layers) covering at least a substantial area of the card body (CB) for coupling with an external contactless reader.

The coupling frame (CF) may comprise one or more discontinuous layers of conductive material in the form of a perforated metal mesh or a wireframe metal mesh, or other discontinuous surface (including embedded ribbon conductor) to avoid electrostatic discharge (ESD) problems.

A coupling frame (CF) with a cut-out (module opening MO) to accept the transponder chip module (TCM) may be positioned in or on the card body to partially surround at close proximity to a laser-etched antenna structure (LES) of the transponder chip module (TCM).

The coupling frames disclosed herein may be formed from layers of various metals (such as copper, aluminum (aluminium), brass, titanium, tungsten, stainless steel, silver, graphene, silver nanowires, conductive carbon ink), and may be in the form of ribbon cable, or the like, which could be hot stamped into a layer of the card.

The transponder chip module (TCM) may comprise an RFID (radio frequency identification) chip or chip module (either of which may be referred to as "CM") and an etched (typically planar) antenna structure formed as a flat rectangular spiral having a number (such as 10-12) of conductive tracks separated by spaces. Using laser etching, the spaces between adjacent tracks can be less than 100 μm, less than 75 μm, less than 50 μm and less than 25 μm. The tracks may typically have a width of 100 μm. Laser-etching an antenna structure or structures underneath and surrounding a chip (CM) mounted on a module tape (MT) may improve the overall electrical parameters of the antenna.

A coupling frame (CF), at least partially surrounding a transponder chip module (TCM) and residing substantially on the same plane as the laser-etched antenna structure (LES) in a card body, document or tag, without creating a closed circuit around the transponder chip module (TCM) by leaving at least one space or gap as an open circuit such as a cut-out, slit or slot in the coupling frame (CF), may further increase the amplitude of the resonance curve of the transponder chip module (TCM) with minimal frequency shift when interrogated by a reader. The activation distance of a transponder chip module (TCM) with a coupling frame (CF) may be substantially increased by at least a factor of 1.5, as opposed to the performance of a transponder chip module (TCM) without a coupling frame (CF). Activation distances of at least 2 cm, including up to 3 cm and up to 4 cm may be achieved using a transponder chip module (TCM) having a laser-etched antenna structure (LES) in conjunction with a coupling frame (CF) in (or comprising most of) the card body (CB).

Metal cards or composite metal cards in ISO card format (s), having a module opening (MO) for accommodating a transponder chip module (TCM) may be provided with a slit in the metal, in the manner of the coupling frame (CF) disclosed herein, to break the conductive path and create an open circuit (open loop) conductive structure surrounding the transponder chip module (TCM), thereby increasing the communication distance (e.g., activation distance, Read/Write distance, and the like) between an external reader and a smartcard with a transponder chip module (TCM). The slit can be filled or plugged with a non-conductive medium. The metal card or metal slug in a card body acting as the coupling frame can be made from materials such as copper, aluminum, tungsten, stainless steel, brass, titanium or a combination thereof.

Holographic metal foils, which may be transparent to high frequency electromagnetic waves and do not impair or influence the performance of a transponder chip module, may be implanted in a metal foil card because the thickness of the metal is significantly lower than the skin depth of the metal at a frequency of interest, such as 13.56 MHz, or more generally 10-30 MHz.

Security features, logos and embossed characters may be engraved, etched or stamped into a metal layer of suitable thickness to perform the function of a coupling frame (CF).

The invention relates broadly to RFID transponders which are able to transmit data to and receive data from an external reader. Such transponders may generally fall into two categories—"active" and "passive". Active transponders have an internal power source, such as a battery. Passive transponders are powered by (harvest power from) the external reader. Due to the lack of their own power source, several factors may influence the successful operation of a passive transponder, some of which are addressed herein. For example, the distance at which a passive transponder may be activated (powered up by) and communicate reliably (read/write) with the external reader may be very limited. Consequently, smart cards (SC) comprising passive transponders have typically required booster antennas (BA) in the card body (CB). In the main hereinafter, passive RFID transponders comprising (passive) transponder chip modules (TCM) are discussed, and unless otherwise specified, all embodiments are directed to passive RFID transponders and transponder chip modules (TCM). Passive RFID transponders and transponder chip modules (TCM) disposed in smart cards (SC) (including metal smart cards) and capable of operating in a contactless mode without requiring a booster antenna (BA) are disclosed herein.

According to the invention, generally, a conductive coupling frame (CF) may have two ends, may form an open loop, may be disposed surrounding and closely adjacent a transponder chip module (TCM), and may be substantially coplanar with an antenna structure (AS, LES) in the transponder chip module (TCM). A metal card body (MCB) may have a slit (S) extending from a module opening (MO) to a periphery of the card body to function as a coupling frame (CF). The coupling frame (CF) may be thick enough to be non-transparent (opaque) to RF at frequencies of interest. A switch may be provided to connect ends of the coupling frame (CF) across the slit (S). The transponder chip module (TCM) may comprise a laser-etched antenna structure (LES) and a non-perforated contact pad (CP) arrangement.

According to some embodiments (examples) of the invention, a smartcard (SC) may comprise: a metal layer (ML); and an opening (MO) in the metal layer for receiving a transponder chip module (TCM); characterized by: a discontinuity comprising a slit (S) or a non-conductive stripe (NCS), in the metal layer (ML), extending from the opening to a periphery of the metal layer, whereby the metal layer (ML) comprises an open-loop coupling frame (CF) having two ends. The coupling frame may be disposed closely adjacent to the transponder chip module when the transponder chip module is disposed in the opening. A portion of the coupling frame (CF) may overlap a portion of an antenna structure (AS) in the transponder chip module (TCM). The coupling frame may extend over substantially the entire area of the smartcard. The metal layer may comprise a metal card body (MCB) of a metal smartcard.

The slit may extend completely through the metal layer. The slit may extend only partially through the metal layer, and remaining material of the metal layer below the slit has a thickness below a transparency threshold for the metal layer. The slit may have a width which is smaller than the opening. The slit may be at least partially filled with an electrically non-conducting material selected from the group consisting of polymer and epoxy resin, reinforced epoxy resin. A reinforcing structure (RS) disposed at a location of the slit (S) to reinforce the metal layer (ML).

The metal layer may be substantially coplanar with an antenna structure (AS) in the transponder chip module. The metal layer may comprise a material having a thickness greater than a transparency threshold for absorbing electromagnetic waves at a frequency of interest; may have a thickness greater than a skin depth for conducting electricity at a frequency of interest; may have a thickness greater than 1 μm; may have a thickness greater than 30 μm; and may have a thickness up to the total normal thickness of a smartcard. The metal layer may comprise a material selected from the group consisting of copper, aluminum (aluminium), brass, titanium, tungsten, stainless steel, silver, graphene, silver nanowires and conductive carbon ink. The metal layer may be disposed on a non-conductive layer by a process selected from the group consisting of silk screen printing and vapor deposition. The metal layer may comprise a mesh. The metal layer may comprise an engraving, embossing, or stamped feature/logo/ID which serves as a security feature for the smartcard.

A gap between an inner edge of the coupling frame and an outer feature of an antenna structure (AS) in the transponder chip module may be characterized by the gap is less than 300 µm. The gap may be approximately 50 µm.

The antenna structure (AS) in the transponder chip module may comprise a substantially planar, etched (chemically etched, or laser etched) structure having a number of tracks separated by spaces. The spaces between tracks may be less than 100 µm; less than 75 µm; less than 50 µm; less than 25 µm; and less than the width of a laser beam An activation distance for a transponder chip module disposed in the opening of the coupling frame may be at least 20 mm; at least 25 mm; at least 30 mm; at least 35 mm; up to 40 mm; and more than 40 mm.

A switch (SW) may be connected across ends of the coupling frame (CF). An LED may be connected across ends of the coupling frame (CF).

According to some embodiments (examples) of the invention, a coupling frame (CF) for a smartcard (SC) may comprise: a metal layer (ML) disposed in a card body (CB) of the smartcard and having two ends which are not connected with one another so that the metal layer (ML) forms an open loop coupling frame (CF) which is arranged to be closely adjacent and at least partially surround a transponder chip module (TCM) disposed in an opening (MO) in the metal layer (ML). The coupling frame may be substantially coplanar with an antenna structure (AS) in the transponder chip module. At least a portion of the coupling frame may overlap at least a portion of an antenna structure (AS) in the transponder chip module (TCM). The transponder chip module (TCM) may comprise an etched antenna structure (AS, LES). The module opening (MO) may be spaced from 50 µm to 300 µm from the etched antenna structure. The metal layer (ML) may have a thickness greater than a transparency threshold for a material of the metal layer (ML).

According to some embodiments (examples) of the invention, a method of enhancing coupling of a transponder chip module (TCM) with an external reader, wherein the transponder chip module is disposed in a card body (CB, MCB) of a smart card having a metal layer (ML) and comprises an antenna structure (AS), may be characterized by: forming the metal layer as a coupling frame (CF) closely adjacent to and surrounding the transponder chip module, wherein the coupling frame is formed as an open loop having two ends. The antenna structure may be formed by laser etching (resulting in a laser-etched antenna structure (LES)). The antenna structure (AS) may be a chemically-etched antenna structure. The coupling frame (CF) may be substantially coplanar with the antenna structure (AS). A gap between the two ends may be approximately 50 µm. The metal layer may have a thickness greater than a transparency threshold for a material of the metal layer.

According to some embodiments (examples) of the invention, smartcard (SC) comprising a card body (CB, MCB) and a passive transponder chip module (TCM) disposed in the card body, may be characterized in that: an activation distance for the transponder chip module, without a booster antenna in the card body, is at least 2 cm, at least 3 cm or at least 4 cm.

The disclosure further relates to a coupling frame (CF) as a full metal card body partially surrounding a transponder chip module (TCM) with a slit, slot or gap to create an open circuit for capacitive coupling with a contactless reader. The coupling frame (CF) may have a window or stepped recess to accept the transponder chip module (TCM), and prepared through mechanical milling or laser ablation to leave a non-conductive area free behind the planar antenna of the transponder chip module (TCM), so as to avoid attenuation of the electromagnetic field. The opening or non-conductive area can be filled with a resin, colored polymer, magnetic particles, ferrite material or an active synthetic material which illuminates during an electronic transaction.

A metal card, or a single transaction card may comprise a discontinuous metal layer acting as a coupling frame, such as for example, titanium, stainless steel, brass, aluminum, etc.

A conductive coupling frame (CF) having two ends, forming an open loop having two ends or a discontinuous metal layer disposed surrounding and closely adjacent a transponder chip module (TCM, 610), and substantially coplanar with an antenna structure (AS, CES, LES) in the transponder chip module (TCM). A metal card body (MCB, CB) or a transaction card with a discontinuous metal layer having a slit (S) or a non-conductive strip (NCS, 1034) extending from a module opening (MO) to a periphery of the card body to function as a coupling frame (CF). The coupling frame (CF) may be thick enough to be non-transparent to RF at frequencies of interest. A switch (SW) may be provided to connect ends of the coupling frame (CF) across the slit (S, 630). A reinforcing structure (RS) may be provided to stabilize the coupling frame (CF) and card body (CB). The transponder chip module (TCM) may comprise an antenna structure which may be a laser-etched antenna structure (LES) or a chemical-etched antenna structure (CES), and may comprise and a non-perforated contact pad (CP) arrangement. A coupling frame (CF) may be incorporated onto the module tape (MT, CCT) for a transponder chip module (TCM).

In their various embodiments, the invention(s) described herein may relate to industrial and commercial industries, such RFID applications, payment smartcards, electronic passports, identity cards, access control cards, wearable devices the like.

Other objects, features and advantages of the invention(s) disclosed herein may become apparent in light of the following illustrations and descriptions thereof.

BRIEF DESCRIPTION OF THE DRAWINGS

Reference will be made in detail to embodiments of the disclosure, non-limiting examples of which may be illustrated in the accompanying drawing figures (FIGs). The figures may generally be in the form of diagrams. Some elements in the figures may be exaggerated, others may be omitted, for illustrative clarity. Some figures may be in the form of diagrams.

Although the invention is generally described in the context of various exemplary embodiments, it should be understood that it is not intended to limit the invention to these particular embodiments, and individual features of various embodiments may be combined with one another. Any text (legends, notes, reference numerals and the like) appearing on the drawings are incorporated by reference herein. Some elements may be referred to with letters ("CM", "CF", "MT", "TCM", "LES", "CB", "MO", "S", and the like), rather than or in addition to numerals.

FIG. 2A is a diagram, in cross-section, of an exemplary stack-up of a metal foil smartcard.

FIG. 2B is a diagram, in cross-section, of an exemplary stack-up of a plastic card body with a transponder chip module (TCM) and a coupling frame (CF) on the same plane as the laser-etched antenna.

DETAILED DESCRIPTION

Figure 1:
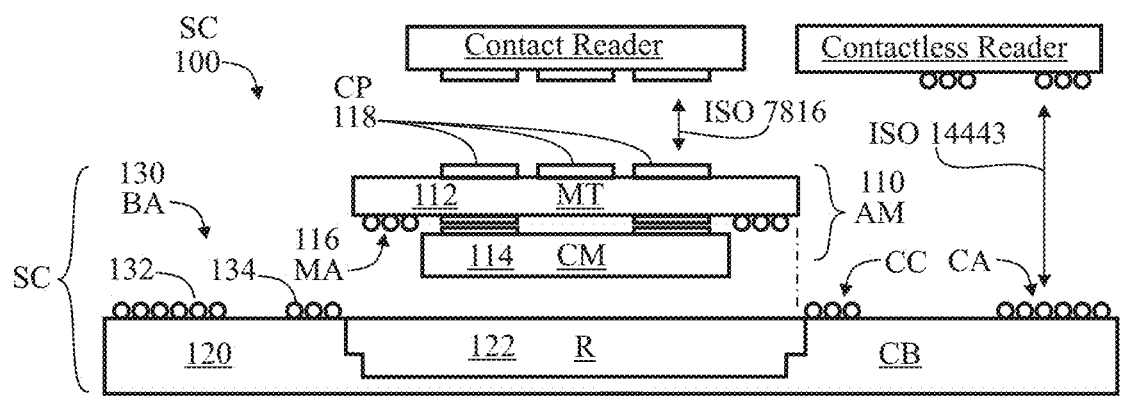
FIG. 1 is a diagram, in cross-section, of a dual-interface smart card (SC) and readers.

Various embodiments (or examples) may be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment is included in at least one embodiment of the present invention. Some embodiments may not be explicitly designated as such ("an embodiment").

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity. Elements referred to in the singular (e.g., "a widget") may be interpreted to include the possibility of plural instances of the element (e.g., "at least one widget"), unless explicitly otherwise stated (e.g., "one and only one widget").

In the following descriptions, some specific details may be set forth in order to provide an understanding of the invention(s) disclosed herein. It should be apparent to those skilled in the art that these invention(s) may be practiced without these specific details. Any dimensions and materials or processes set forth herein should be considered to be approximate and exemplary, unless otherwise indicated. Headings (typically underlined) may be provided as an aid to the reader, and should not be construed as limiting.

Reference may be made to disclosures of prior patents, publications and applications. Some text and drawings from those sources may be presented herein, but may be modified, edited or commented to blend more smoothly with the disclosure of the present application.

In the main hereinafter, RFID cards, electronic tags and secure documents in the form of pure contactless cards, dual interface cards, phone tags, electronic passports, national identity cards and electronic driver licenses may be discussed as exemplary of various features and embodiments of the invention(s) disclosed herein. As will be evident, many features and embodiments may be applicable to (readily incorporated in) other forms of smart cards, such as EMV payment cards, metal composite cards, metal hybrid cards, metal foil cards, access control cards and secure credential documents. As used herein, any one of the terms "transponder", "tag", "smart card", "data carrier", "wearable device" and the like, may be interpreted to refer to any other of the devices similar thereto which operate under ISO 14443 or similar RFID standard. The following standards are incorporated in their entirety by reference herein:

ISO/IEC 14443 (Identification cards—Contactless integrated circuit cards—Proximity cards) is an international standard that defines proximity cards used for identification, and the transmission protocols for communicating with it.

ISO/IEC 15693 is an ISO standard for vicinity cards, i.e. cards which can be read from a greater distance as compared to proximity cards.

ISO/IEC 7816 is an international standard related to electronic identification cards with contacts, especially smart cards.

EMV standards define the interaction at the physical, electrical, data and application levels between IC cards and IC card processing devices for financial transactions. There are standards based on ISO/IEC 7816 for contact cards, and standards based on ISO/IEC 14443 for contactless cards.

A typical data carrier described herein may comprise
(i) a transponder chip module (TCM) having an RFID chip (CM; or chip module) and a laser-etched antenna structure (AS, LES),
   it should be understood that the antenna structure (AS) may be laser-etched, or chemically-etched, and may be substantially planar having a number of tracks separated by spaces
(ii) a card body (CB) (which may be referred to simply as a "card"), and
(iii) a coupling frame (CF) disposed in or on the card body (CB) to enhance coupling between the transponder chip module (TCM) and the antenna of an external RFID "reader".

When "chip module" is referred to herein, it should be taken to include "chip", and vice versa, unless explicitly otherwise stated.

When "transponder chip module" (TCM) is referred to herein, it should be taken to include "antenna module" (AM), and vice versa, unless explicitly otherwise stated. The transponder chip module (TCM) may also be referred to as a "transponder IC module".

The transponder chip module (TCM) may comprise non-perforated isolated metal features such as contact pads on the face-up side of the module tape (MT) and a laser-etched antenna structure or structures (LES) on the face-down side of the module tape (MT). Certain components on either side of the module tape (MT) may be chemically etched. An antenna structure incorporated directly on the chip may inductively couple with the laser-etched antenna structure.

Throughout the various embodiments disclosed herein, unless specifically noted otherwise (in other words, unless excluded), the element referred to as "CM" will most appropriately be a bare integrated circuit (IC) die (or RFID chip), rather than a chip module (a die with a carrier). In contrast therewith, some figures present examples that are specifically "chip modules" having IC chips (such as a "CM") mounted and connected to substrates. A "chip module" (die and carrier) with a laser-etched antenna structure (LES) and connected thereto may be referred to as a transponder chip module (TCM).

When "inlay substrate" is referred to herein, it should be taken to include "card body", and vice versa, as well as any other substrate for a secure document, unless explicitly otherwise stated.

The descriptions that follow are mostly in the context of dual interface (DI, DIF) smart cards, and relate mostly to the contactless operation thereof. Many of the teachings set forth herein may be applicable to pure contactless cards, tags, secure documents (e.g. electronic passports) and the like having only a contactless mode of operation. Generally, any dimensions set forth herein are approximate, and materials set forth herein are intended to be exemplary. Conventional abbreviations such as "cm" for centimeter", "mm" for millimeter, "µm" for micron, and "nm" for nanometer may be used.

FIG. 1 illustrates a smart card SC 100 in cross-section, along with a contact reader and a contactless reader. An antenna module AM (or transponder chip module TCM) 110 may comprise a module tape (MT) 112, an RFID chip (CM) 114 disposed on one side (face-down) of the module tape MT along with a module antenna (MA) 116 and contact pads (CP) 118 disposed on the other (face-up) side of the module tape MT for interfacing with an external contact reader. The card body (CB) 120 comprises a substrate which may have a recess (R) 122 extending into one side thereof for receiving the antenna module AM. (The recess R may be stepped—such as wider at the surface of the card body CB—to accommodate the profile of the antenna module AM.) The booster antenna BA 130 may comprise turns (or traces) of wire (or other conductor) embedded in (or disposed on) the card body CB, and may comprise a number of components such as (i) a card antenna (CA) component 132 and (ii) a coupler coil (CC) component 134. It may be noted that, as a result of the recess R being stepped, a portion of the card body CB may extend under a portion of the antenna module AM, more particularly under the module antenna MA.

Metal Foils

Metal foils, metallic coatings, segments of metal foil or metal particles may be deposited on or embedded in the inlay (or card body CB) to alter the electrical characteristics of the RFID device or smartcard. A metal foil layer in the card body construction may helps to meet the ISO and EMV communication standards for RFID devices or smart cards in terms of read write distance, baud rate, Q-factor bandwidth, etc. The metal foil can be any pure metal such as aluminum or copper or an alloy. The metal foils, metallic coatings, segments of metal foil or metal particles should have a thickness less than the skin depth of the metal or material being used in order to prevent the formation of eddy currents in the metal or metallic structure that will attenuate the RF electromagnetic field. The use of thicknesses substantially less than the skin depth of the metal or material being used will increase the electrical resistance of the structure to alternating current flows (impedance) thereby preventing unwanted or excessive attenuation of the RF electromagnetic field. Other electrical conductors such as metal nanoparticles, metal nanowires or carbon-based conductors like graphite or exfoliated graphite can be used to construct electrically conductive networks that are hereby included under the definition of a metal foil or metallic structure.

Holographic metal foils may be glued or laminated to both sides of the booster antenna BA inlay (card body CB). The holographic metal foils may not significantly attenuate the electromagnetic field, in other words the holographic metal foils may be largely transparent to the RF field. The holographic metal foils can be used to mask (visually hide) the presence of the booster antenna BA. In addition, the holographic metal foils when placed either side (above, below) of the booster antenna BA can generate capacitance which may help improve the communication performance of the smart card with the reader (FIG. 1).

As disclosed in U.S. Ser. No. 14/173,815 filed 6 Feb. 2014, continuation of U.S. Ser. No. 14/020,884 filed 8 Sep. 2013 (now US 20140091149, 3 Apr. 2014), holographic metal foils may be glued or laminated to a card body with a booster antenna BA inlay (card body CB) or an inlay with a antenna connected to an RFID chip. The holographic metal foils may not significantly attenuate the electromagnetic field, in other words the holographic metal foils may be largely transparent to the RF field if their metal layer thickness may be approximately 30 nm.

The holographic metal foils can be used to mask (visually hide) the presence of a booster antenna BA in a card body. In addition, holographic metal foils when placed either side (above, below) of a booster antenna BA in a card body may generate capacitance which may help improve the communication performance of the smartcard with the reader.

Metal foils may comprise a conductive material (such as aluminum on PVC), having a sheet resistance which is very low, on the order of only a few Ohms, which normally should block the electromagnetic field (such as between the booster antenna BA and an external reader, or between the booster antenna BA and the antenna module AM), but a mitigating factor may be the thickness of the aluminum (or other material), being thin enough to allow the electromagnetic field to pass through.

Metal foils from CFC (www.cfcintl.com) and Crown (www.crownrollleaf.com) are transparent to high frequency electromagnetic waves because the thickness of the metal layer, approximately 30 nm, is significantly lower the skin depth of the metal at 13.56 MHz.

An example of metal foil smartcard will be discussed. The smartcards may comprise a card body (CB). The card body may comprise one or more layers having metal foil. The smartcards may comprise a transponder chip module (TCM), without a booster antenna. The transponder chip module may comprise a dual interface (contact and contactless) chip. The transponder chip module may comprise an antenna which is laser-etched from a metal layer (foil or cladding). The card body may be milled to have a window opening (W) to accept the transponder chip module.

FIG. 2A is a cross-section of an exemplary stack-up of a metal foil smartcard (SC) 200. The card body (CB) 202 may comprise some of the following layers . . .

Layer(s) 1 may comprise PET-G: 125 μm transparent
Layer(s) 2 may comprise PET-G: 50 μm transparent
Layer(s) 3 (element 204) may comprise Metal/PVC foil: 170 μm (CFC foil)
   the metal may be a thin film having a thickness of approximately 30 nm (0.03 μm)
Layer(s) 4 may comprise PVC 150 μm
Layer(s) 5 may comprise PVC foil: 170 μm (CFC foil)
Layer(s) 6 may comprise PET-G: 125 μm
Layer(s) 7 may comprise PET-G: 50 μm The window opening (W) 206 in the card body (CB) is at least as large as the transponder chip module (TCM) 210, to accept installation of the transponder chip module (TCM). The window opening (W) may be referred to as a module opening (MO). The transponder chip module (TCM) may include an antenna structure (AS) 212 which is laser-etched from a conductive layer (foil or cladding), such as double-sided epoxy glass tape. The antenna may be substantially coplanar with the metal film in Layer 3. Contact pads (CP) 214 are disposed on the top (as viewed) surface of the transponder chip module (TCM).

The window opening (W) may be
up to 10% larger than the transponder chip module, or
approximately 10% larger than the transponder chip module, or
greater than 10% larger than the transponder chip module.

The stack height, not laminated, may be approximately 840 μm.

The stack height, laminated, may be approximately 800 μm.

The metal thickness (in Layer 3) may be approximately 30 nm.

The antenna may be substantially coplanar with the metal in Layer 3.

The read/write distance, with a laser etched antenna structure (LES) in the transponder chip module (TCM) and without a booster antenna (BA) in the card body (CB) may be approximately 1.5 cm.

With an exemplary stack-up described above, and variations thereof, and the antenna structure (AS) disposed substantially coplanar with the metal film (foil), and with an enlarged window opening, read/write distances in excess of 1.5 cm may be achieved, without requiring a booster antenna in the card body.

The performance of a transponder chip module (TCM) in terms of activation distance with an arrangement of contact pads, connection bridges or isolated metal features on its face-up side and a laser-etched antenna structure (LES) connected to an RFID chip (CM) on its face-down side may not be adversely influenced (affected) by the presence of a holographic metal foil in a card body. When the transponder chip module (TCM) is implanted in a milled cavity in a card body (CB), the holographic metal foil laminated to the card body may surround the transponder chip module on all sides and may not adversely influence (affect) its RF performance. The thickness of the metal on the foil is a relevant factor.

Metal Layers (ML)

Metal foils such as in FIG. 2A are typically thin, and may be too thin and may be so thin (below a transparency threshold) that electromagnetic waves pass through the metallized layer without absorption.

A metal layer (ML) for a coupling frame (CF), such as in FIG. 2B should be thick enough to conduct electricity and absorb an electromagnetic wave at a frequency of interest and enhance coupling between the transponder chip module (TCM) and an external reader (such as in FIG. 1). The coupling frame (CF) may be closely adjacent to, but not completely encircle (substantially surround), the transponder chip module (TCM), and may extend from adjacent the transponder chip module (TCM) to one or more outer edges of the metal layer (ML), which may be substantially coincident with the outer edges of the card body (CB).

The transponder chip module (TCM) may have a laser-etched (versus chemically etched, or versus wire-wound) antenna structure (LES) serving as a planar antenna structure with feature sizes (such as spaces between tracks) of approximately 25 µm, which may be achieved by laser etching. (Chemical etching may be limited to feature sizes on the order of 100 µm).

Laser-Etched Antenna Structures (LES)

U.S. Ser. No. 14/281,876 filed 19 May 2014 discloses LASER ABLATING STRUCTURES FOR ANTENNA MODULES FOR DUAL INTERFACE SMARTCARDS. Laser etching antenna structures for RFID antenna modules (AM) and combining laser etching and chemical etching are disclosed. Limiting the thickness of the contact pads (CP) to less than the skin depth (18 µm) of the conductive material (copper) used for the contact pads (CP). Multiple antenna structures (AS1, AS2) in an antenna module (AM), and incorporating LEDs into the antenna module (AM) or smartcard (SC) are also disclosed.

The antenna (or antenna structure AS) may be laser etched from a copper layer (cladding or foil), which may have a thickness less than the skin depth of copper (~18 µm), forming a number of tracks separated by a distance approximately equal to the width of the laser beam, such as approximately 25 µm. Subsequent to laser etching, the antenna structure may be plated, which may reduce the distance between tracks to approximately 20 µm (for example). This may result in increased performance of the antenna structure, and the overall antenna module AM (or transponder chip module (TCM)), and reduce performance constraints on the performance of a booster antenna (BA) in the card body (CB) of the smartcard (SC).

Coupling Frames (CF)

A metal surface or a conductive surface of suitable thickness and dimension acting as a coupling frame (CF) can replace (or obviate the need for) a booster antenna (BA) in a dual interface smartcard (SC). The coupling frame in a card body (CB), tag, document or the like, may act as a capacitive coupling antenna, concentrating the electromagnetic field around the transponder chip module (TCM) which may have a laser-etched antenna structure (LES).

It should be understood that the concepts associated with the coupling frame (and slotted metal layer in a card body), disclosed herein may provide performance benefits with other than laser-etched antenna structures (LES).

The performance of a laser-etched antenna structure (LES) in a transponder chip module (TCM) may be enhanced by surrounding the antenna structure (AS) with a metal frame (MF), or coupling frame (CF), in the card body (CB) of the smart card (SC).

According to some embodiments of the invention, generally, a dual interface smart card may comprise:
 a transponder chip module (TCM) having an antenna structure (AS);
 a card body (CB) comprising multiple layers; and
 at least one metal layer (ML) or metallized (metalized) layer forming an open loop coupling frame (CF) at least partially surrounding the transponder chip module (TCM).

FIG. 2B shows, generally, a smart card (SC) 200 having a card body (CB) 202. The card body (CB) may comprise several layers laminated together. A coupling frame (CF) 220 is shown disposed in (or on) a given layer ("a layer") so as to be adjacent to, or surround the transponder chip module (TCM). The transponder chip module (TCM) 210 may comprise a laser-etched antenna structure (LES) 212.

The antenna structure (AS) may be formed by laser etching, having a number of (such as 10 or 12) tracks which are disposed substantially planar with one another on a module tape (MT) or other suitable substrate, in a generally rectangular spiral pattern. The spacing between tracks may be on the order of 25 µm, or less (such as 20 µm, after plating). The metal frame (or layer), forming an open loop coupling frame (CF), may be substantially coplanar with the antenna structure (AS), and may be disposed adjacent at least one, at least two or at least three sides of the transponder chip module (TCM). The coupling frame (CF) may nearly encircle the transponder chip module (TCM), being formed as an open loop, having two ends, or as a loop having at least two segments (and corresponding at least four ends). The metal frame (MF) may comprise a copper foil or cladding, may be laminated to a layer of the card body (CB) of the smart card (SC), and may have a thickness of approximately 12, 18 or 35 µm. The coupling frame (CF) may tend to concentrate the electromagnetic flux, acting (by way of analogy) as a coupler coil (CC, 134). In some embodiments, more than one coupling frame, or portions (CF1, CF2 . . . CFn) of an overall coupling frame (CF) may be disposed concentrically around the transponder chip module (TCM).

The coupling frame (CF) may be referred to as a metal frame (MF), and vice-versa. A metal layer (ML), or indeed an entire metal card body (MCB) may be modified to act as a coupling frame (CF).

Figure 2C:
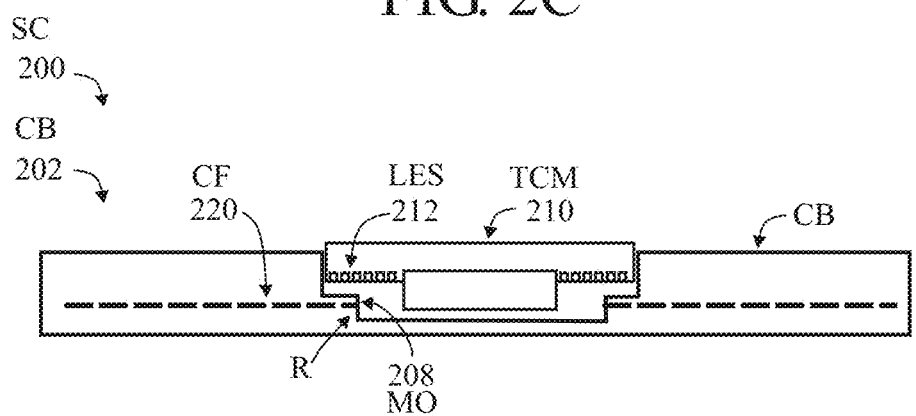
FIG. 2C is a diagram, in cross-section, showing a transponder chip module (TCM) disposed in the card body (CB) of a smartcard (SC) wherein the coupling frame (CF) overlaps the laser-etched antenna structure (LES) in the transponder chip module (TCM).

FIG. 2C shows an example of a smartcard (SC) 200 with a coupling frame (CF) 220 incorporated into its card body (CB) 202 which has a stepped recess (R). A transponder chip module (TCM) 210 has a laser-etched antenna structure (LES) 212, an outer portion of which may overhang an inner portion of the coupling frame (CF). The coupling frame (CF) has an opening (MO) 208 for receiving the transponder chip module (TCM) 210. The dashed line indicates, schematically, either a metal layer in a stackup of a card body, or a substantially entirely metal card body (CB). When "metal layer" is referred to herein, it may refer to such a metal card body.

Figure 2D:
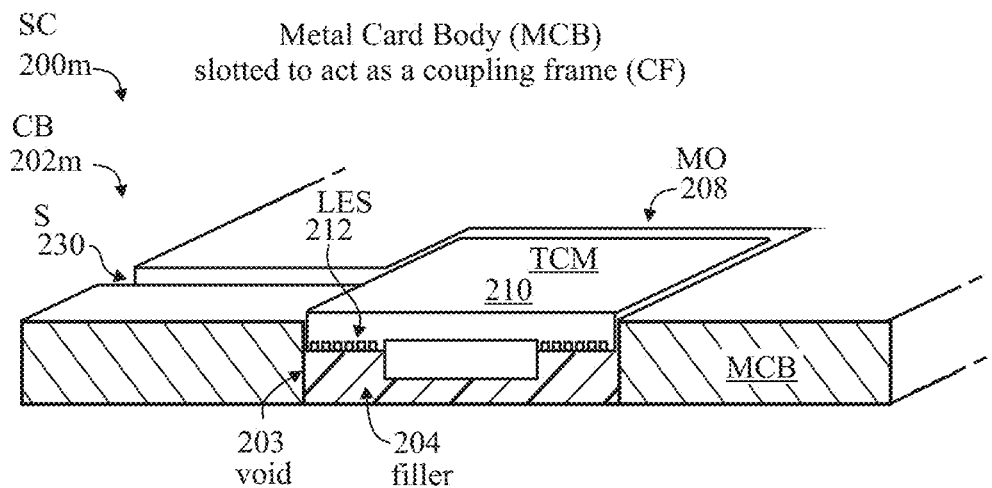
FIG. 2D is a diagram, partially in perspective and partially in cross-section, showing a transponder chip module (TCM) disposed in the card body (CB) of metal smartcard (SC), or metal card (MC), wherein substantially the entire card body (CB) comprises metal, and may be referred to as a metal card body (MCB).

FIG. 2D shows a transponder chip module (TCM) 210 disposed in the card body (CB) 202*m* of a metal smartcard (SC) 200*m*, or metal card (MC), wherein substantially the entire card body (e.g., 760 µm thick) comprises metal, and may be referred to as a metal card body (MCB). For such a metal card (MC), there has to be a non-conductive area behind the transponder chip module (TCM). The transponder chip module (TCM) resides in an opening (MO) 208, in the metal card body (MCB) 202 which may also be referred to as a module opening (MO). The opening (MO), may be prepared by mechanical milling, or laser ablation, and may be at least the size of the laser etched antenna structure (LES) 212, and may be stepped (for an example of a stepped recess/opening, see FIG. 2C) so that a portion of the metal card body (MCB) overlaps (underneath, as viewed) an outer portion of the laser-etched antenna structure (LES).

Throughout the embodiments disclosed herein, antenna structures (AS) which are other than laser-etched may be substituted for the laser-etched antenna structure (LES), if they can be made to exhibit sufficient performance, such as by having appropriate track width and spacing between tracks. These parameters are discussed elsewhere in this document.

For a metal card (MC), the back (bottom, as viewed) of the metal card body (MCB) should be open (free of metal, non-conductive) to avoid attenuation of the electromagnetic field. In other words, the opening (CO, or MO) should extend completely through the card body. This leaves a void 203 behind (below, as viewed) the transponder chip module (TCM) which may be filled with an epoxy or resin ("filler") 204. The void can be filled with a resin or with an active synthetic material ("filler") which illuminates during an electronic transaction (e.g., whilst being interrogated by an external reader). The void beneath the transponder chip module (TCM) could be a series of perforations, a slit or annulus that permits communication of the transponder chip module with the reader.

A slit (or slot, or gap, or band) (S) 230 may be provided through the metal card body (MCB) so that it can function as a coupling frame (CF) for capacitive coupling with a contactless reader.

A card body (CB) with a coupling frame (CF), or a metal card body (MCB) modified (such as with a slit) to act as a coupling frame (CF) may be provided as an interim product, into which a transponder chip module (TCM) may later be installed.

Some Embodiments of a Coupling Frame (CF)

Investigations Into Designs and Configurations of a Coupling Frame (CF)

A substantial improvement in the activation distance of the Transponder IC Module (with a laser-etched antenna structure (LES)) may be achieved by placing a coupling frame (isolated conductor) around the transponder chip module (TCM), so long as the frame does not fully surround the module.

In an experimental set-up, tungsten plates were disposed around 3 sides of the module, which increased the activation distance from 18 mm to approximately 40 mm. The tungsten plates extended past the card body area. The coupling frame (CF) should be designed to fit within a standard card body area (54 mm×86 mm).

For purposes of this document, "activation distance" and "read/write distance" may be used interchangeably, an increase in one tending to manifest itself in a corresponding increase in the other.

This phenomenon (increased activation distance) has also been shown to work with 35 μm thick electrodeposited copper sheets, aluminum (aluminium), stainless steel, tungsten and ferrite material (magnetic particles) and is likely to work with any metal with a high enough conductivity.

Some investigations of this phenomenon and the effect on the transponder chip module (TCM) were made with a variety of frame designs and configurations positioned around the transponder chip module (TCM), but contained within the standard card body (CB) area.

For testing, a module size similar in dimensions to an 8 contact module, transponder chip module (TCM) with a laser-etched antenna structure (LES) was used, with dimensions of: 12.6 mm×11.4 mm. 35 μm electrodeposited copper was used as the material for the coupling frame (CF). The coupling frame (CF) was disposed closely adjacent to the perimeter of the transponder chip module (TCM). An RFID reader operating at 13.56 MHz was used to measure the activation distance. The "baseline" activation distance for the transponder chip module (TCM) itself was determined to be approximately 18 mm.

Figure 3A:
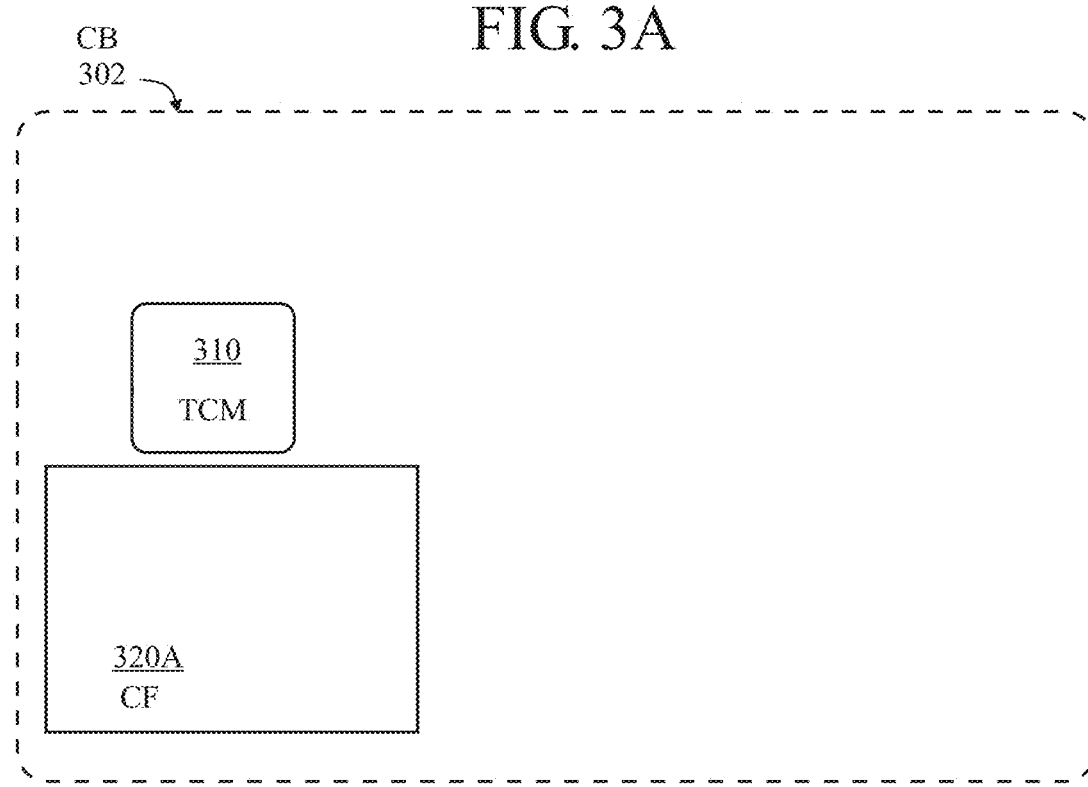
FIG. 3A is a diagram, in plan view, showing a coupling frame (CF) adjacent (partially surrounding) one side (or 90°) of a transponder chip module (TCM).

FIG. 3A shows a coupling frame (CF) 320A disposed on one side of a transponder chip module (TCM) 310 in a card body (CB) 302. Here, the coupling frame (CF) is disposed on only one side (lower, as viewed) of the transponder chip module (TCM), and extends from the lower (as viewed) edge of the transponder chip module (TCM) towards the lower edge of the card body (CB). The coupling frame (CF) also extends towards the left (as viewed) edge of the card body (CB). The coupling frame (CF) is larger (in area) than the transponder chip module (TCM), and may cover about 15% of the overall card area. (The percentages set forth herein are approximate.) An activation distance of 21 mm was achieved.

Figure 3B:
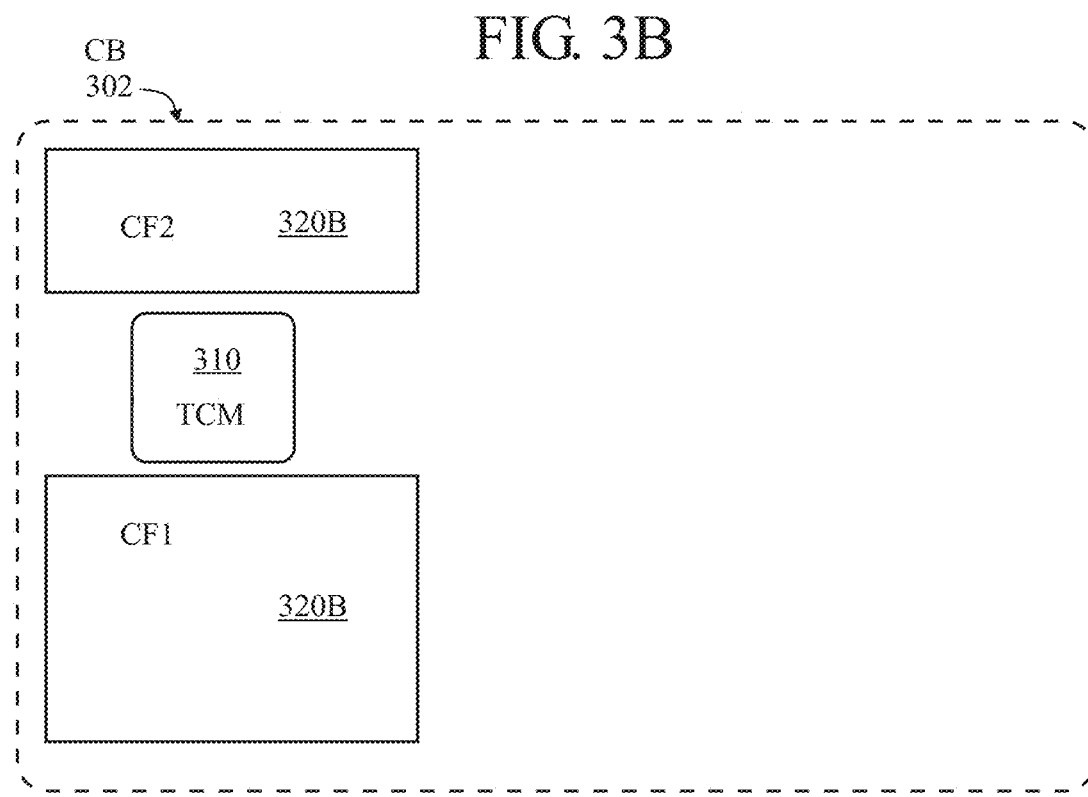
FIG. 3B is a diagram, in plan view, showing a coupling frame (CF) adjacent (partially surrounding) two opposite sides (or 90°+90°) of a transponder chip module (TCM).

FIG. 3B shows a coupling frame (CF) 320B disposed on two (opposite) sides of a transponder chip module (TCM) 310 in a card body (CB) 302. Here, the coupling frame (CF) comprises two separate portions—a first portion (CF1) disposed below the transponder chip module (TCM), similar to the previous embodiment (FIG. 3A), and a second portion (CF2) disposed above the transponder chip module (TCM). In this example, the two portions (CF1, CF2) of the overall coupling frame (CF) are not connected with one another, and surround two opposite sides of the transponder chip module (TCM) and, in aggregate cover about 25% of the overall card area. An activation distance of 25 mm was achieved.

Figure 3C:
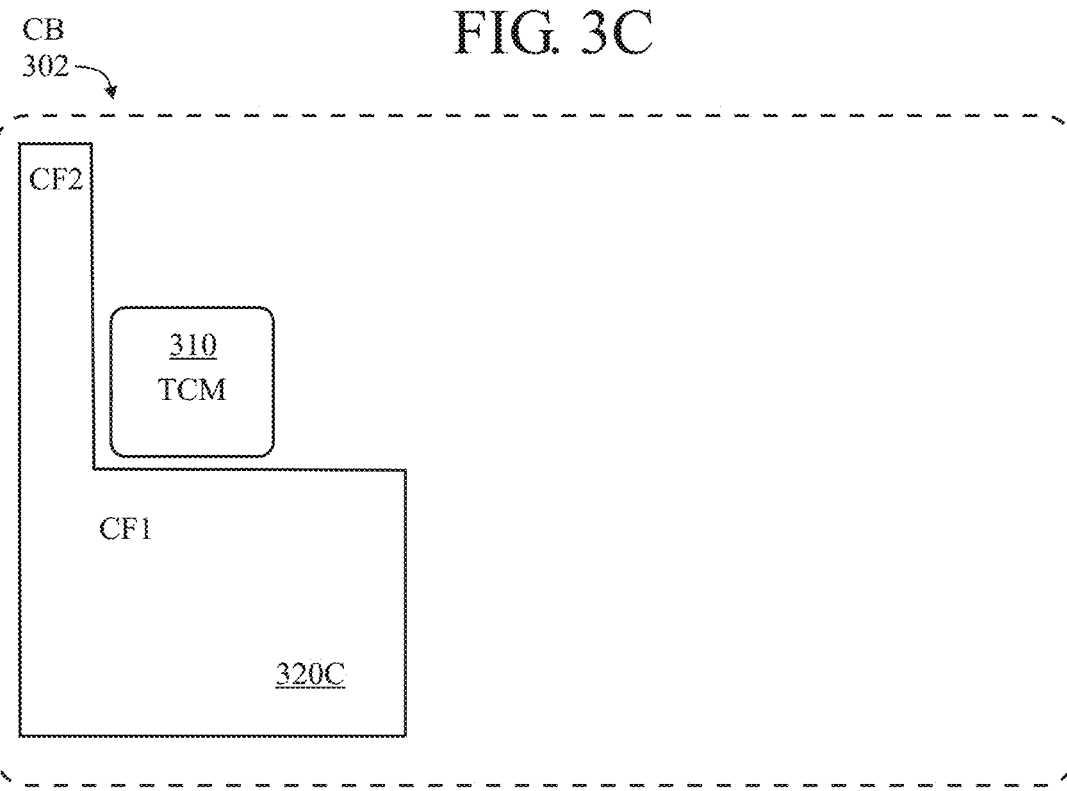
FIG. 3C is a diagram, in plan view, showing a coupling frame (CF) adjacent (partially surrounding) two adjacent sides (or 180°) of a transponder chip module (TCM).

FIG. 3C shows a coupling frame (CF) 320C disposed on two (adjacent) sides of a transponder chip module (TCM) 310 in a card body (CB) 302. Here, the coupling frame (CF) comprises a first portion (CF1) disposed below the transponder chip module (TCM), similar to the previous embodiment (FIG. 3B), and a second portion disposed to the left (as viewed) of the transponder chip module (TCM). The two portions are contiguous with one another, and surround two adjacent sides of the transponder chip module (TCM). An activation distance of 24 mm was achieved.

Note that, in most of the examples set forth here, the transponder chip module (TCM) is rectangular, having four sides. If the transponder chip module (TCM) were circular or elliptical, for example, rather than a coupling frame (CF) being disposed closely adjacent to and surrounding two or three or four "sides" of the transponder chip module (TCM), the coverage of the coupling frame (CF), vis-à-vis the transponder chip module (TCM) may be expressed in degrees, from 0° to 360°—for example, surrounding two sides or 180° of the transponder chip module (TCM), surrounding three sides or approximately 270° of the transponder chip module (TCM), surrounding four sides or approximately 360° of the transponder chip module (TCM).

Figure 3D:
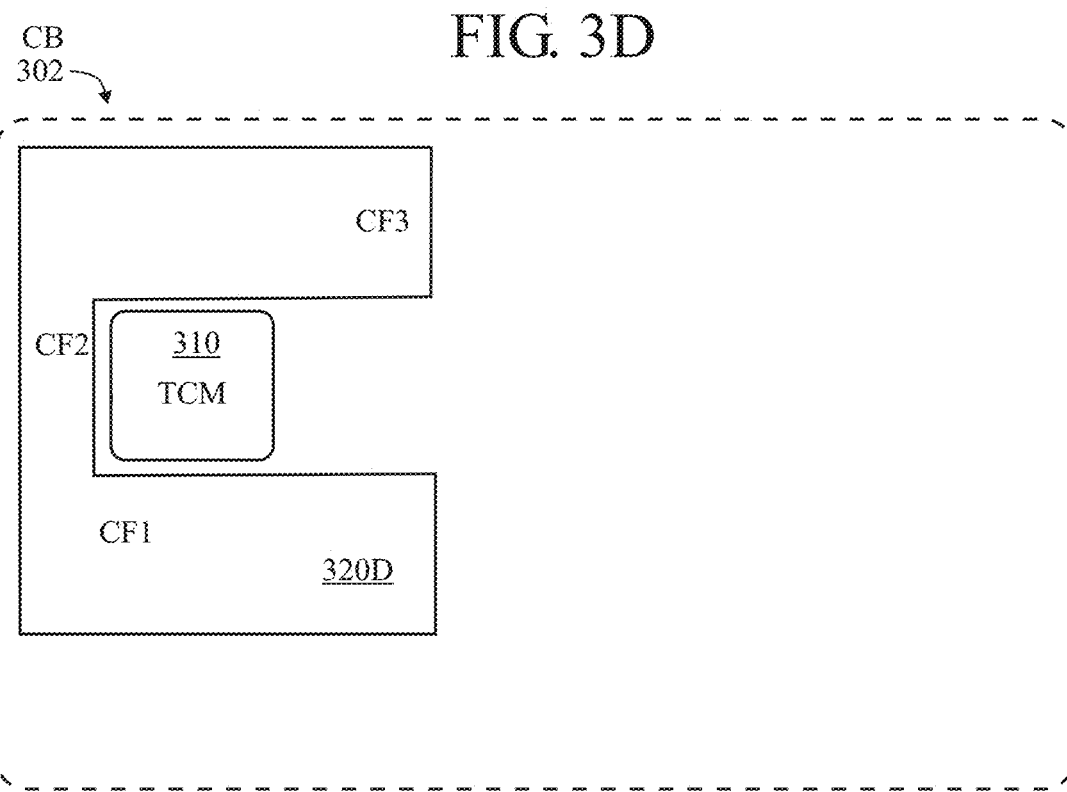
FIGS. 3D, 3E, 3F, 3G, 3H are diagrams, in plan view, showing a coupling frame (CF) adjacent (partially surrounding) three sides (or 270°) of a transponder chip module (TCM).

FIG. 3D shows a coupling frame (CF) 320D disposed on three sides (bottom, top, left) of a transponder chip module (TCM) 310 in a card body (CB) 302. Here, the coupling frame (CF) comprises a first portion (CF1) disposed below the transponder chip module (TCM), a second portion (CF2) disposed to the left (as viewed) of the TCM, and a third portion (CF3) disposed above (as viewed) the transponder chip module (TCM). The three portions (CF1, CF2, CF3) are contiguous with one another, and surround three sides (or 270°) of the transponder chip module (TCM). The third portion (CF3) is shown extending nearly to the top edge of the card body (CB). The second portion (CF2) is shown extending nearly to the left edge of the card body (CB). The first portion (CF1) is shown extending towards, but not nearly to, the bottom edge of the card body (CB). The interior edges of the three portions (CF1, CF2, CF3) are disposed closely adjacent the outer edges of the transponder chip module (TCM), and the antenna structure (AS) or laser-etched antenna structure (LES) in the transponder chip module (TCM). An activation distance of 28 mm was achieved.

Figure 3E:
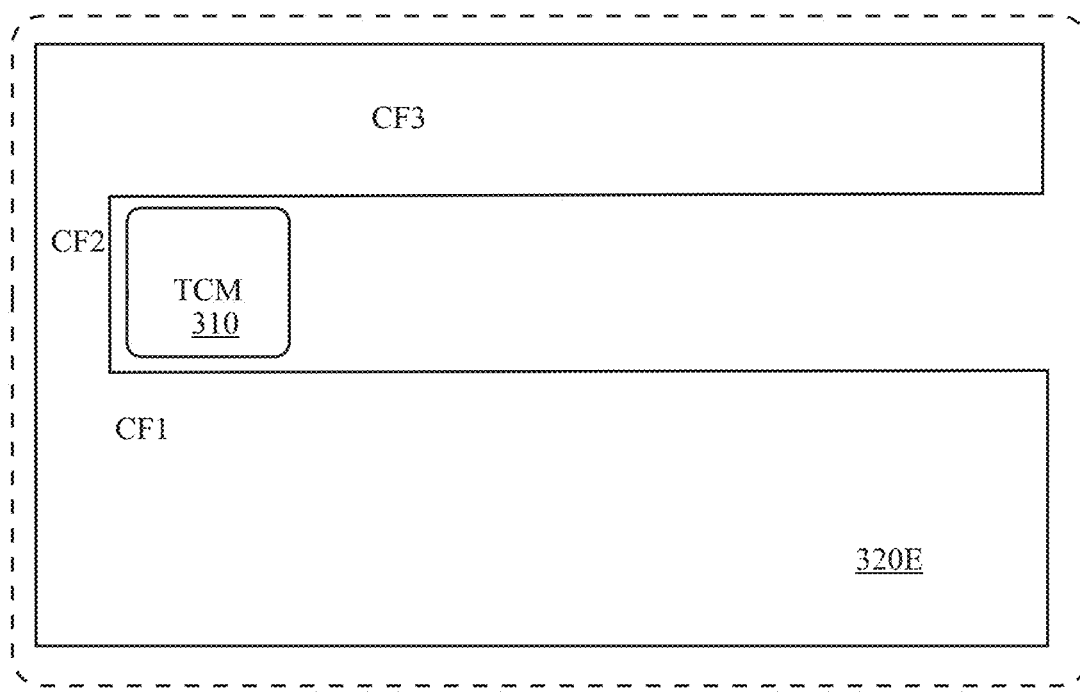

FIG. 3E shows a coupling frame (CF) 320E disposed on three sides (bottom, top, left) of a transponder chip module (TCM) 310 in a card body (CB) 302. Here, the coupling frame comprises a first portion (CF1) disposed below the transponder chip module (TCM), a second portion (CF2) disposed to the left (as viewed) of the transponder chip module (TCM), and a third portion (CF3) disposed above (as viewed) the transponder chip module (TCM). The three portions (CF1, CF2, CF3) are contiguous with one another, and surround three sides (or 270°) of the transponder chip module (TCM). The first and third portions extend substantially to the lower and upper (as viewed) edges of the card body (CB). The second portion (CF2) extends substantially to the left (as viewed) edge of the card body (CB). The first and third portions also extend substantially to the right (as viewed) edge of the card. This coupling frame (CF) surrounds three sides (or 270°) of the transponder chip module (TCM), and may cover a substantial portion (such as more than approximately 80%) of the card. An activation distance of 30 mm was achieved.

Figure 3F:
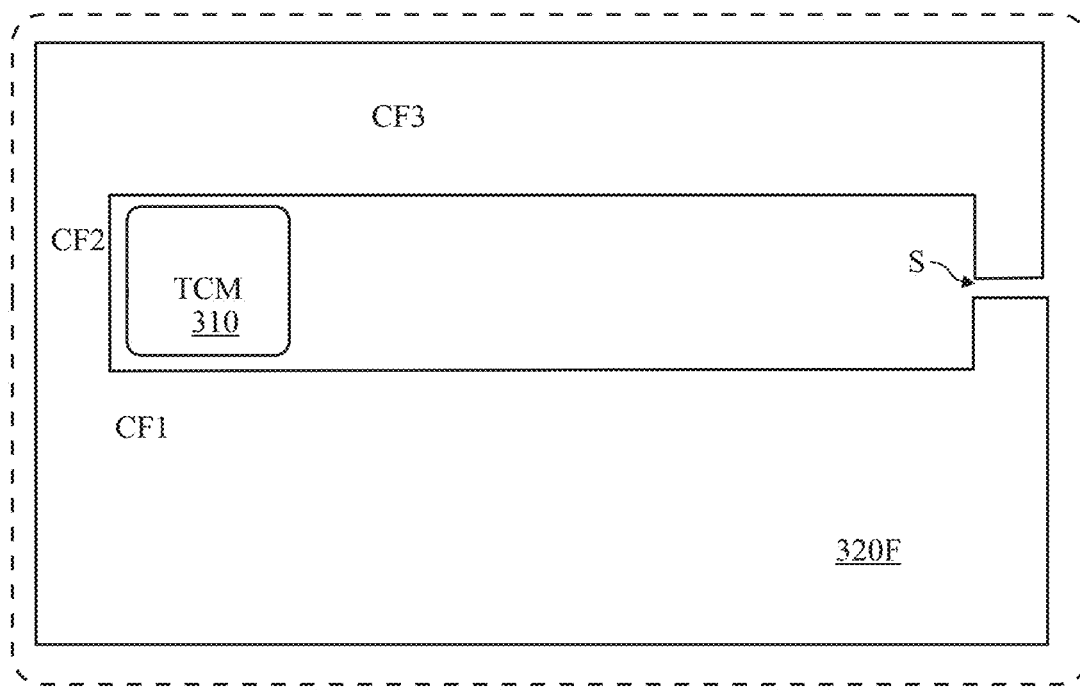

FIG. 3F shows a coupling frame (CF) 320F disposed on three sides (bottom, top, left) of a transponder chip module (TCM) 310 in a card body (CB) 302. Here, the coupling frame (CF) comprises a first portion (CF1) disposed below the transponder chip module (TCM), a second portion (CF2) disposed to the left (as viewed) of the transponder chip module (TCM), and a third portion (CF3) disposed above (as viewed) the transponder chip module (TCM). The three portions are contiguous with one another, and surround three sides (or 270°) of the transponder chip module (TCM). The first and third portions extend substantially to the lower and upper (as viewed) edges of the card. The second portion (CF2) extends substantially to the left (as viewed) edge of the card body (CB). The first and third portions also extend substantially to the right (as viewed) edge of the card body (CB). An end (right, as viewed) of the first portion (CF1) extends upward near the right edge of the card body (CB), and an end (right, as viewed) of the third portion (CF3) extends downward near the right edge of the card body (CB). There is a slit (or slot, or gap; S) between the opposing upward and downward extending of the first portion (CF1) and the third portion (CF3), respectively. This coupling frame (CF) surrounds three sides of the transponder chip module (TCM), and may cover a substantial portion (such as more than approximately 82%) of the card body (CB). An activation distance of 32 mm was achieved.

Figure 3G:
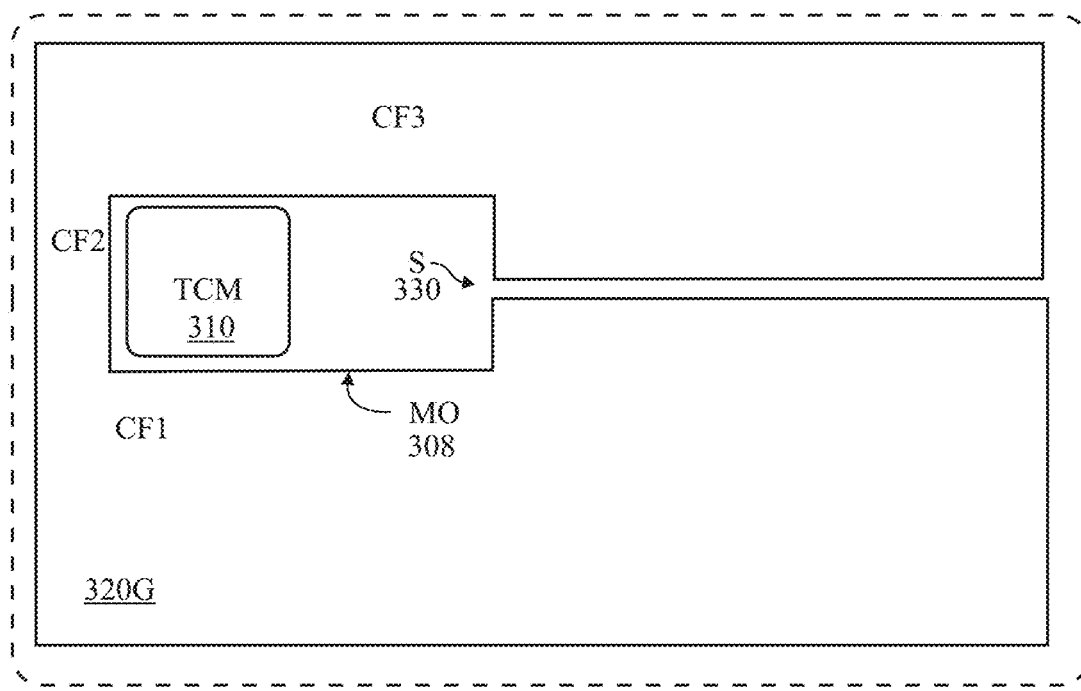

FIG. 3G shows a coupling frame (CF) 320G disposed on three sides (bottom, top, left) of a transponder chip module (TCM) 310 in a card body (CB) 302. Here, the coupling frame (CF) comprises a first portion (CF1) disposed below the transponder chip module (TCM), a second portion (CF2) disposed to the left (as viewed) of the transponder chip module (TCM), and a third portion (CF3) disposed above (as viewed) the transponder chip module (TCM). The three portions (CF1, CF2, CF3) are contiguous with one another, and surround three sides (or 270°) of the transponder chip module (TCM). The first and third portions extend substantially to the lower and upper (as viewed) edges of the card body (CB). The second portion extends substantially to the left (as viewed) edge of the card body (CB). The first and third portions also extend substantially to the right (as viewed) edge of the card. An end portion (right, as viewed) of the first portion (CF1) extends upward from near the right edge of the card body (CB) to about halfway across the card body (CB), and an end portion (right, as viewed) of the third portion (CF3) extends downward from near the right edge of the card body (CB) to about halfway across the card body (CB). These upward and downward extending portions extend from the right edge of the card body (CB) approximately halfway across the card body (CB) to the transponder chip module (TCM). There is a slit (or slot, or gap; S) 330 between the opposing end portions of the first portion (CF1) and the third portion (CF3). The coupling frame (CF) has an opening (MO) 308 for receiving the transponder chip module (TCM), surrounds three sides (or 270°) of the transponder chip module (TCM), and may cover a substantial portion (such as more than approximately 85%) of the card body (CB). An activation distance of 34 mm was achieved.

Figure 3H:
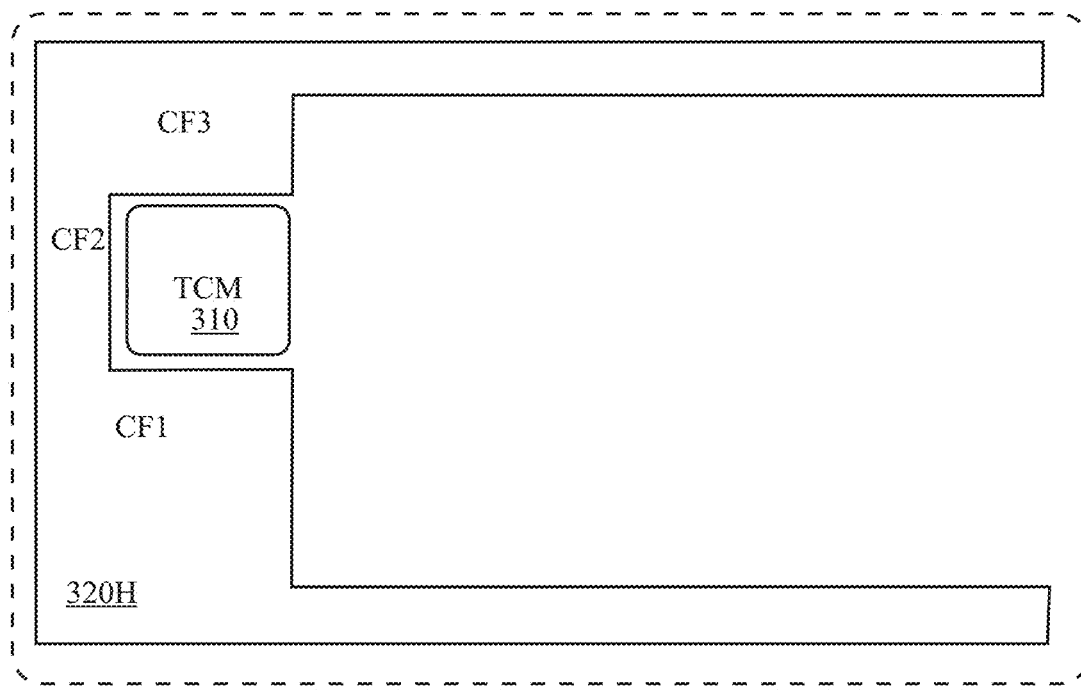

FIG. 3H shows a coupling frame (CF) 320H disposed on three sides (bottom, top, left) of a transponder chip module (TCM) 310 in a card body (CB) 302. Here, the coupling frame (CF) comprises a first portion (CF1) disposed below the transponder chip module (TCM), a second portion (CF2) disposed to the left (as viewed) of the transponder chip module (TCM), and a third portion (CF3) disposed above (as viewed) the transponder chip module (TCM). The three portions (CF1, CF2, CF3) are contiguous with one another, and surround three sides (or 270°) of the transponder chip module (TCM). The first and third portions extend substantially to the lower and upper (as viewed) edges of the card body (CB). The second portion extends substantially to the left (as viewed) edge of the card body (CB). The first and third portions also extend to the right (as viewed) edge of the card body (CB), but this extension of the first and third portions is narrower than that shown in FIG. 3G. This coupling frame (CF) surrounds three sides (or 270°) of the transponder chip module (TCM), and may cover a portion (such as approximately 30%) of the card body (CB). An activation distance of 28 mm was achieved.

Some experiments were conducted, using a version of the coupling frame (CF) adjacent three sides (or 270°) of the transponder chip module (TCM), such as in FIG. 3D, and varying the separation between the inside edge(s) of the coupling frame (CF) and the outer edge(s) of the transponder chip module (TCM). Results indicated that decreasing the separation resulted in increased activation distance.

It bears mention that the actual spacing (or separation, or gap) of interest may be the distance between the inside edge of the coupling frame (CF) and the outer track of the laser-etched antenna structure (LES) of the transponder chip module (TCM) which extends nearly to the outer edge(s) of the overall transponder chip module (TCM). In some configurations (which were not tested), the gap may be reduced almost to zero and, with a stepped recess in the card body (CB), the coupling frame (CF) may actually slightly overlap outer tracks of the laser-etched antenna structure (LES) separated by an adhesive layer (approximately 30 µm) which acts as a dielectric medium. See FIG. 2C.

Some experiments were conducted, using different thickness (35 µm, 12 µm) coupling frames (CF), and there was no noticeable difference in activation distance.

Some experiments were conducted, using a tungsten plate for the coupling frame (CF), surrounding two adjacent sides of the transponder chip module (TCM). Results were favourable.

Some Conclusions and Comments

Best results may occur when the coupling frame (CF) is disposed around at least three sides of the transponder chip module (TCM).

Surface area of coupling frame (CF) may have an impact on performance, with larger area resulting in increased activation distance.

Extending the coupling frame (CF) entirely (rather than partially) across the width of the card body (CB), without openings in the metal layer (ML) forming the coupling frame (CF), may significantly improve (increase) activation distance, which may indicate that an enlarged metallic area around the transponder chip module (TCM) provided by the coupling frame (CF) improves the capacitive coupling with the reader.

Separation of (or, gap between) the coupling frame (CF) from (and) the transponder chip module (TCM) may have a significant impact, with reduced separation (smaller gap) resulting in increased activation distance.

The thickness of the coupling frame (CF) does not appear to have any impact on the coupling frame's performance.

Conductive materials other than copper may be used as a material for the conducting frame (CF).

The activation distance of an 8-contact (8 contact pads) transponder chip module (TCM) used in trials was 18 mm without the coupling frame (CF). With the coupling frame (CF), the activation distance was increased by approximately 10 mm, or more than 50%, to approximately 28 mm.

The coupling frame (CF) may extend into the embossing area (lower half) of the card body (CB), and when sized back to avoid the embossing area, there may be a negatively effect on the performance of the coupling frame (CF). However this may be overcome by reshaping the coupling frame (CF), or rotating it, so that the coupling frame (CF) no longer encroaches upon the embossing area.

When the transponder chip module (TCM) is surrounded (partially, or nearly completely) by the coupling frame (CF), an improvement (increase) may be observed in the activation distance, compared to when no coupling frame (CF) is present. Based on this observation, it may be possible to improve the performance of a metal (such as stainless steel) card body design (which may have a layer of stainless steel covering nearly an entire layer of the card body), by making a slit or a gap in the steel card body to break the continuous "loop" of metal around the transponder chip module (TCM). This is shown, for example, FIGS. 5B and 6A.

With a coupling frame (CF) in the card body (CB), surrounding the transponder chip module (TCM), and with the laser-etched antenna structure (LES) disposed substantially coplanar with the coupling frame (CF), read/write distances of at least 2 cm (including at least 3 cm, potentially including at least 4 cm) may be achieved, without requiring a booster antenna (BA) in the card body (CB).

Coupling frames (CFs) can be made from foil metals, thickness from 9-100 µm or from bulk metal with thickness up to the total normal thickness of a smartcard (760 µm). The metal can be any metal or alloy, for example copper, aluminum, brass, steel, tungsten, titanium. The metal foil may be of any origin, e.g. electrodeposited or roll annealed.

The coupling frames (CF) may be made by electroless deposition on a substrate followed by electroplating.

The coupling frame (CF) can be formed from a metal insert or slug placed in the card body (CB) to increase weight of the card. The metal insert may acts as a coupling frame when used with an appropriate laser etched antenna structure (LES).

The coupling frame (CF) can be formed from a conductive material deposited on a substrate. For example, conductive carbon paste silk screen printed onto paper or silver particulate ink silk screen printed onto PET (with subsequent annealing to allow formation of a conductive film). Alternatively, the coupling frame (CF) can be formed from vapor deposited or sputter coated metals (e.g. aluminum) on plastic coated substrates.

The coupling frame (CF) may be formed from a loop of wire. The loop of wire may be embedded in a plastic substrate.

The coupling frame may overlap part of the laser etched antenna structure (LES) and may be brought into close proximity with the LES in order to increase the electromagnetic coupling between these components and hence increase the performance of the smartcard. (Overlap of the coupling frame CF over the antenna of the transponder chip module (TCM) may result from or may require that there is a stepped recess in the card body CB) for receiving the transponder chip module TCM).

The laser-etched antenna structure (LES) on the transponder chip module may be co-planar with the coupling fame (CF), with a gap therebetween of 50-300 µm. However, the laser-etched antenna structure (LES) could also be overlapping the coupling frame in a stepped recess. If the coupling frame (CF) is overlapping the laser-etched antenna structure (LES), the distance (vertical offset) between the tracks of the laser-etched antenna structure (LES) tracks and the coupling frame (CF) should have a minimum distance of approximately 30 µm, with a dielectric material therebetween such as adhesive tape (Tesa) or resin holding or fixing the antenna module (AM) or transponder chip module (TCM) in place.

The coupling frame (CF) (or metal layer ML) may host (be provided with, may comprise) an engraving, embossing, or stamped feature/logo/ID which serves as a security feature for the smartcard. This feature may or may not be visible on the card surface after lamination of the card stack-up. This feature may be visible on X-ray, CT or other scanning equipment such as that used at security screening points (e.g. in airports). This feature may permit identification of the card and be used to validate the authenticity of a given card. Features on the transponder chip module (TCM) or coupling frame (CF) may authenticate the components against pirate imitations.

Some Additional Embodiments of Coupling Frames (CF)

Figure 4A:
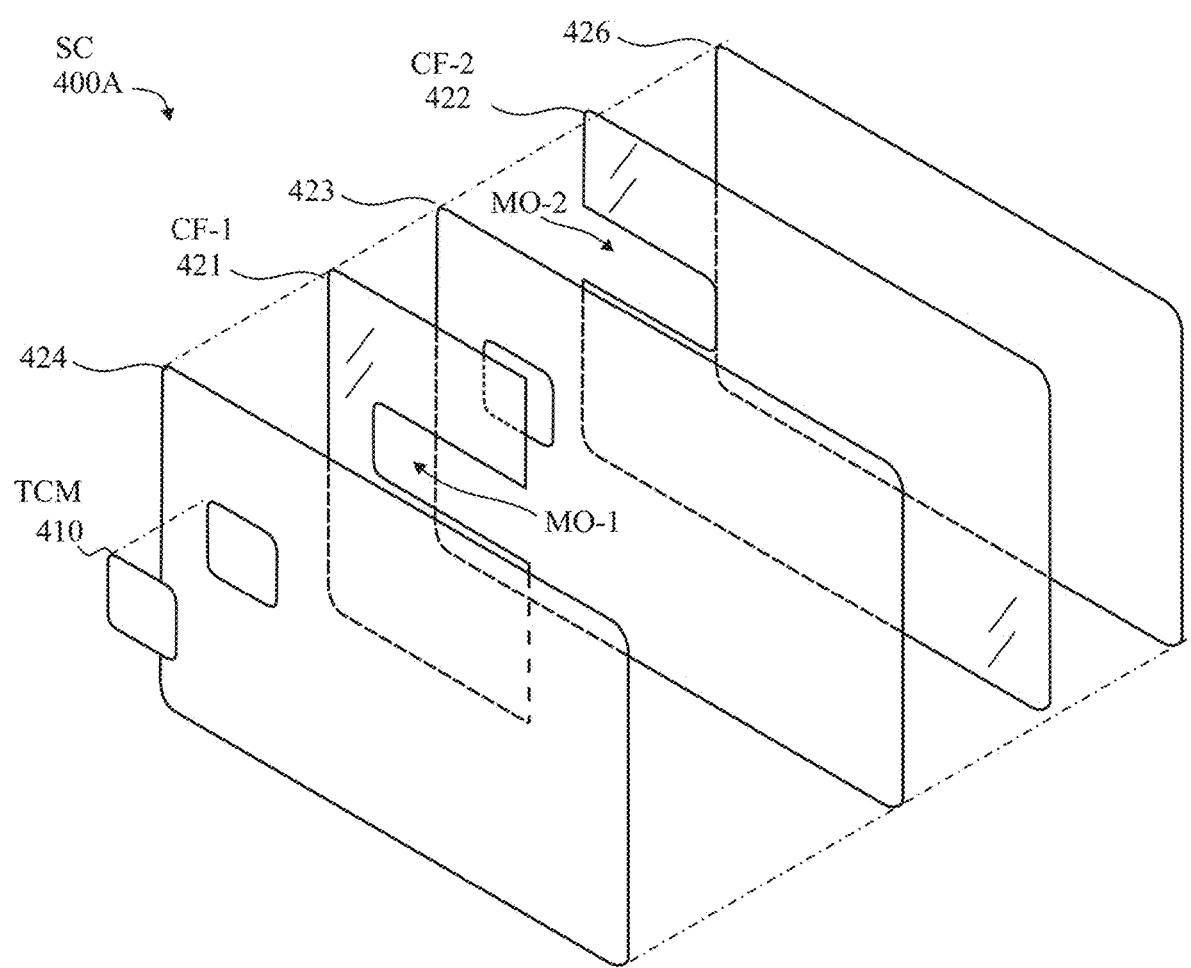
FIG. 4A is an exploded view of a smartcard (SC) having two coupling frames (CF) on two different layers.

FIG. 4A illustrates an embodiment of a smartcard 400A having a multiple coupling frame stack-up. Here, there are two coupling frames (CF-1, CF-2) 421, 422 in different layers of the card body (CB), separated by a layer 423 of non-conductive material (such as PVC). The stack-up comprises a front face card layer 424, a first coupling frame (CF-1) 421, an internal card dielectric layer 423, a second coupling frame (CF-2) 422 and a rear face card layer 426. The first coupling frame (CF-1) surrounds the top, left and bottom edges of the transponder chip module (TCM) 410, and extends to the top, left and bottom edges of the card body (CB), and has a module opening (MO-1). The second coupling frame (CF-2) surrounds the top, right and bottom edges transponder chip module (TCM), and extends to the top, right and bottom edges of the card, and has a module opening (MO-2). In aggregate, the first and second coupling frames (which may be referred to as "420") cover nearly the entire surface of the card body 402 (less the area of the transponder chip module TCM). An activation distance of 40 mm was achieved.

The coupling frames 421, 422 illustrated in FIG. 4A may be exemplary of any of the coupling frames disclosed herein. Or, stated otherwise, may be "replaced" by some of the other coupling frames disclosed herein, including selected features thereof.

Although illustrated with "extended" module openings forming what may be considered to be very wide "slits", each of the coupling frames 421, 422 may be formed with a narrow slit (S) smaller than the module opening (MO), such as shown and described with respect to FIGS. 2D, 4B, 4C, 4I, 5B, 6A, 8, 9, 10. Refer also to FIGS. 3F,G. Compare FIG. 5A which shows a slit (S, 530) which is as wide as the module opening (MO, 508).

The coupling frames 421, 422 may be formed to overlap at least a portion of the module antenna (MA, LES), such as shown and described with respect to FIG. 2C. Compare FIG. 11F (CF overlaps PA in a TCM). It may be desirable that the slit of the coupling frame overlaps the module antenna.

In response to an exciting RF field (such as from an external reader), eddy currents may be concentrated at edges of the metal layer forming the coupling frame, particularly adjacent to the slit, and this may enhance coupling between the coupling frame and the module antenna.

Although coupling frame 421 is illustrated as extending only partially across the width of the card, the coupling frame 422 is illustrated extending fully across the width of the card. The coupling frame 421 may also extend fully across the width of the card.

As shown in FIG. 4A, the slit (opening) of the coupling frame 421 extends from the module opening towards the right edge (as viewed) of the card, and the slit (opening) of the coupling frame 422 extends from the module opening to the left edge (as viewed) of the card. This illustrates that the slits of the two coupling frames may be arranged in different directions (or orientations) than one another (extending in different directions from their respective module openings), so that the slit of one coupling frame may be supported by an area without a slit of the other coupling frame.

As mentioned elsewhere, the slit (S) may compromise the mechanical integrity of the coupling frame (CF), making it less resistant to twisting. And, if a very small slit (S) is used, it is important to keep the ends of the coupling frame (CF) from touching one another. Incorporating a reinforcing structure (RS, 832) is described with reference to FIG. 8. Arranging (or orienting) the slits of multiple, stacked coupling frames differently than one another may provide similar reinforcement, without the need for an additional reinforcing structure.

As mentioned above, the coupling frame may be disposed closely adjacent to the transponder chip module when the transponder chip module is disposed in the opening. A portion of the coupling frame (CF) may overlap a portion of an antenna structure (AS) in the transponder chip module (TCM). The coupling frames may each extend over substantially the entire area of the smartcard.

Figure 4B:
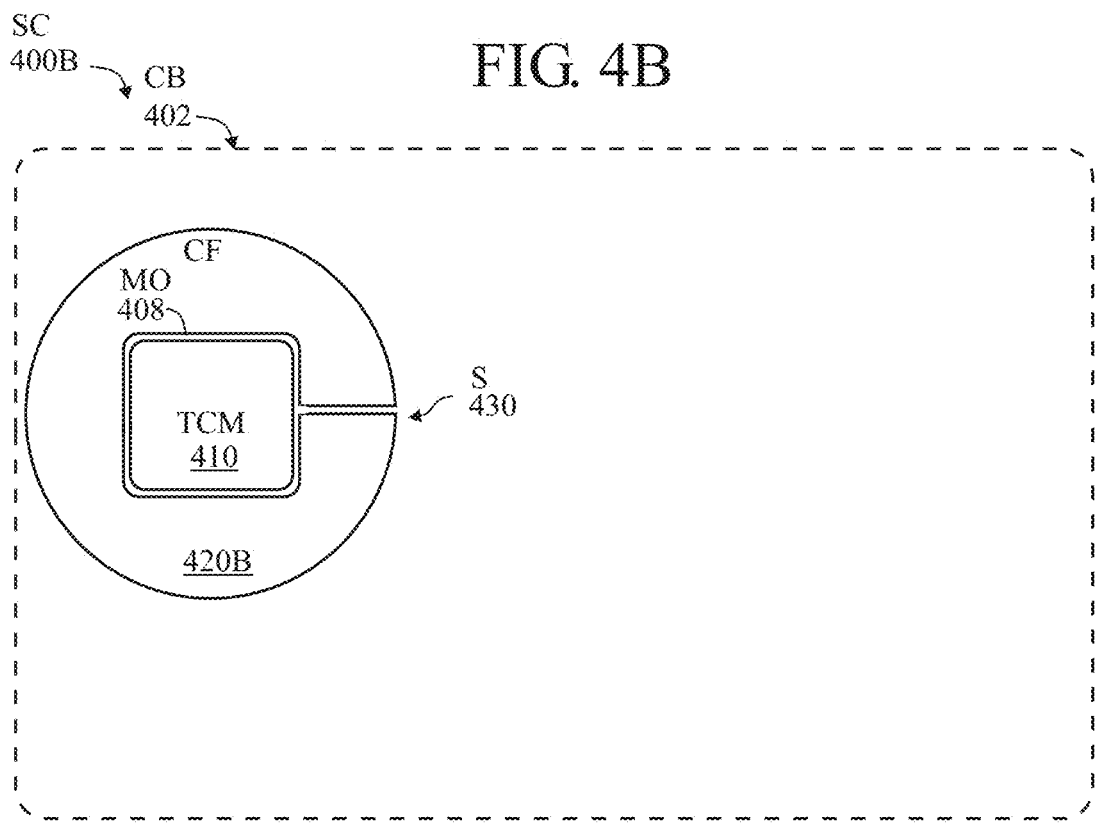
FIGS. 4B, 4C are diagrams in plan view, showing a coupling frame (CF) closely adjacent, and substantially surrounding four sides (or nearly 360°) of a transponder chip module (TCM).

FIG. 4B illustrates an embodiment of a smartcard 400B having a coupling frame (CF) 420B in the form of a ring having a circular outer periphery and a rectangular module opening (MO) in the metal layer (ML) of the coupling frame (CF) whereat the transponder chip module (TCM) 410 may be disposed. Here, the coupling frame (CF) nearly completely surrounds the transponder chip module (TCM), except for a slit (S) 430. The slit (S) is shown on the right side of the transponder chip module (TCM), but could extend from any side thereof (more accurately, from any position in the module opening (MO 408). The slit (S), or gap between the opposed ends of the coupling frame (CF), is important so that the coupling frame (CF) is not a closed loop, but rather is an open loop. The slit (S) extends from the module opening (MO) to the periphery (outer edge) of the coupling frame (CF), and may be very narrow (small width). The coupling frame (CF) in this example is a few times larger than the transponder chip module (TCM), and may cover approximately 15% of the card body (CB) 402. An activation distance of 33 mm was achieved.

The slit (S) may be much smaller than the module opening (MO). The module opening (MO) is approximately 10×10 mm, depending on the size of the transponder chip module (TCM). The 50 µm size (width) for the slit (S) is approximate, and exemplary. A 50 µm wide slit (S) would be approximately 0.5% of the size of the module opening (MO). The slit may be less than 50% of the size of the module opening (MO), including less than 25%, less than 10%, less than 5% and less than 1% of the size of the module opening (MO). The slit (S) may be filled with a non-conductive material. If the width of the slit (S) is equal to the size of the transponder chip module (TCM), the coupling frame (CF) would be adjacent three sides of the transponder chip module (TCM), as in FIG. 3D, for example. The slit (S) may be formed by laser etching, which is suitable for forming a very narrow (e.g., 50 µm) slit in some materials. Other materials are not amenable to laser etching, and may require conventional mechanical processes to form a wider slit, or slot.

The slit (S) may extend in any direction, from anywhere on the module opening (MO) to the periphery of the metal layer (ML) of the coupling frame (CF), so that the coupling frame (CF) is an open loop, having two ends (or end portions). And, the slit (S) may extend only partially through the metal layer (ML) of the coupling frame (CF), leaving only a very thin layer of metal which is transparent to electromagnetic waves below the slit.

Figure 4C:
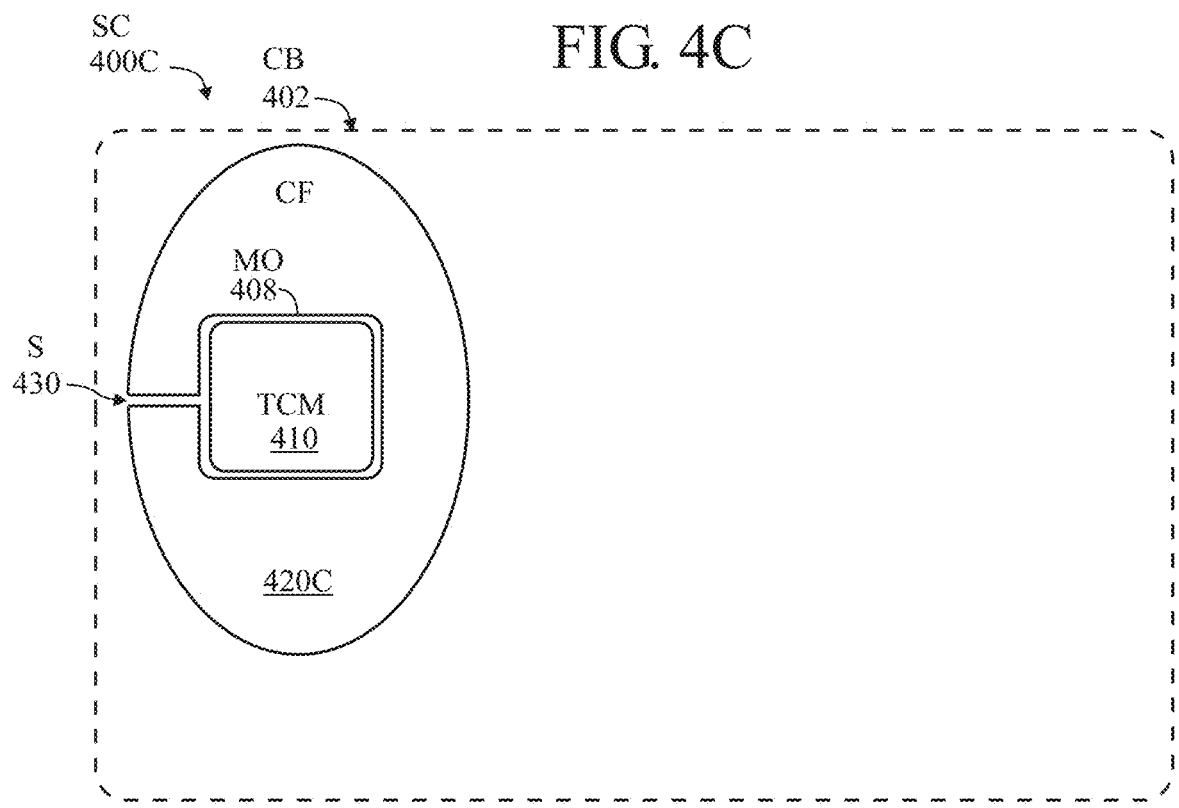

FIG. 4C illustrates an embodiment of a smartcard 400C having a coupling frame (CF) 420C in the form of a ring having an elliptical outer periphery and a rectangular module opening (MO) whereat the transponder chip module (TCM) 410 may be disposed. Here, the coupling frame (CF) nearly completely surrounds the transponder chip module (TCM), except for a slit (S) 430. The slit (S) is shown on the left side of the transponder chip module (TCM), but could extend from any side thereof (more accurately, from any position in the module opening (MO 408). The slit (S) extends from the module opening (MO) to the outer periphery of the coupling frame (CF), and may be very narrow (small width). The coupling frame (CF) in this example is a few times larger than the transponder chip module (TCM), and may cover approximately 20% of the card body (CB) 402. An activation distance of 35 mm was achieved.

Figure 4D:
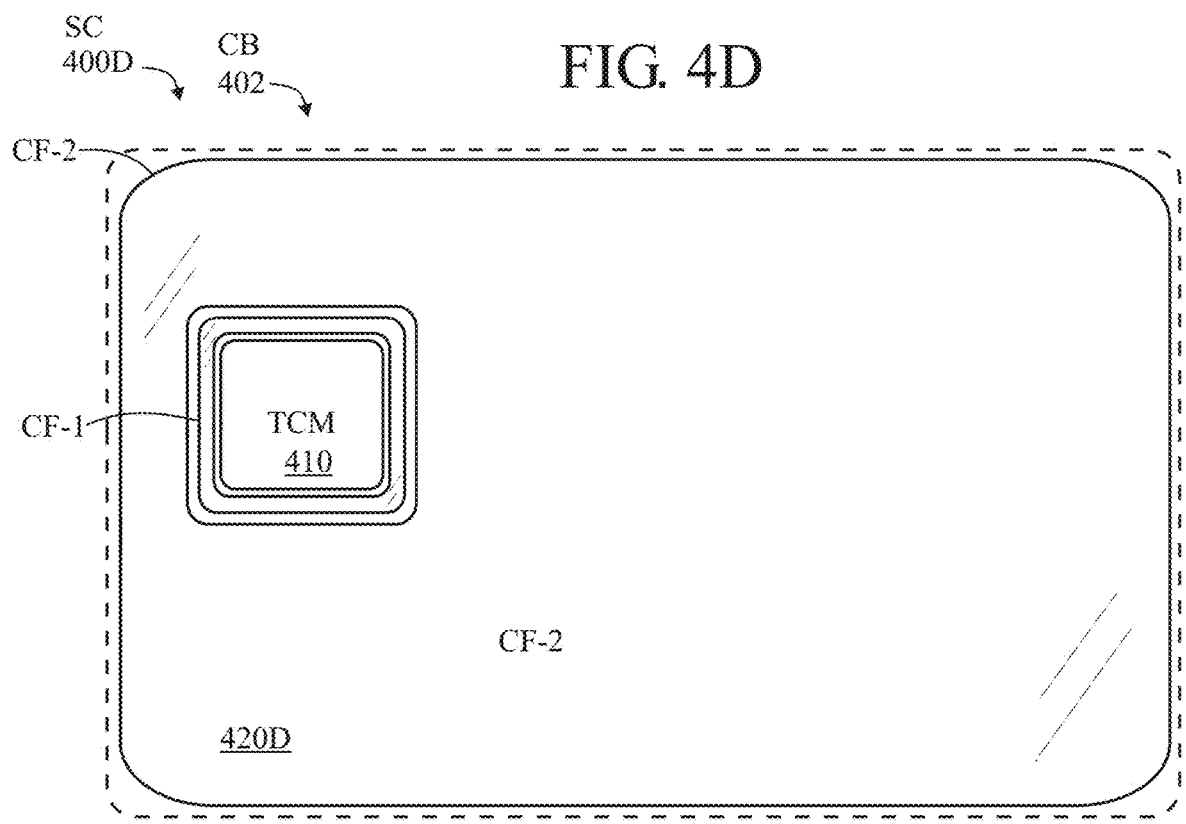
FIG. 4D is a diagram of a smartcard (SC) having an inner coupling frame (CF-1) and an outer coupling frame (CF-2) surrounding a transponder chip module (TCM). Neither coupling frame has a slit.

FIG. 4D illustrates an embodiment of a smartcard 400D having a coupling frame (CF) 420D comprising a first, inner ring-shaped coupling frame (CF-1) disposed around and completely surrounding the transponder chip module (TCM) 410 and an outer coupling frame (CF-2) disposed around and spaced outward from the inner coupling frame (CF-1) and extending substantially to the periphery of the card body (CB) 402. In this embodiment, both of the coupling frames (CF-1, CF-2) are closed loops. This figure shows a first closed loop (no slit) coupling frame disposed around the transponder chip module (TCM), and a second closed loop (no slit) coupling frame (CF-2) disposed substantially concentrically around the first coupling frame (CF-1). The first coupling frame (CF-1) is only slightly larger than the transponder chip module (TCM). The second coupling frame (CF-2) may extend to the top, bottom, left and right edges of the card, covering nearly 100% of the card area (less the module opening MO and the first coupling frame CF-1). This configuration, wherein the coupling frame(s) (CF-1, CF-2) are closed loop (no slits), may not improved activation distance and, in fact, may impair it.

Figure 4E:
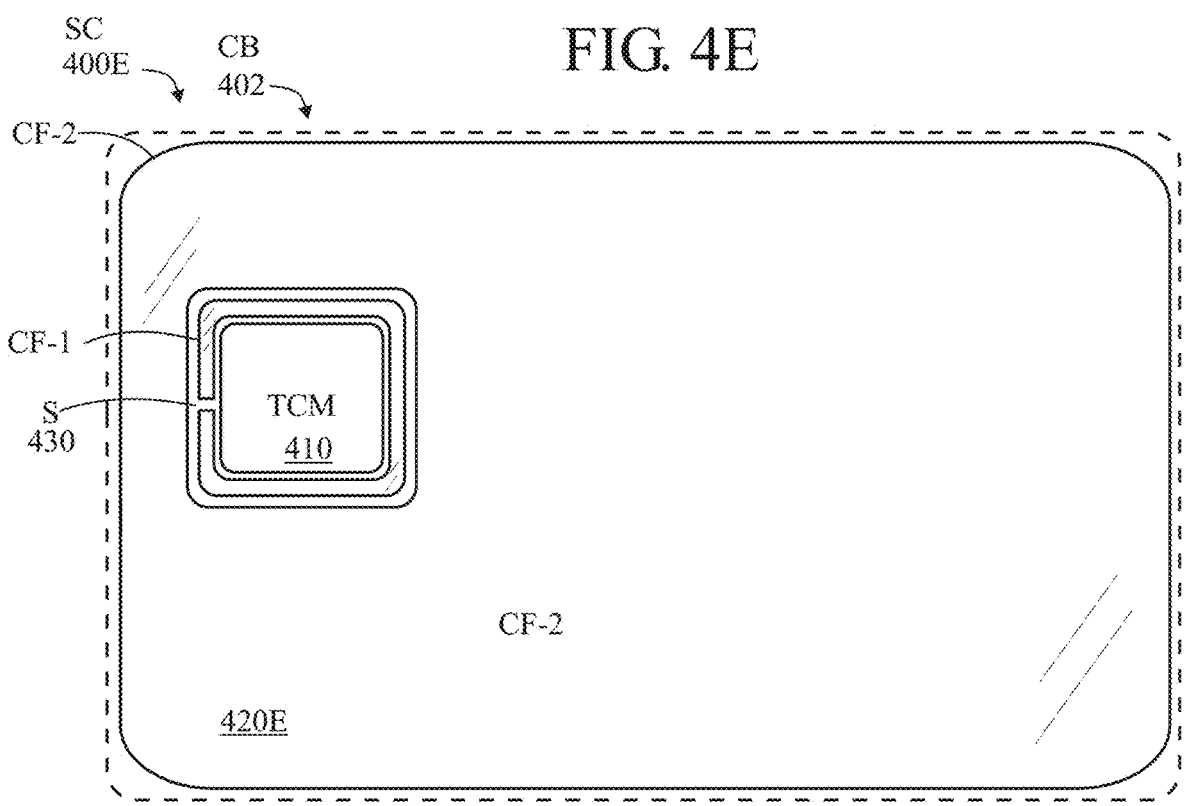
FIG. 4E is a diagram of a smartcard (SC) having an inner coupling frame (CF-1) and an outer coupling frame (CF-2) surrounding a transponder chip module (TCM). The inner coupling frame (CF-1) has a slit (S). The outer coupling frame (CF-2) does not have a slit.

FIG. 4E illustrates an embodiment of a smartcard 400E having a coupling frame (CF) 420E comprising an inner ring-shaped coupling frame (CF-1) disposed around and completely surrounding the transponder chip module (TCM) 410 and an outer coupling frame (CF-2) disposed around and spaced outward from the inner coupling frame (CF-1) and extending substantially to the periphery of the card body (CB) 402. This figure shows a first open loop (with a slit S, 430) coupling frame (CF-1) disposed around the transponder chip module (TCM), and a second closed loop (no slit) coupling frame (CF-2) disposed substantially concentrically around the first coupling frame (CF-1). The first coupling frame (CF-1) is only slightly larger than the transponder chip module (TCM). The second coupling frame (CF-2) may extend to the top, bottom, left and right edges of the card, covering nearly 100% of the card area (less the module opening MO and the first coupling frame CF-1). This configuration, wherein the first coupling frame (CF-1) is open loop (has a slit (S)), and the second coupling frame (CF-2) is closed loop (no slit), may not significantly improve activation distance.

Figure 4F:
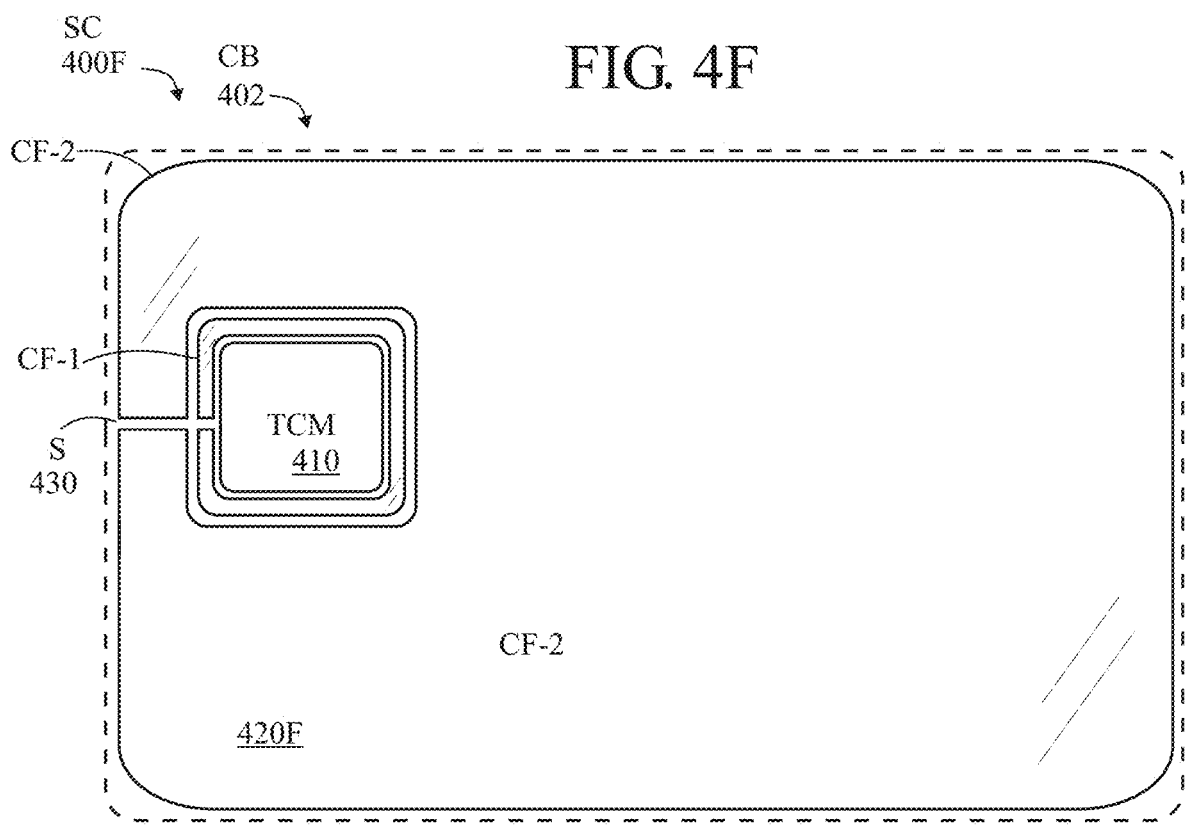
FIG. 4F is a diagram of a smartcard (SC) having an inner coupling frame (CF-1) and an outer coupling frame (CF-2) surrounding a transponder chip module (TCM). Both coupling frames (CF-1, CF-2) have slits (S).

FIG. 4F illustrates an embodiment of a smartcard 400F having a coupling frame (CF) 420F comprising an inner ring-shaped (CF-1) disposed around and completely surrounding the transponder chip module (TCM) 410 and having a slit (S) 430, and an outer coupling frame (CF-2) disposed around and spaced outward from the inner coupling frame (CF-1) and also have a slit and extending substantially to the periphery of the card body (CB) 402. In this embodiment, both of the coupling frames (CF-1, CF-2) are open loops. This figure shows a first open loop (with a slit) coupling frame (CF-1) disposed around the transponder chip module (TCM), and a second open loop (with a slit) coupling frame (CF-2) disposed substantially concentrically around the first coupling frame (CF-1). The first coupling frame (CF-1) is only slightly larger than the transponder chip module (TCM). The second coupling frame (CF-2) may extend to the top, bottom, left and right edges of the card body (CB). The slits (S) in the first and second coupling frames are shown as both being disposed to the left of the transponder chip module (TCM). An activation distance of 36 mm was achieved.

Figure 4G:
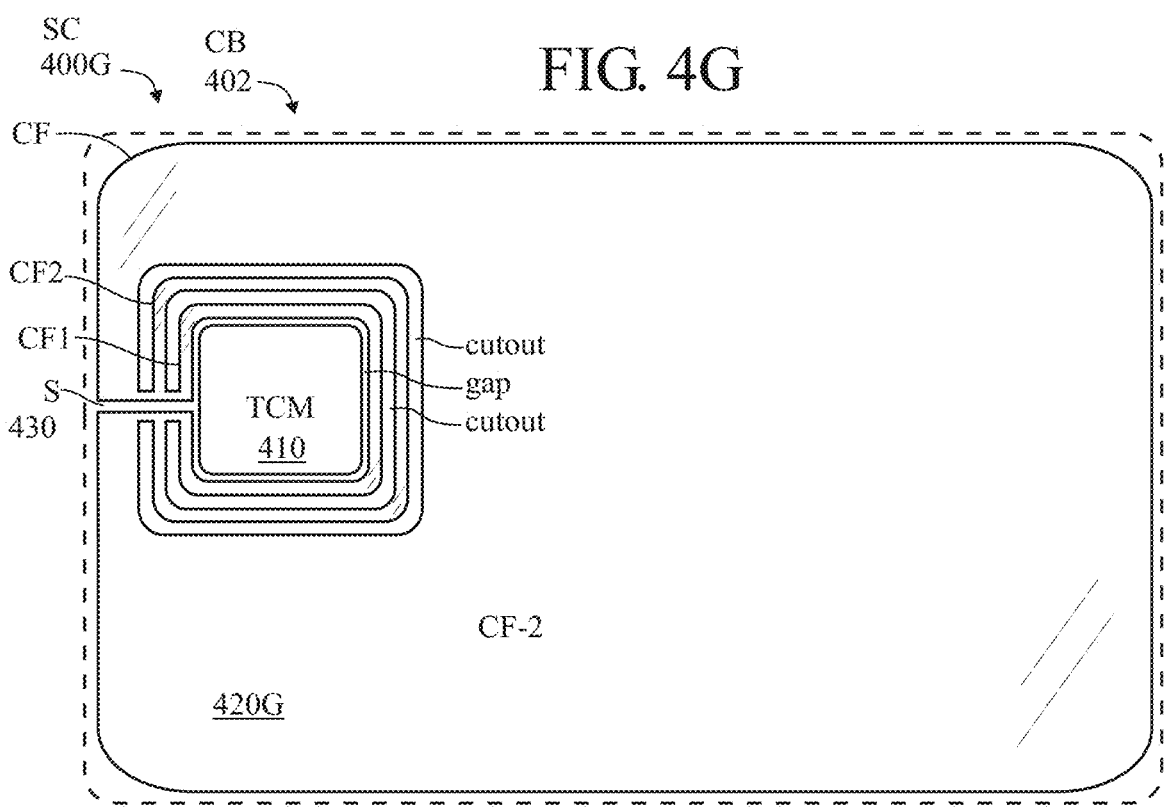
FIG. 4G is a diagram of a smartcard (SC) having a coupling frame (CF) and a number of cutouts establishing different portions (CF1, CF2) of the coupling frame (CF).

FIG. 4G illustrates embodiment of a smartcard 400G having multiple linked open loop coupling frames, with full card size outer frame, in a card body (CB) 402. Alternatively, the overall coupling frame (CF) 420G may be characterized as having a number of ring cutouts in it, concentrically, at increasing distances from the transponder chip module (TCM) 410. A first portion (CF1) of the coupling frame (CF) is disposed nearly fully around the transponder chip module (TCM), separated therefrom by a gap ("gap"). A second portion (CF2) of the coupling frame (CF) is disposed around the first portion (CF1) of the coupling frame (CF), separated therefrom by a ring-shaped cutout ("cutout") nearly fully encircling the transponder chip module (TCM). A second portion (CF2) of the coupling frame (CF) is disposed nearly fully around the first portion (CF1) of the coupling frame (CF), separated therefrom by a ring-shaped cutout ("cutout"). The first coupling frame (CF1) is only slightly larger than the transponder chip module (TCM). The slits (S) 430 in the first and second portions (CF1, CF2) of the coupling frame (CF) are shown as all being disposed to the left of the transponder chip module (TCM). In this example, the ends of the coupling frame portions (CF1, CF2) are connected with one another. (It may be noted that, without the cutouts, thereby being one large coupling frame with a slit, this configuration would resemble the embodiment shown in FIG. 5G.) An activation distance of 38 mm was achieved.

Figure 4H:
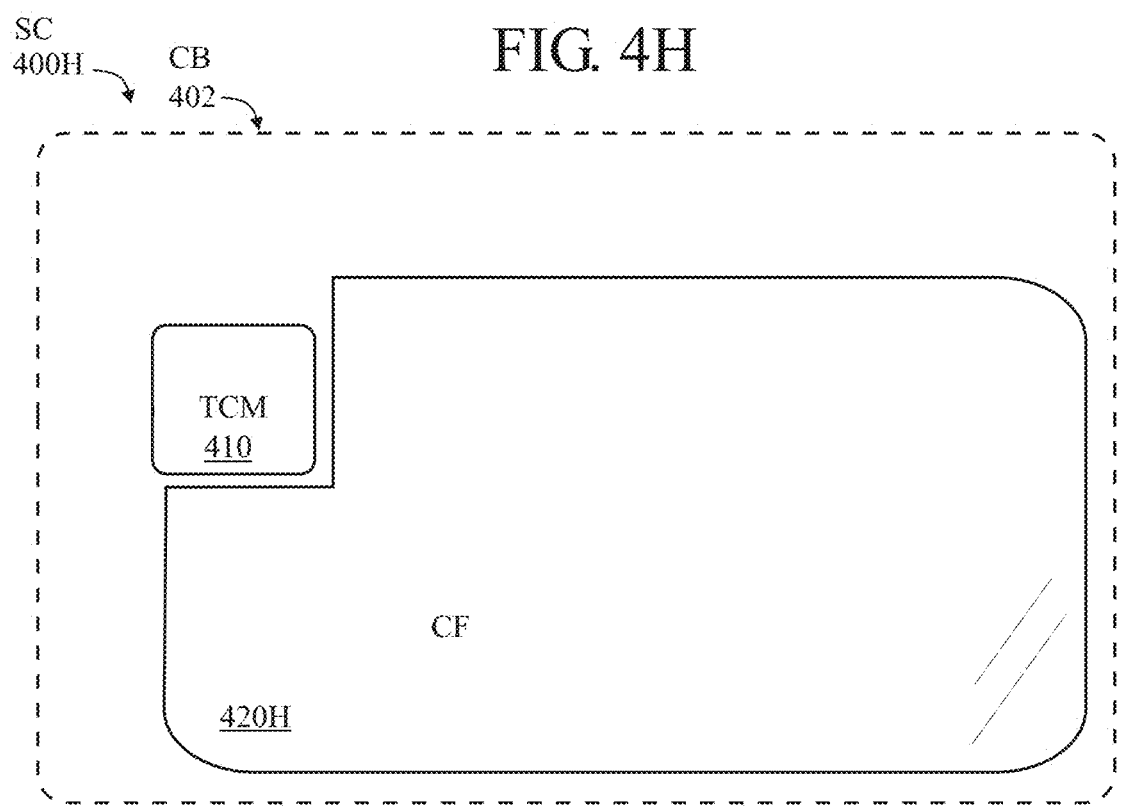
FIG. 4H is a diagram of a smartcard (SC) having a coupling frame (CF) extending from two sides of a transponder chip module (TCM).

FIG. 4H shows an embodiment of smartcard 400H having a coupling frame (CF) 420H made of tungsten or other high density metal or metal alloy, and surrounding only two adjacent sides (or 180°) of a transponder chip module (TCM) 410. Here, the coupling frame (CF) extends from the right (as viewed) edge of the transponder chip module TCM) to the right (as viewed) edge of the card body (CB) 402, and from the bottom (as viewed) edge of the transponder chip module TCM) to the bottom (as viewed) edge of the card body (CB). The coupling frame (CF) may comprise tungsten or other high density metal or metal alloy. An activation distance of 25 mm was achieved.

It may be noted that FIG. 4H bears some resemblance to FIG. 1 of U.S. 61/978,187, which shows a DIF smartcard body with a metal slug and booster antenna. The coupling frame (CF) disclosed herein, substantially surrounding the transponder chip module (TCM), may not require a booster antenna (BA).

Figure 4I:
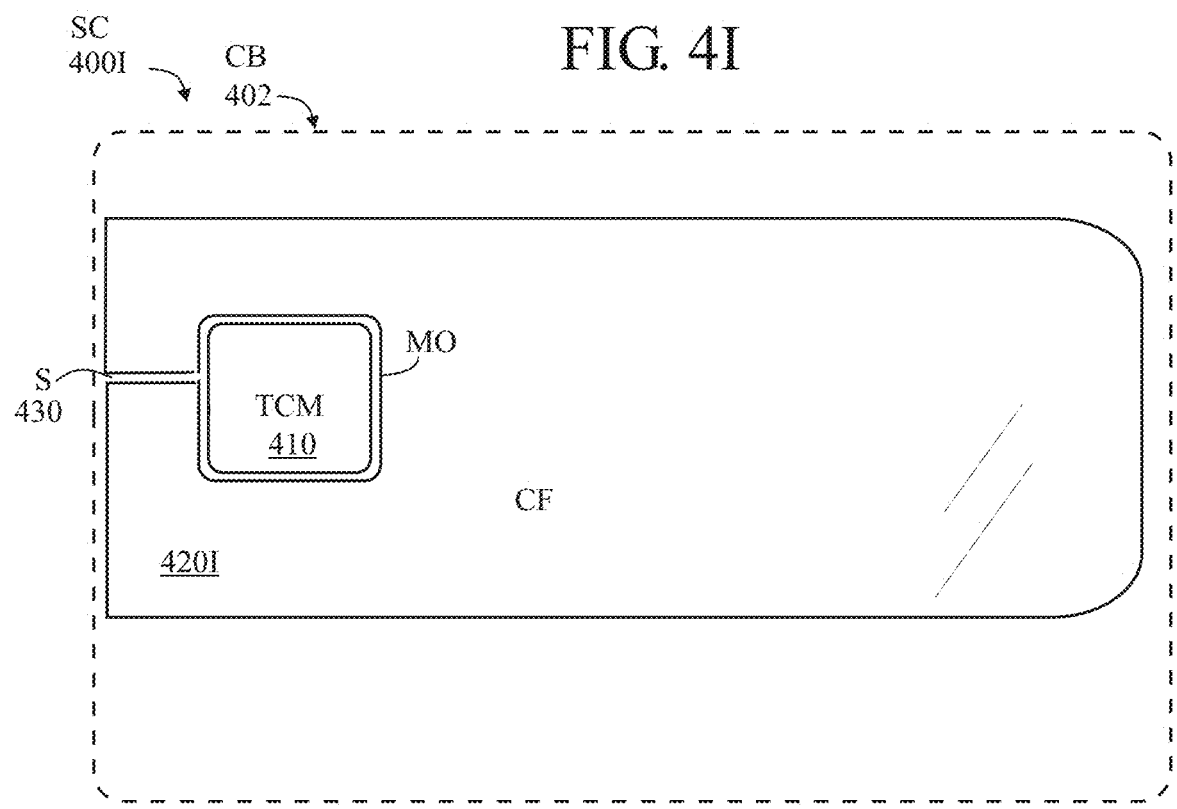
FIG. 4I is a diagram of a smartcard (SC) having a coupling frame (CF) extending from four sides of a module opening (MO) for a transponder chip module (TCM).

FIG. 4I shows an embodiment of smartcard 400I having a coupling frame (CF) 420I made of tungsten or other high density metal or metal alloy, and surrounding all four sides (nearly 360°) of a transponder chip module (TCM) 410. Here, a coupling frame (CF) surrounds the transponder chip module TCM), and has a slit (S) 430 on its left (as viewed) side. The coupling frame (CF) extends from the right (as viewed) edge of the transponder chip module TCM) nearly to the right (as viewed) edge of the card body (CB) 402, from the bottom (as viewed) edge of the transponder chip module TCM) towards the bottom (as viewed) edge of the card body (CB), and from the top (as viewed) edge of the transponder chip module TCM) towards the top (as viewed) edge of the card body (CB), and may cover approximately 60% of the area of the card body (CB). The coupling frame (CF) may comprise tungsten or other high density metal or metal alloy. The coupling frame (CF) has an opening (MO) for the transponder chip module (TCM). A gap between the coupling frame (CF) and the transponder chip module (TCM) should be maintained as small as possible. An activation distance of 35 mm was achieved.

Metal Cards Having Coupling Frame Functionality

Figure 5A:
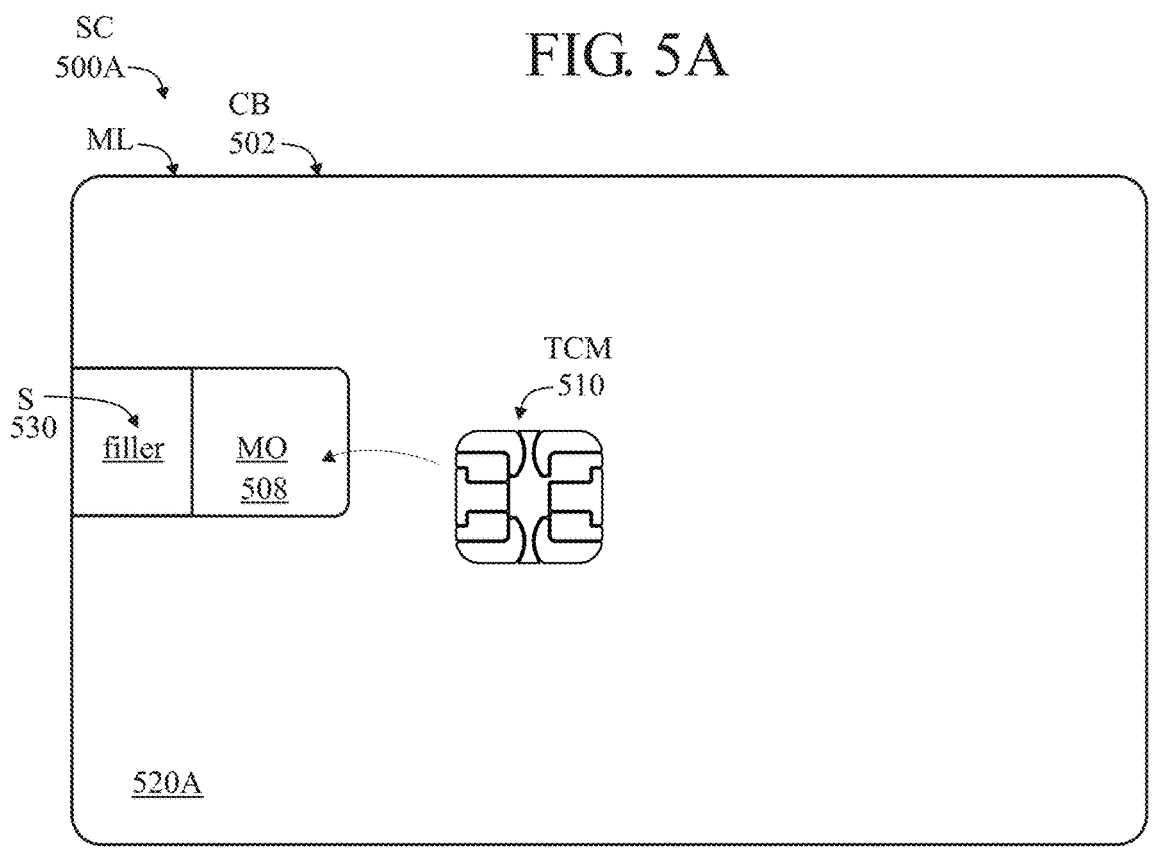
FIG. 5A is a diagram of a smartcard (SC) having a coupling frame (CF) extending from three sides of a module opening (MO) for a transponder chip module (TCM).

FIG. 5A shows a metal layer (ML) which may be a card body 502 of a metal-faced smartcard 500A (or card body 502 of a metal card) modified to function as an open-loop coupling frame (CF) 520A, showing a coupling frame (CF) surrounding three sides (or 270°) of the transponder chip module (TCM) 510. The left side of the transponder chip module (TCM) is not surrounded. Rather, a non-conductive filler ("filler") material may bridge the large slit (S, or slot, or band) between the ends of the coupling frame (CF) to the left (as viewed) of the transponder chip module (TCM). Here, a coupling frame (CF) surrounds three sides (top, bottom and right) of the transponder chip module (TCM)

disposed in a module opening (MO) 508. The coupling frame (CF) extends from the right (as viewed) edge of the transponder chip module (TCM) to the right (as viewed) edge of the card body (CB), from the bottom (as viewed) edge of the transponder chip module (TCM) to the bottom (as viewed) edge of the card body (CB), and from the top (as viewed) edge of the transponder chip module (TCM) to the top (as viewed) edge of the card body (CB). In this example, the "slit" (S) 530 is large, extending nearly the height (approximately 10 mm) of the transponder chip module (TCM), and may be referred to as a "slot" or "band". The coupling frame (CF) may comprise tungsten or other high density metal or metal alloy, and may constitute substantially the entire card body (CB). The filler material may have a thickness corresponding to the thickness of the coupling frame (CF), and may comprise a material that may illuminate when the smartcard (SC) is being interrogated by an external reader.

Figure 5B:
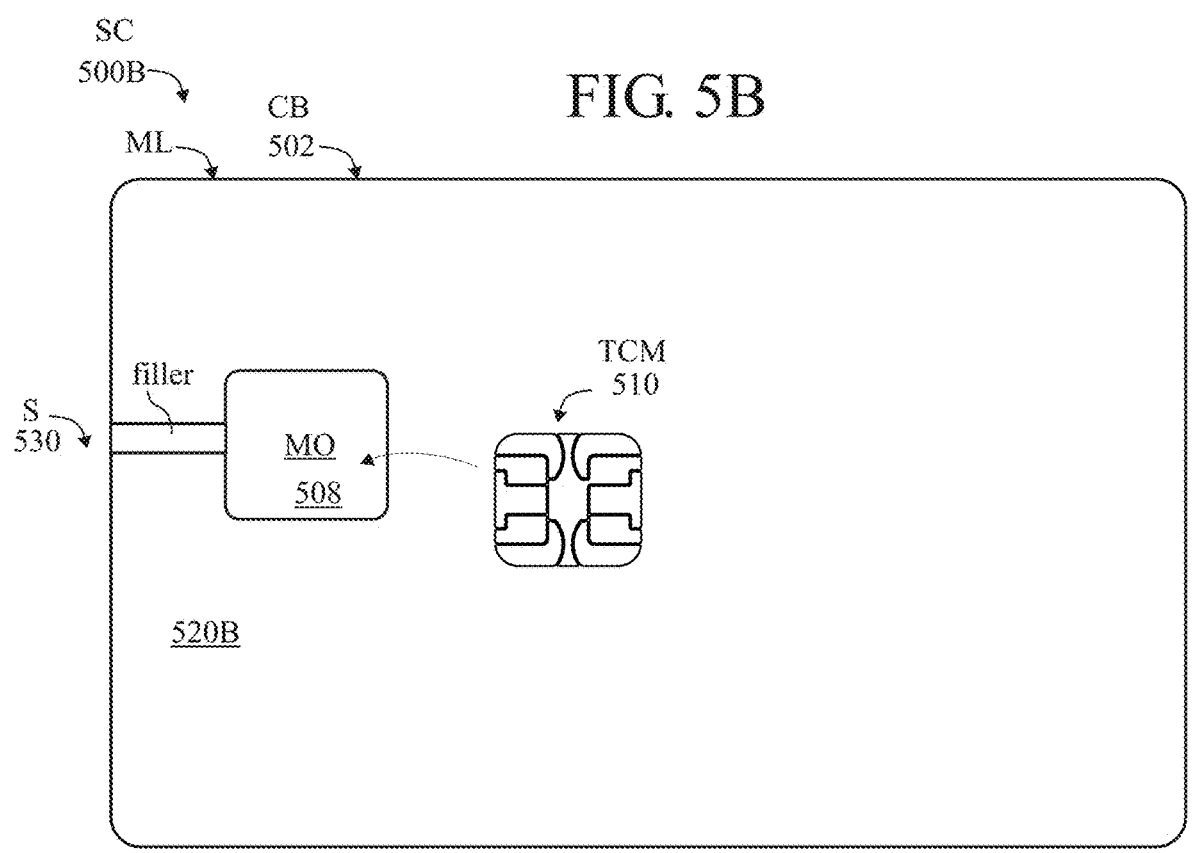
FIG. 5B is a diagram of a smartcard (SC) having a coupling frame (CF) extending from four sides of a module opening (MO) for a transponder chip module (TCM), showing a slit (S) extending from the module opening (MO) to a periphery of the coupling frame (CF).

FIG. 5B shows a metal layer (ML) which may be a card body 502 of a metal-faced smartcard 500B (or card body of a metal card) modified to function as an open-loop coupling frame (CF) 520B, showing a coupling frame (CF) surrounding four sides (or nearly 360°) of the transponder chip module (TCM) 510 disposed in a module opening (MO) 508. A slit (S) 530 is disposed through the coupling frame on the left (as viewed) side of the transponder chip module (TCM), and may be filled with a non-conductive filler material ("filler"). Here, a coupling frame (CF) surrounds all four sides (top, bottom, right and left) of the transponder chip module (TCM). The coupling frame (CF) extends from the right (as viewed) edge of the transponder chip module (TCM) to the right (as viewed) edge of the card body (CB), from the bottom (as viewed) edge of the transponder chip module (TCM) to the bottom (as viewed) edge of the card body (CB), and from the top (as viewed) edge of the transponder chip module (TCM) to the top (as viewed) edge of the card body (CB). The portion of the coupling frame (CF) on the left of the transponder chip module (TCM) has a slit, rather than a band (in either case, slit or band, the coupling frame is open loop). The coupling frame (CF) may comprise tungsten or other high density metal or metal alloy. and may constitute substantially the entire card body (CB). The filler material may have a thickness corresponding to the thickness of the coupling frame (CF), and may comprise a material that may illuminate when the smartcard (SC) is being interrogated by an external reader.

A metal card made of steel may exhibit an activation distance of approximately 40 mm with a barely visible slit width of approximately 50 µm. The slit (S) in the coupling frame (CF) can be laser etched, mechanical removed or chemically etched. The thickness of the metal layer (ML) can be from approximately 1 µm to approximately 35 µm, or greater, and may be laminated to a synthetic core (PVC, PC, Paper, PETG, Teslin) etc. A metal card, or plastic card with a metal slug or metal core, may have a metal (layer, body, core or slug) thickness of approximately 300-760 µm.

Summarizing the Above, and Some Additional Embodiments and Observations

Metal foils may be integrated into plastic cards and may be arranged to function as a coupling frame (CF). The metal foils may have a metal layer thickness greater than 1 micron which is a fraction of the skin depth thickness of the metal or conductive layer at 13.56 MHz (the frequency of interest is in the range 10-30 MHz). Metal foils with a skin depth thickness of 12 micron have been tested, which have performed in the same manner as a metal substrate with a thickness equal to 0.76 mm (card body thickness).

Metal foils such as holographic metal foils with a thickness of 30 nm may be integrated into plastic cards. These foils may not be appropriate for a coupling frame (CF), but they may add to the aesthetics of the card, without interfering with the electromagnetic field.

The coupling frames (CF) described herein may surround the transponder chip module on all four sides (less the slit S), on three sides or on two sides. It is important that the metal or conductive frame (CF) is an open loop, forming an open circuit around the transponder chip module (TCM). This is achieved by creating a slit which emanates from one or more sides of the module opening (MO) for the transponder chip module (TCM) and extends to the edge of the metal layer (ML) or conductive frame (CF).

The metal foil (or metal layer ML, or metal core, or metal card body) can be any metal or metal alloy such as copper, aluminium, brass, titanium, tungsten, stainless steel. The metal foil may also be substituted with an alternative electrically conducting material or film such as silk screen printed silver ink, vapour deposited metals, graphene, silver nanowires or conductive carbon ink. The metal foil may also be substituted by a perforated metal mesh or wireframe metal mesh.

The technique of capacitive coupling with a slotted metal layer (ML) or coupling frame (CF) may be most advantageous when deployed in conjunction with a transponder chip module (TCM) which has a planar, laser-etched antenna structure (LES). Chemically etched antenna structures on the face down side of a module tape may have a spacing between tracks of 100 µm which may not interact (function) as well with a coupling frame (CF) as a laser-etched antenna structure (LES). Consequently, such antenna modules (AM) with a chemical etched antenna may have a very low activation distance with a reader, such as 1 mm, thereby requiring a booster antenna (BA) in the card body (CB). When the spacing between tracks of the antenna structure (AS) is reduced to 50 µm or 25 µm (and less, such as 20 µm, when plated), the transponder chip module (TCM) can interact well with the coupling frame (CF), and in some applications may function adequately without a coupling frame (CF) (and, indeed, without a booster antenna (BA)). The activation distance for a transponder chip module (TCM) having a laser-etched antenna structure (LES; spacing between tracks of 25 µm) depending on the position over the reader can range from 15 to 20 mm. If you add the slotted coupling frame, the activation distance increases, with a range from 30 mm to 40 mm.

The antenna structure (AS) of a transponder chip module (TCM), which may be a laser-etched antenna structure (LES), may comprise a rectangular spiral track having approximately 10-12 turns, the width of each track being approximately 100 µm, the spacing between tracks being approximately 25 µm. Chemically-etched antenna structures may have larger feature sizes (e.g., spacing of 100 µm between tracks). The spaces between tracks of a laser-etched antenna structure (LES) may be less than 100 µm, less than 75 µm, less than 50 µm, and less than 25 µm. After plating, the spaces between adjacent tracks of a laser etched antenna module (LES) may be even smaller. To take advantage of the synergy between the coupling frame (CF) and the transponder chip module (TCM) having a planar, etched antenna structure (AS), the distance (gap) from the outer track (outer edge, outer feature) of the antenna structure (AS) and the inner edge (or module opening MO) of the coupling frame (CF) should be less than 300 µm, and more suitably 50 µm. The coupling frame (CF) may overlap an outer feature of the antenna structure (AS), as shown in FIG. 2C.

The slit or slot in the coupling frame (CF) may be very narrow for aesthetic reasons, for example, a mere 50 μm in width. (On average, the diameter of a human hair is 100 μm.)

The slotted (with a slit) coupling frame (CF) may be a single foil which covers the entire area of a card body (CB), partially covers an area of a card body (CB), or the coupling frame (CF) may comprise several metal or conductive layers which are overlapping. A metal foil layer (metal layer of 30 nm) which is transparent to the electromagnetic field may also be part of the card-body stack-up.

The slit in the coupling frame (CF) may be formed by laser ablation, and may extend from one edge of the module opening (MO) for the transponder chip module (TCM) to the outer perimeter of the coupling frame (CF) or metal layer (ML). This slit may completely penetrate (extend completely through) the metal layer (ML) of the coupling frame (CF), but may also/alternatively only extend partially through the metal layer (ML) of the coupling frame (CF). In the case of partial penetration of the slit (S), a thin layer of metal may remain and should be below (less than) the transparency threshold for electromagnetic waves, and less than the skin depth (at the required frequency 13.56 MHz) of the metal used to construct the coupling frame, such that electrical current flows across the slit (or void) are minimized and the performance of the coupling frame (CF) is not impeded. The void may be filled from one side with a polymer, epoxy resin or similar material to mechanically reinforce the metal frame and fill the void.

Using a transponder chip module (TCM) having a suitable antenna structure (AS), such as a laser-etched antenna structure (LES) having small spaces between tracks, in conjunction with the coupling frames (CF) disclosed herein, activation distances of at least 20 mm, including at least 25 mm, at least 30 mm, at least 35 mm, up to 40 mm or more may be achieved, without requiring a booster antenna (BA) in the card body (CB), and even in the case of metal cards (wherein the metal layer ML is provided with a slit so that it can function as a coupling frame CF).

Some Additional Embodiments

Figure 6A:
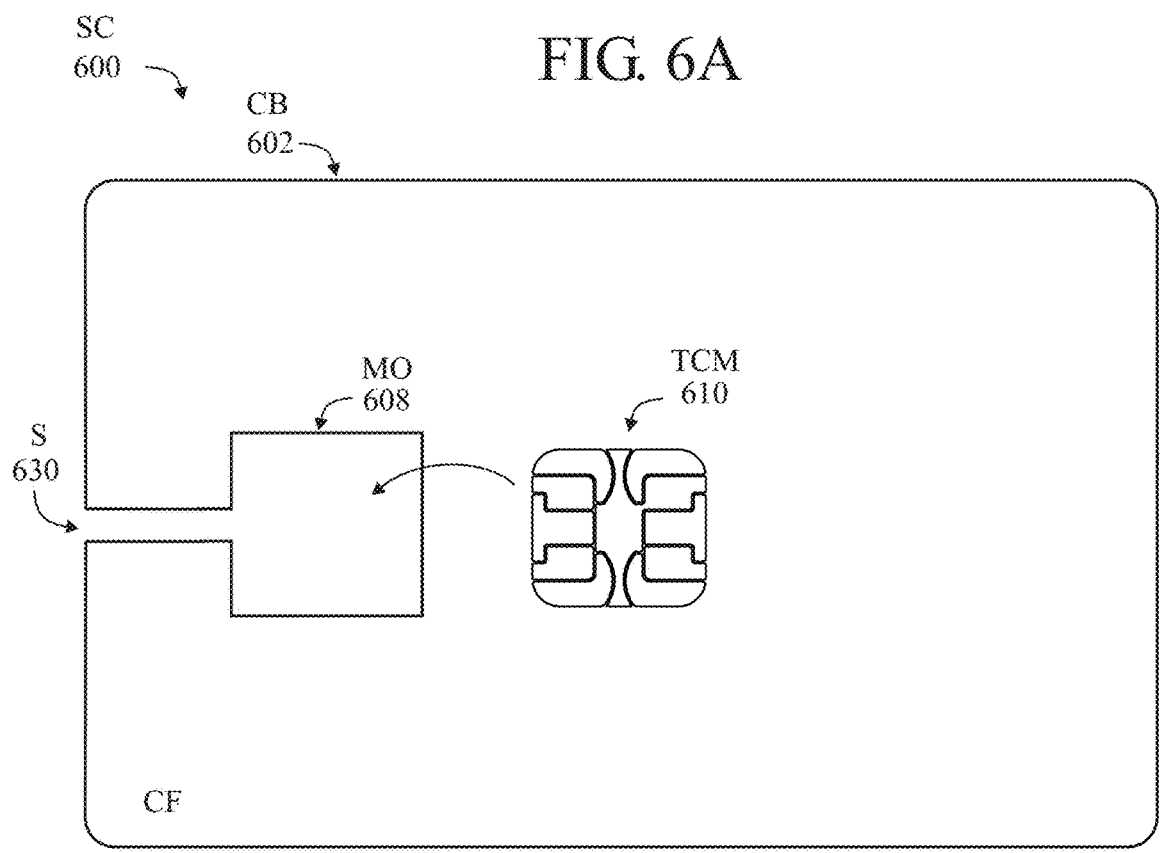
FIG. 6A is a diagrammatic view of a front surface of a metal card or composite metal card acting as a coupling frame (CF) with a slit, slot or gap in the metal to create an open loop closely adjacent to and substantially fully surrounding the transponder chip module (TCM).

FIG. 6A illustrates the front side of a smartcard 600 which may be a metal card (compare FIG. 5B) having a metal layer (ML), which may constitute substantially the entire thickness of the card body (CB) 602. The card body (CB) has a module opening (MO) 608 wherein a transponder chip module (TCM) 610 may be disposed, and a slit (S) 630 extending from the module opening (MO) to the perimeter of the metal layer (ML) so that the metal card body (MCB) may function as a coupling frame (CF), in the manner described hereinabove. The metal layer (ML) (or card body CB, or metal card body MCB) may comprise titanium.

Figure 6B:
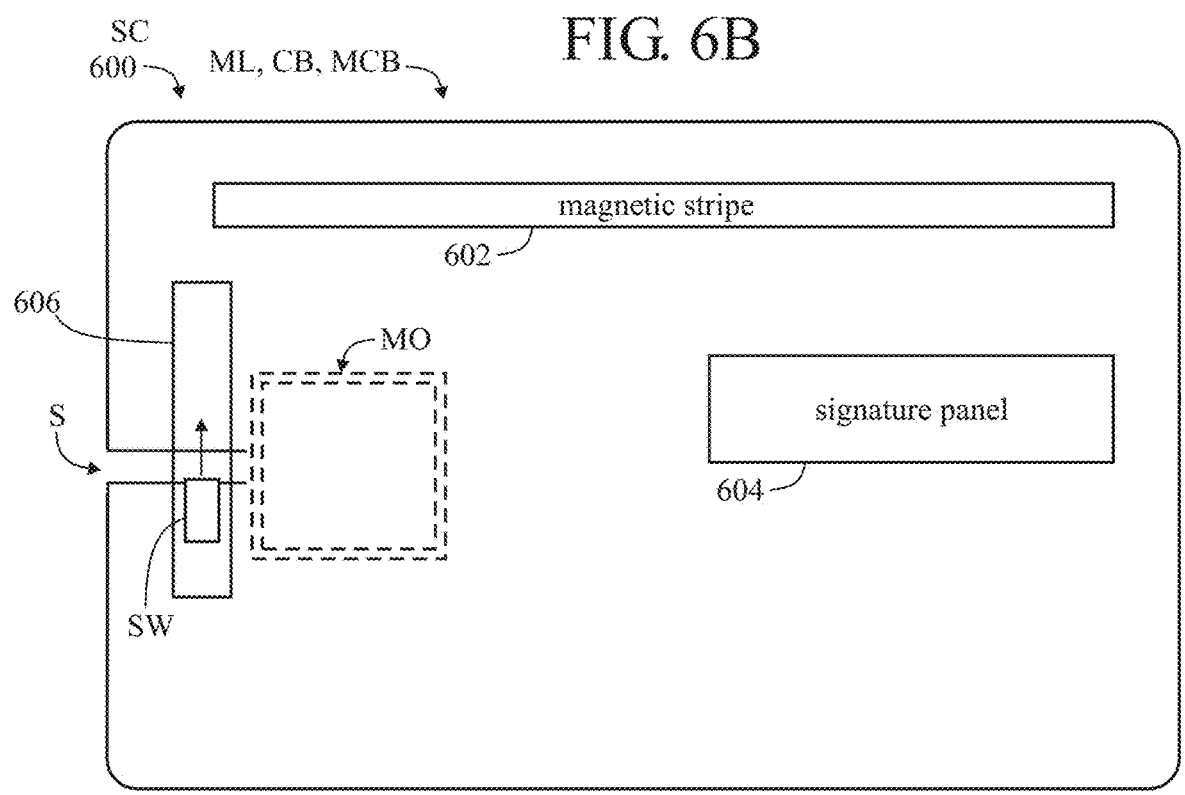
FIG. 6B is a diagrammatic view of a back surface of the metal card or composite metal card of FIG. 6A, showing incorporating a switch to short out the slit, slot or gap.

FIG. 6B illustrates the back (reverse) side of the smartcard 600 shown in FIG. 6A. A recessed area 602 may be provided on the reverse side of the card body (CB) to accommodate a magnetic stripe, and may measure approximately 9 mm×84 mm Another recessed area 604 may be provided on the reverse side of the card body (CB) to accommodate a signature panel, and may measure approximately 9 mm×56 mm. The module opening (MO) is shown in dashed lines, and may measure approximately 11 mm×13 mm (for an 8 contact module).

An additional recessed area 606 may be provided on the reverse side of the card body (CB) to accommodate a switch (SW), such as a slide switch, and may measure 5 mm×20 mm. The switch (SW) may be used to selectively connect/disconnect the ends of the open loop coupling frame (CF) to one another, so that when the ends are connected, the coupling frame (CF) is a closed loop and does not provide the advantages of an open loop coupling frame (CF) as described above. This allows a user to "switch off" the coupling frame feature and its attendant increase in activation distance, which provides more security (an anti-phishing feature) for the user's card.

The switch feature can be integrated into a solid metal card body construction or a plastic card/metal foil card body construction. The switch may comprise a slide switch, a press button switch or the like which can be used to short-circuit the coupling frame (CF) and dampen the function of the transponder chip module (TCM), thereby providing protection against phishing (unauthorized reading of the smartcard). The switch (SW) can also have the function of reinforcing the structure of the card body (CB) around the position of slot or slit, protecting it from damage resulting from bending.

Light Emitting Diode (LED)

Figure 7A:
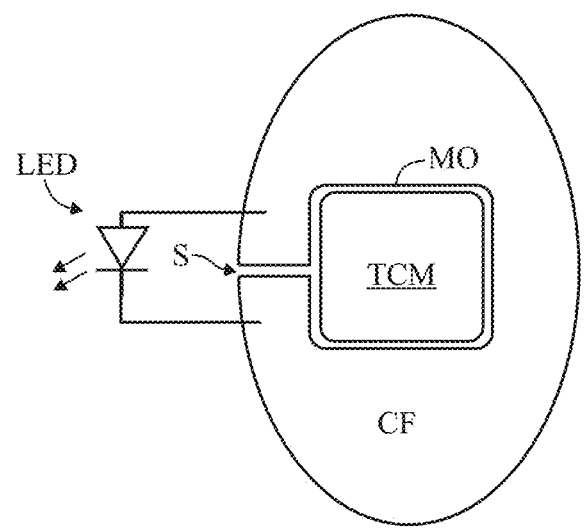
FIG. 7A is a diagram showing incorporating an LED into the smart card (SC), and connecting it to the ends of the coupling frame (CF)

FIG. 7A shows that an LED (light emitting diode), or other or semiconductor optical device, may be connected across the ends of the coupling frame (CF) in the manner disclosed in FIG. 2 of U.S. 61/971,636. See also FIGS. 5, 5A, 5B of U.S. Ser. No. 14/281,876. Here, the LED is shown connected across the opposing ends of an exemplary elliptical coupling frame (CF) similar to that shown in FIG. 4C (card body (CB) omitted, for illustrative clarity)—in other words, the LED is shown as being connected across the slit (S), and may illuminate when the smartcard (SC) is being interrogated by an external reader.

Modifying the Transponder Chip Module (TCM)

Figure 7B:
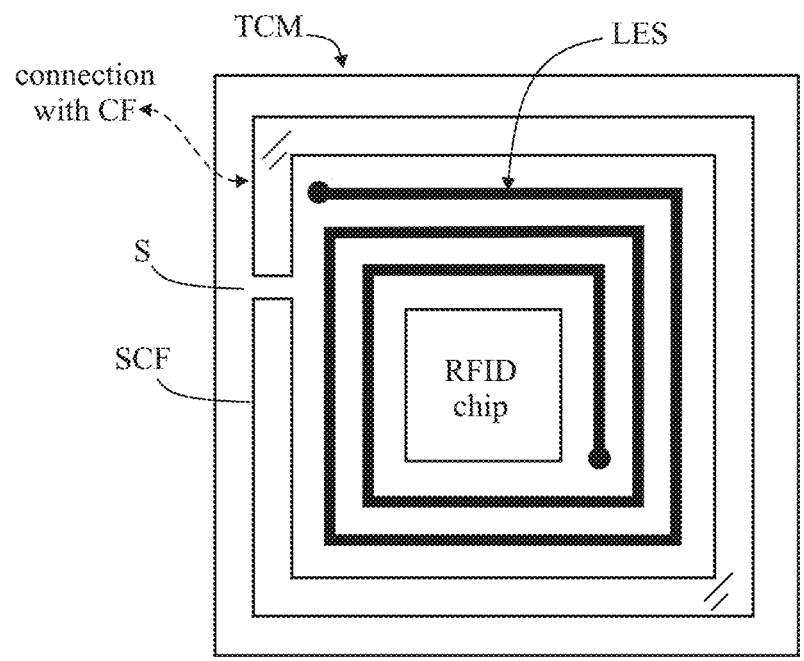
FIG. 7B is a diagram showing incorporating a secondary coupling frame (SCF) in the transponder chip module (TCM) to enhance coupling between the laser-etched antenna structure (LES) of the transponder chip module (TCM) with the coupling frame (CF) in the card body (CB).

The transponder chip module (TCM) may be implanted in a recess area milled in the card body (CB; metal, plastic or plastic/metal foil) and its laser-etched antenna structure (LES) may be positioned as close as possible to the coupling frame (CF), at a minimum with two sides, ideally with four sides surrounded by the coupling frame (CF), as discussed hereinabove. As shown in FIG. 7B, to further improve the proximity of the laser-etched antenna (LES) to the coupling frame (CF), a metal rim ("rim") surrounding the laser etched antenna (LES) on the transponder chip module (TCM) may be electrically connected to the coupling frame (CF) using conductive glue, solder, welding, etc. The separation distance from the rim to the antenna can be the width of the laser width, less than 25 μm. The metal rim may be considered to be a secondary coupling frame (SCF), and should be open loop having a slit (S) between its two ends.

The track width on the laser-etched antenna structure (LES) can be varied, from end-to-end, to improve performance, in contrast with an antenna structure having a single (constant) track width. By way of analogy, this could be viewed as more than one antenna, each having a different track width, connected in series with one another. As an example, a first portion of an antenna structure may have a track width of 100 μm, another portion may have a track width of 50 μm. Additional portions may have other track widths. The spacing between tracks may also be varied. For example, the spacing between some tracks may be 25 μm or less, the spacing between some other tracks may be more than 25 μm. The ability to vary track width and spacing may be helpful in fine-tuning the performance of the module, with attendant benefits in activation distance (for example).

Contact pads (CP), connection bridges (CBR) and/or isolated metal features formed on the face-up side (contact side) of a double-sided chip carrier tape residing directly over a laser-etched antenna structure (LES) on the face-down side, can be used to increase the amplitude of the resonance curve of the transponder chip module with minimal frequency shift when interrogated by a reader, and without the need to perforate or remove metal for enhanced activation distance. The enhanced performance of the transponder chip module (TCM) by maintaining a metal contact pad arrangement on the face-up side, similar to an arrangement on a standard contact smartcard module, may result in an activation distance with a laser-etched antenna structure (LES) of approximately 2 cm.

Some Additional Disclosure

In the general context of coupling frames any metallized surface or conductive layer which is non-transparent to electromagnetic waves can be used to capacitive couple a transponder chip module (TCM) with a contactless reader. The surface, layer or substrate can be metallized plastic or paper, a metal foil, a metal card, a metal slug in a plastic card body, a casing on a mobile telephone, an enclosure protecting a battery, or any type of metallized housing in or on an RFID enabled device.

To allow the electromagnetic flux lines to propagate through a coupling frame on or in a card body construction, a narrow slit or slot must be milled, eroded or etched through one edge of the metalized substrate to create an open loop. The slit or slot is formed through an edge on the card body nearest the transponder chip module (TCM) in a line (straight, curved or otherwise) and terminates upon penetrating the cavity, recess or window milled through the card body that is used to house or implant the transponder chip module (TCM).

In the case of a metal card body, the addition of the slit or slot connected to the larger opening for the module weakens the structure of the metal card body at that point along either edge of the slit or slot. If left unresolved this weakening or destabilizing of the card edge and module opening could present future quality and reliability issues with cards deployed in the field. For example, a card could bend at one side of the slit or slot and in extreme cases bend in opposite directions. One result of this bending action would be to prevent the card from being inserted into a contact card reader or point of sale (POS) terminal. Also bending at or along the slit or slot might extend along the entire length of the slit or slot until it reaches the installed transponder chip module (TCM) and compromise or weaken the adhesive bond that is used to mount the transponder chip module (TCM) into the metal card body or deform the surface of the transponder chip module (TCM) faceplate.

A number of methods are available to resolve this potential for destabilization or weakening of the card body at the slit or slot. One such method is the application of a epoxy resin system to fill the slit or slot as well as the opening or window created to house the transponder chip module (TCM). After the filling operation, the cured resin would be mechanically leveled and polished to create a uniform planar surface across either side of the metal card body. This resin system could be filled and colored to disguise the slit or slot and/or to match or complement the visual decorative elements of the finished card.

A second method is the application of a separate non-conductive reinforcing structure or plate that bridges or straddles the slit or slot and the opening or window on the backside or front side, or in combination on both sides, of the metal card body when mounted in a cavity milled to the appropriate size and to a depth equal to the thickness of the reinforcing structure plus the thickness of the adhesive layer required to permanently mount this structure. The bond side surface of the reinforcing structure may be mechanically or chemically abraded to promote adhesion to the card body. The milled cavity in the card body could also be abraded to promote adhesion to the non-conductive reinforcing structure or plate.

This non-conductive reinforcing structure, when adhesively mounted in the card body, would add the required structure and rigidity to connect the two sides of the slit or slot together yet still maintain the open loop circuit allowing the flux lines to propagate. The non-conductive reinforcing structure could be printed, engraved or etched with a decorative element such as a logo, trademark, service mark or hologram.

A third method also uses a non-conductive reinforcing structure as described above but in this embodiment the reinforcing structure would also incorporate a single pole micro-switch that would provide the card holder with the ability to disable the contactless function of the transponder chip module (TCM) as required. This feature could provide the cardholder with added security and peace of mind in environments where unauthorized card reading or "phishing" are likely.

In any of these methods for reinforcing the slit or slot and the opening or window milled to accept the transponder chip module (TCM) the reinforcing structure may also be covered by the application of signature panel tape over their location to further disguise them.

Additionally, the TCM may be implanted in the reinforcing structure. The reinforcing structure may be an insert in the metal card body. In this case the coupling frame may be composed of two parts, one part being the metal card body, the second part being the reinforcing structure or a component of the reinforcing structure.

The coupling frame (CF) may be partially or fully transparent, with a visible light transmittance greater than 40%. The electrically conductive material of the coupling frame may comprise indium tin oxide (ITO) or another optically transparent conductor such as a network of silver nanowires, graphene carbon nanotubes, cupro-nickel nanowires, conductive polymeric material or conductive composite. The thickness and/or electrical conductance of the metal or optically transparent conductor is such that the CF is significantly opaque (non-transparent) to the electromagnetic RF field, thus enabling the operation of the coupling frame (CF).

The operation of a CF relies on the presence of a discontinuity, herein described as a slit (S). The discontinuity in the CF may be replaced by an electrically insulating region in the metal, nanomaterial or other conductor. The discontinuity may be formed by a series of perforations. The discontinuity may also be formed by selective chemical (or other) modification of the metal, nanomaterial or other conductor. The chemical modification is such as to form an electrically insulating region on the CF (discontinuity). For example, the discontinuity may be formed by selective oxidation of the CF by deposition (for example by screen printing, inkjet) of a corrosive chemical (for example acid). See, for example US 20100078329.

Coupling Frame (CF) with Reinforcing Structure (RS)

Figure 8:
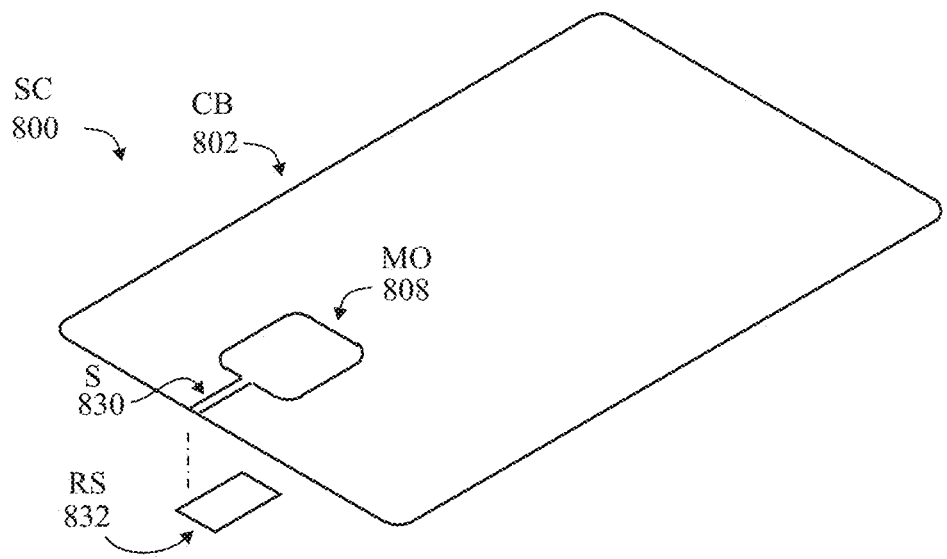
FIG. 8 is a diagram, in perspective exploded view, illustrating a full metal card body (CB) with an opening (MO) for a transponder chip module (TCM), and a slit (S) extending from the opening (MO) to a periphery of the card body (CB).

FIG. 8 (compare FIG. 6A) shows a metal smart card (SC) 800 (compare 600) comprising a full metal card body (CB) 802 (compare 602) with an opening (MO) 808 (compare 610) for a transponder chip module (TCM, not shown, compare 610) and a slit (S) 830 (compare 630) extending from the opening (MO) to a periphery of the card body (CB) to allow the flux lines to propagate around the area of the transponder chip module (TCM). The full metal card body (CB) may be formed of an electrically conductive material, such as titanium, may have a thickness of 760 µm, and may act a coupling frame (CF) for capacitive coupling with a contactless reader or point of sale terminal (see FIG. 1). The card body (CB) may comprise conductive nanoparticles.

To reinforce the card body (CB) (or metal layer (ML)) having a slit (S), a reinforcing structure (RS) or plate 832, of a non-conductive material such as plastic or reinforced plastic, may be disposed at (including around and covering) the location (area) of the slit (S) in a recess (R, not shown) on the underside of the card body (CB), and may extend beyond the slit. For example, the slit (S) may be 50 µm wide, the reinforcing structure may be up to or more than 8000 µm wide (approximately the size of a side of the TCM). The reinforcing structure (RS) may have a logo or design. The thickness of the reinforcing structure (and corresponding depth of the recess R on the underside of the card body CB) may be 350 µm.

The opening (MO) may extend completely through the card body (CB) and the transponder chip module (TCM) may extend through the opening (MO) to the underside of the card body (CB) to allow the propagation of the electromagnetic flux lines.

Metal/Plastic Hybrid Card

Figure 9:
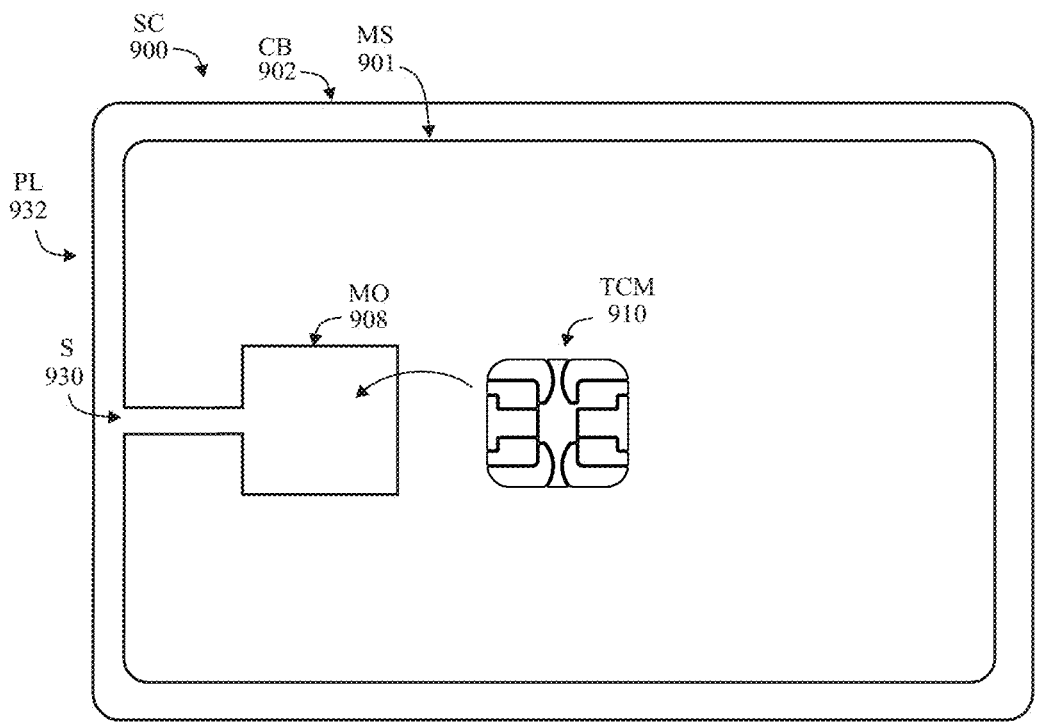
FIG. 9 is a diagram, in plan view, illustrating a metal/plastic hybrid card body (CB) with an opening (MO) for a transponder chip module (TCM), with a metal slug (MS) and one or more plastic layers surrounding the metal slug (MS).

FIG. 9 (compare FIG. 6A) shows a metal/plastic hybrid smart card (SC) 900 (compare 600) comprising a metal slug core (MS) 901 somewhat smaller than the overall card body (CB) 902 (compare 602) with an opening (MO) 908 (compare 610) for a transponder chip module (TCM) 910 (compare 610) and a slit (S) 930 (compare 630) extending from the opening (MO) to a periphery of the card body (CB) to allow the flux lines to propagate around the area of the transponder chip module (TCM). The metal slug of the card body (CB) may be formed of an electrically conductive material, such as titanium, may have a thickness of 200 µm, and may act a coupling frame (CF) for capacitive coupling with a contactless reader or point of sale terminal (see FIG. 1). The metal slug card body (CB) may be laminated to one or more layers (PL) 932 of plastic to create an ISO standard card body. The slit (S) may be filled with plastic. The opening (MO) for the transponder chip module (TCM) may be filled with plastic.

Non-Conductive Strip

In many embodiments described above, the coupling frame (CF) comprises a slit (S) extending from the module opening (MO) to a periphery of the coupling frame (CF), making it "open-loop". The slit (S) may compromise the mechanical integrity of the coupling frame (CF), making it less resistant to twisting. And, if a very small slit (S) is used, it is important to keep the ends of the coupling frame (CF) from touching one another. Incorporating a reinforcing structure (RS) has been described above.

As an alternative to forming (such as by cutting or etching) a slit (S) is to render a comparable area of the conductive layer of the coupling frame (CF) non-conductive. One example of converting a conductive material (such as aluminum or titanium) to be non-conductive is described in US 20100078329. In its simplest form, electrochemical anodic oxidation of selected portions of an initially conductive valve metal (for example, aluminum, titanium, or tantalum) substrate may be performed, resulting in areas (regions) of conductive (starting) material which are geometrically defined and isolated from one another by areas (regions) of anodized (non-conductive, such as aluminum oxide, or alumina) isolation structures.

Figure 10:
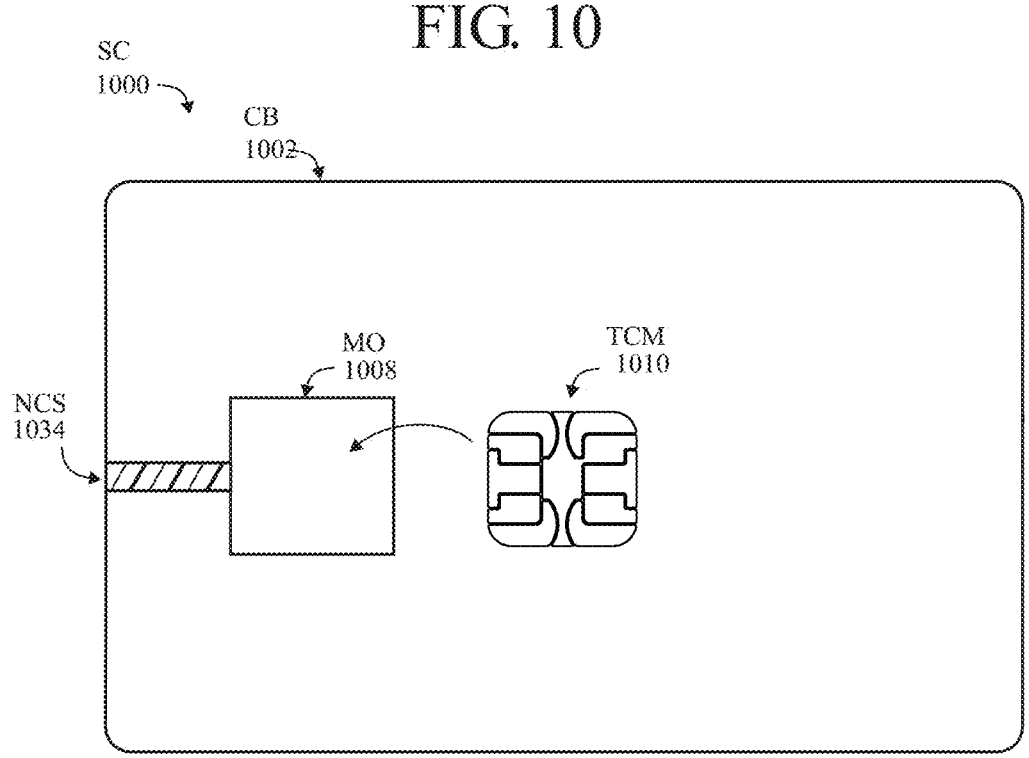
FIG. 10 is a diagram, in plan view, illustrating a metal card body CB) with an opening (MO) for a transponder chip module (TCM), and a non-conductive strip (NCS) extending from the opening (MO) to a periphery of the card body (CB).

FIG. 10 shows a smart card (SC) 1000 (compare 600) having a metal card body (CB) 1002 (compare 602) with an opening (MO) 1008 (compare 608) for a transponder chip module (TCM) 1010 (compare 610). Here, rather than (as an alternative to) having a slit (S, 630) extending from the opening (MO) to the periphery of the card body (CB), a comparable (or larger) area of the conductive starting material of the card body (CB) may be rendered non-conductive so that there is a non-conductive strip (NCS) 1034 extending from the opening (MO) to the periphery of the card body (CB). Any technique (chemical, laser, other) capable of rendering selected portions of the metal card body (CB) non-conductive may be used to create the non-conductive strip (NCS). The non-conductive strip (NCS) represents a discontinuity in the metal layer (ML) forming the coupling frame (CF) having two ends.

Capacitive Coupling-Enhanced (CCE) Transponder Chip Module (TCM)

According to some embodiments of the invention, at least one coupling frame (CF) may be formed or disposed on a common substrate, such as an epoxy-glass module tape (MT) with at least one of:
  an RFID chip (CM), and
  an antenna structure (AS) which may be a planar antenna (PA) structure,
    which may be laser-etched or chemically etched,
    which may be referred to as a module antenna (MA).

A transponder chip module (TCM), which may be incorporated into a smartcard (SC), may comprise an array of typically 6 or 8 contact pads (CPs) for interfacing with an external reader (e.g., ISO 7816). One or more connection bridges (CBRs) in the transponder chip module (TCM) may be used for making interconnections between components within the transponder chip module (TCM). The contact pads (CPs) and connection bridges (CBRs) may be formed from a common conductive layer on the front (face-up) surface of the transponder chip module (TCM). Other isolated features may be formed from the conductive layer, such as decorative strips or areas where logos may be presented. The transponder chip module (TCM) may have both contact (ISO 7816) and contactless (ISO 14443, 15693) interfaces. See, for example, US 20140104133, particularly FIGS. 1, 1A, 21 and 21A-E thereof.

Some of the concepts disclosed with respect to coupling frames (CF) on the module tape (MT) of a CCE-TCM may be applied to coupling frames (CF) incorporated into the card body (CB) of a smart card (SC), and vice-versa.

Figure 11:
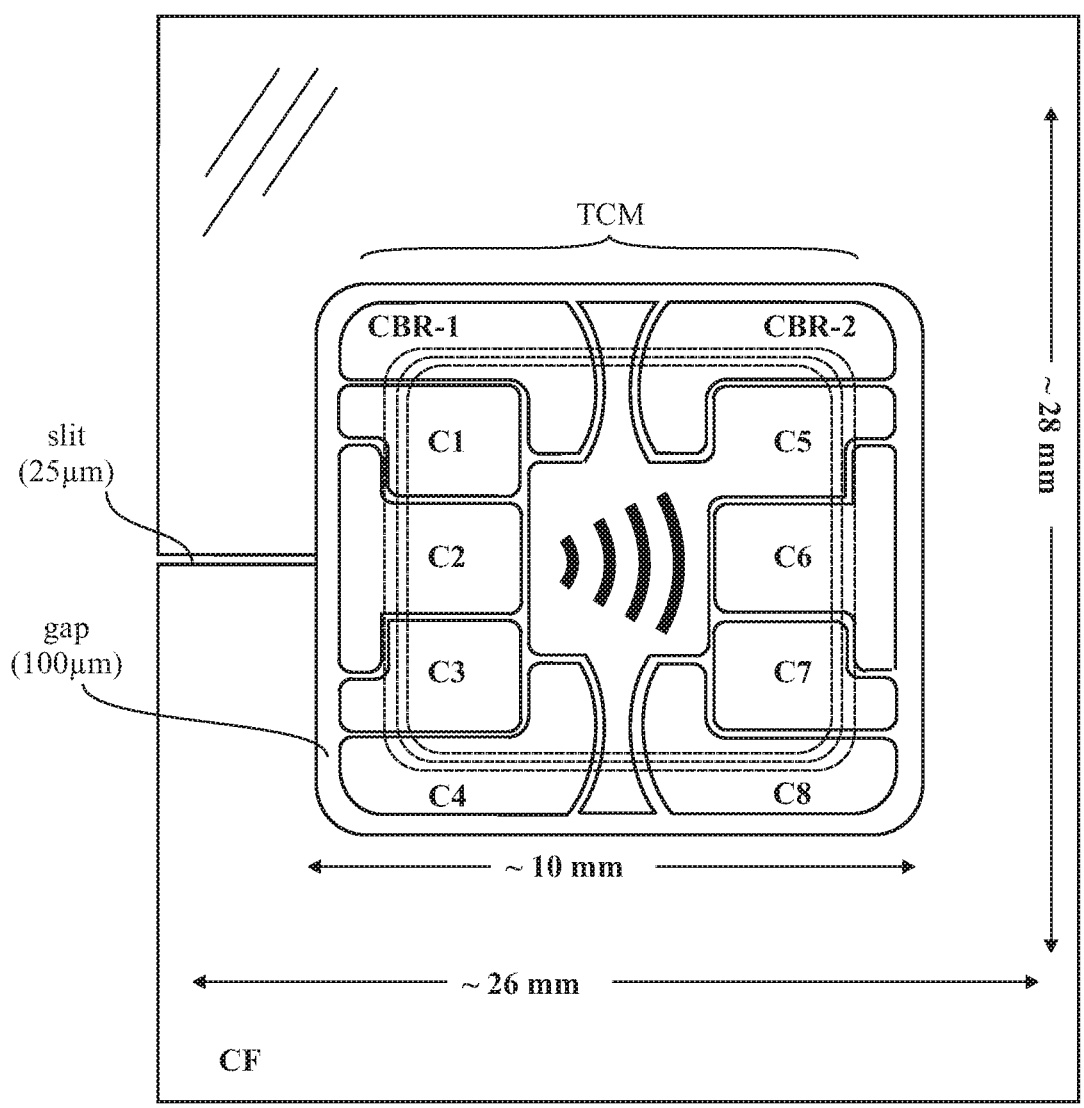
FIG. 11 is a plan view of a transponder chip module (TCM) which has a coupling frame (CF) incorporated on its module tape (MT) or chip carrier tape (CCT).

FIG. 11 shows an antenna module (AM) or transponder chip module (TCM) having an array of contact pads (CP1-CP8) and two connection bridges (CBR-1, CBR-2). The contact pads (CP) and connection bridges (CBR) may be disposed on one side (face-up side) of a module tape (MT) or chip carrier tape (CCT) of the Transponder Chip Module (TCM). The transponder chip module (TCM) corresponds generally to the transponder chip module (TCM) shown in FIG. 2A (v1).

A planar antenna (PA) structure may be provided on an opposite (face-down) side of the module tape (MT) or chip carrier tape (CCT) of the Transponder Chip Module (TCM), and is shown only generally in dashed lines. This corresponds generally to the transponder chip module (TCM) shown in FIG. 2A (v2). The planar antenna (PA) structure may be laser-etched. Alternatively, the planar antenna (PA) structure may be chemically etched. Only a few turns (or tracks) of the planar antenna (PA) structure are shown, for illustrative clarity. There may be 10-12 turns. The outer turn of the planar antenna (PA) structure may extend nearly to the periphery of the contact pad array (although it is disposed on the opposite side of the module tape (MT) or chip carrier tape (CCT) from the contact pad array).

A coupling frame (CF) may be disposed on module tape (MT) or chip carrier tape (CCT), and is shown surrounding the contact pads (CP) and connection bridges (CBR). In this example, the coupling frame (CF) is disposed on the same side of the module tape (MT) or chip carrier tape (CCT) as the contact pads (CP) and connection bridges (CBR), and may be formed from the same metal layer (e.g., 18 μm or 35 μm thick copper) that forms the contact pads (CP) and connection bridges (CBR). The contact pads (CP) and connection bridges (CBR) may be referred to as "contact pad array" (CPA).

The outer periphery of the contact pad array (CPA) is shown as being rectangular. An inner edge of the coupling frame (CF) is shown as being rectangular. A gap separates the inner edge of the coupling frame (CF) from the outer periphery of the contact pad array (CPA). The gap may be approximately 100 μm, or less. An outer edge of the coupling frame (CF) may also be rectangular. Some exemplary dimensions (approximate) may be:
- contact pad array (CPA), including connection bridges (CBR), 13 mm×13 mm
- area of contact pad array (CPA), 169 mm$^2$
- area of the planar antenna (PA) structure, somewhat less than that of the CPA
- inner edge of coupling frame, 13.1 mm×13.1 mm
  - opening in the coupling frame (CF) for the contact pad array (CPA), 172 mm$^2$
- outer edge of coupling frame, 26 mm×28 mm (728 mm$^2$)
  - area of coupling frame (CF), 728 mm$^2$-172 mm$^2$=556 mm$^2$ In this example, the coupling frame (CF) has an area which is approximately 3 times larger than the area of the planar antenna (PA) structure.

A slit (or slot, or gap) extends from the inner edge of the coupling frame (CF) to the outer edge thereof, so that the coupling frame (CF) is an open-loop element. In this configuration of a coupling frame (CF) on the module tape (MT), the concept of rendering a portion (or stripe) of the metal layer (ML) forming the coupling frame (CF) non-conductive (non-conductive stripe NCS), rather than making a slit (S) through the metal layer (ML), may be particularly advantageous. Typically, the metal layer (ML) on the module tape (MT) will be copper, which may subsequently be plated.

Notes
- all dimensions approximate (exemplary)
- coupling frame (CF) may be on either side of chip carrier tape (CCT)
- the coupling frame (CF) may be much larger than shown
- a second coupling frame (CF-2) may be disposed on the tape, and connected with the illustrated coupling frame (CF-1)
- a second coupling frame (CF-2) may be disposed on the opposite side of the tape from the illustrated coupling frame (CF-1)

Figure 11A:
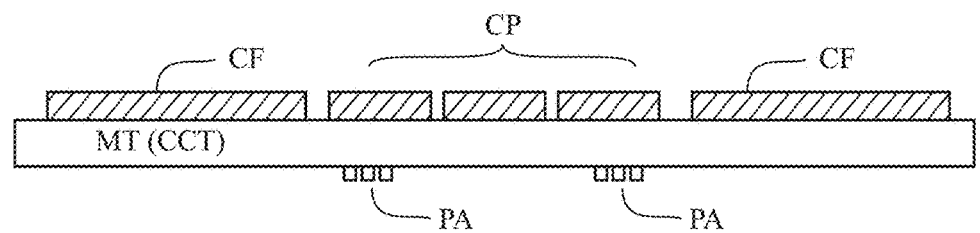
FIGS. 11A-11G are diagrams of some variations of incorporating one or more coupling frames (CF) in the transponder chip module (TCM).

FIG. 11A shows that the coupling frame (CF) may be disposed on the same side of the module tape (MT) or chip carrier tape (CCT) as the contact pads (CP), and indicates (by the cross-hatching) that it may be formed from the same conductive layer (CL) as the contact pads CP (and connection bridges CBR).

Figure 11B:
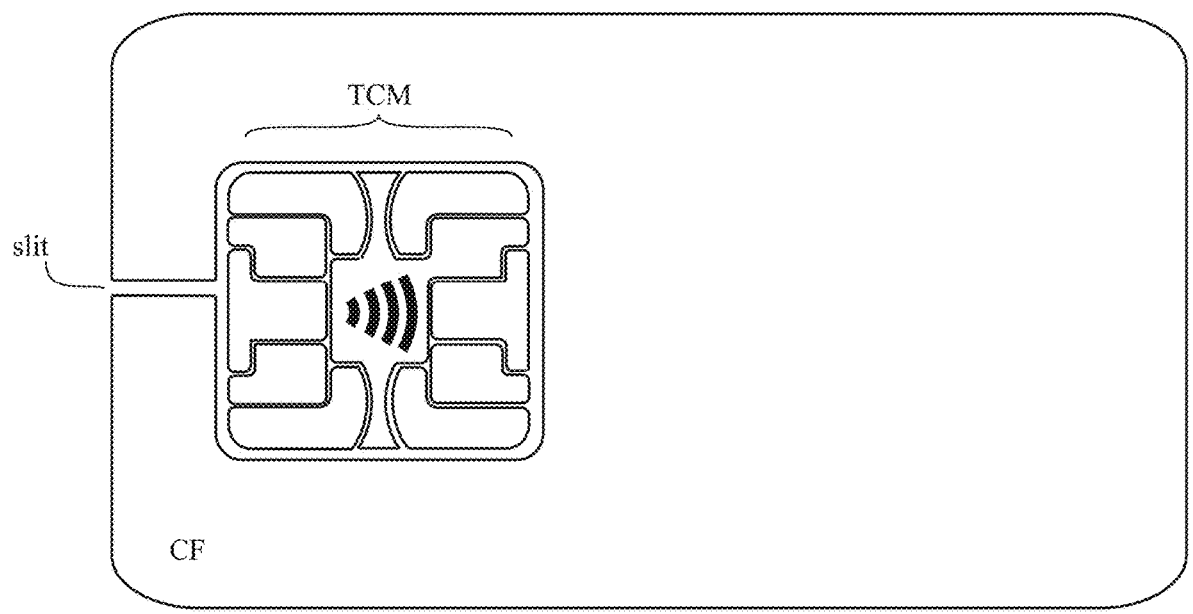

FIG. 11B shows that the coupling frame (CF) may be much wider than the transponder chip module (TCM), such as nearly the entire width of the card body (CB) of a smart card (SC), such as approximately 80 mm wide.

Figure 11C:
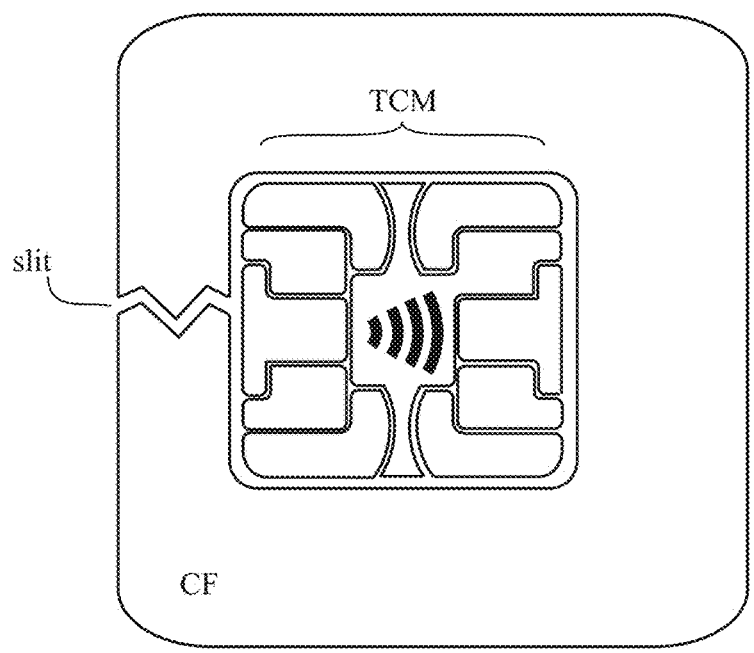

FIG. 11C shows that the slit n the coupling frame (CF) may be other than straight, such as a zigzag slit or a slit which is becomes wider or narrow along its length.

Figure 11D:
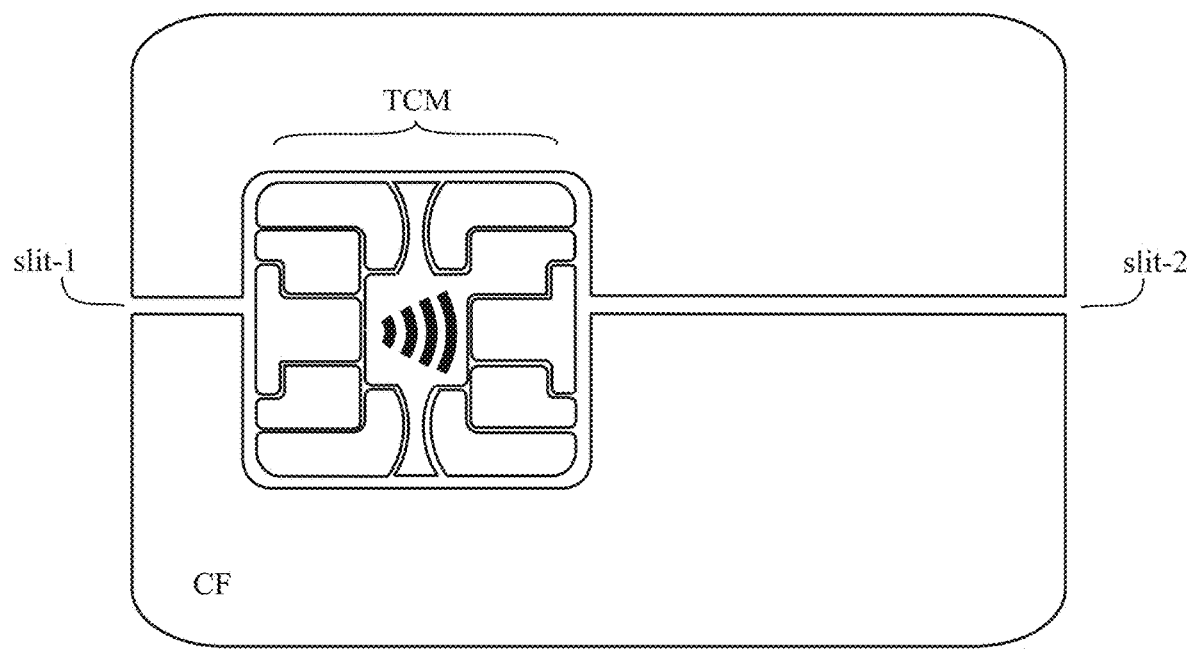

FIG. 11D shows that a coupling frame (CF) may have two slits (slit-1, slit-2), each extending from its inner edge to its outer edge, and disposed (for example) on opposite sides of the transponder chip module (TCM). (This may be considered to be two C-shaped coupling frames, with their ends facing each other.)

Figure 11E:
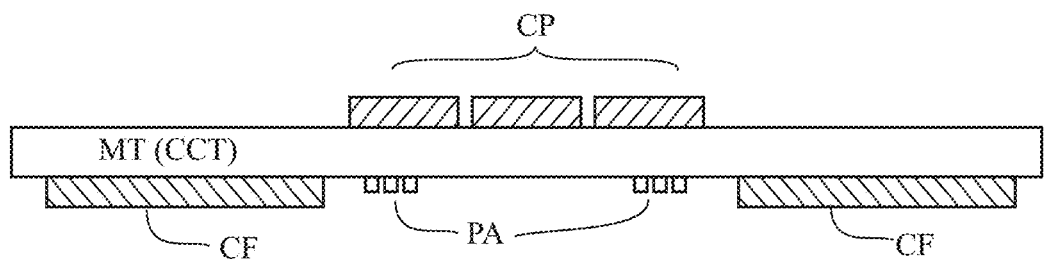

FIG. 11E shows that the coupling frame (CF) may be disposed on a side of the module tape (MT) or chip carrier tape (CCT) opposite to that of the contact pads (CP) and connection bridges (CBR)—in other words, on the same (face-down) side as the planar antenna (PA) structure. In this case, the coupling frame (CF) may be substantially coplanar with the planar antenna (PA) structure.

Figure 11F:
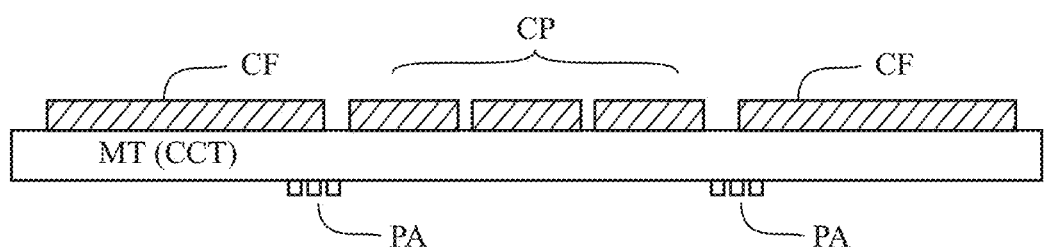

FIG. 11F shows that when the coupling frame (CF) is disposed on the same side of the module tape (MT) or chip carrier tape (CCT) as that of the contact pads (CP) and connection bridges (CBR), the planar antenna (PA) structure may be made larger, extending for example beyond the periphery of the contact pad array (CPA), and the coupling frame (CF) may overlap at least an outer portion of the planar antenna (PA) structure.

Figure 11G:
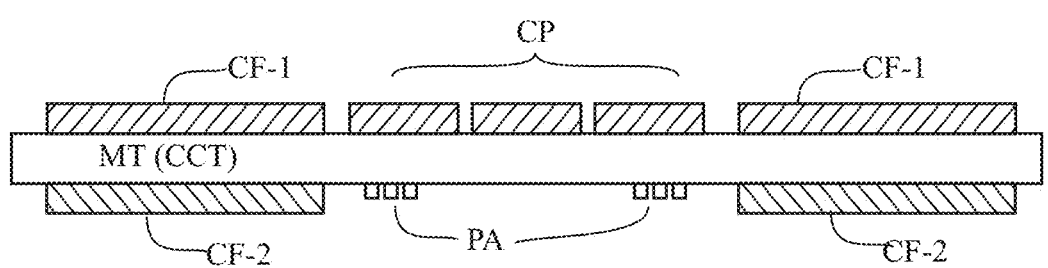

FIG. 11G shows that one coupling frame (CF-1) may be disposed on one side of the module tape (MT) or chip carrier tape (CCT), and another coupling frame (CF-2) may be disposed on another side of the module tape (MT) or chip carrier tape (CCT).

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), based on the disclosure(s) set forth herein.

What is claimed is:

1. Smartcard having at least a contactless interface, comprising:
   - two coupling frames (CF-1, CF-2) separated by a dielectric layer wherein each coupling frame comprises:
   - a metal layer having an opening (MO-1, MO-2) for receiving a transponder chip module (TCM) having a module antenna (MA, LES); and
   - a discontinuity comprising a slit (S) or a non-conductive stripe (NCS), extending from the opening to a periphery of the metal layer.

2. The smartcard of claim 1, wherein:
   the metal layers comprises a material selected from the group consisting of copper, aluminum, brass, titanium, tungsten, stainless steel, silver, graphene, silver nanowires, and conductive carbon ink.

3. The smartcard of claim 1, wherein:
   the slit of one of the two coupling frames is arranged in a different direction than the slit of another of the two coupling frames.

4. The smartcard of claim 1, wherein:
   the slits of the two coupling frames in different directions from their respective module openings, so that the slit of one coupling frame may be supported by an area without a slit of the other coupling frame.

5. The smartcard of claim 1, wherein:
when the transponder chip module is disposed in the opening, a portion of at least one of the two coupling frames overlaps at least a portion of the module antenna.

6. The smartcard of claim 1, further comprising:
a transponder chip module (TCM) disposed in the opening;
wherein the slit (S) or non-conductive stripe (NCS) of at least one of the two coupling frames overlaps at least a portion of the module antenna.

7. The smartcard of claim 1, wherein, for a given one of the two coupling frames:
the discontinuity is a slit; and
the slit extends completely through the metal layer, and is at least partially filled with an electrically non-conducting material selected from the group consisting of polymer and epoxy resin, and reinforced epoxy resin.

8. The smartcard of claim 1, wherein:
the smartcard is dual interface, having both contact and contactless interfaces.

9. The smartcard of claim 1, further comprising:
a transponder chip module (TCM);
wherein:
a first of the coupling frames (CF-1) surrounds the top, left and bottom edges of the transponder chip module (TCM), and extends to the top, left and bottom edges of the card body (CB), and has a module opening (MO-1) for the transponder chip module (TCM); and
a second of the coupling frames (CF-2) surrounds the top, right and bottom edges transponder chip module (TCM), and extends to the top, right and bottom edges of the card, and has a module opening (MO-2).

10. The smartcard of claim 9, wherein:
in aggregate, the two coupling frames cover nearly the entire surface of the card body.

11. The smartcard of claim 1, wherein:
one of the coupling frames (CF-1) is a front coupling frame; and
the other coupling frame (CF-2) is a rear coupling frame.

12. The smartcard of claim 11, further comprising:
a front face card layer; and
a rear face card layer.

13. Contactless smartcard comprising two metal layers separated by a dielectric layer wherein:
each metal layer has an opening for receiving a transponder chip module and a discontinuity comprising a slit (S) or a non-conductive stripe (NCS), extending from the opening to a periphery of the metal layer.

14. The contactless smartcard of claim 13, wherein the slits are oriented in different directions than one another.

15. The contactless smartcard of claim 13, further comprising:
a transponder chip module disposed in the openings.

16. The contactless smartcard of claim 15, wherein the transponder chip module comprises a dual interface chip.

* * * * *